(12) United States Patent
Kurokawa

(10) Patent No.: US 8,743,590 B2
(45) Date of Patent: Jun. 3, 2014

(54) MEMORY DEVICE AND SEMICONDUCTOR DEVICE USING THE SAME

(75) Inventor: Yoshiyuki Kurokawa, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 233 days.

(21) Appl. No.: 13/440,093

(22) Filed: Apr. 5, 2012

(65) Prior Publication Data

US 2012/0257439 A1 Oct. 11, 2012

(30) Foreign Application Priority Data

Apr. 8, 2011 (JP) ................................. 2011-085965
May 14, 2011 (JP) ................................. 2011-108884

(51) Int. Cl.
*G11C 11/24* (2006.01)
(52) U.S. Cl.
USPC ........................................ 365/149; 365/203
(58) Field of Classification Search
USPC ................... 365/149, 203, 189.05
See application file for complete search history.

(56) References Cited

U.S. PATENT DOCUMENTS

| | | | |
|---|---|---|---|
| 4,466,081 A | 8/1984 | Masuoka | |
| 5,731,856 A | 3/1998 | Kim et al. | |
| 5,744,864 A | 4/1998 | Cillessen et al. | |
| 6,127,702 A | 10/2000 | Yamazaki et al. | |
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 6,845,033 B2 * | 1/2005 | Kirihata et al. | ............... 365/149 |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |

(Continued)

FOREIGN PATENT DOCUMENTS

| | | |
|---|---|---|
| EP | 1 737 044 A1 | 12/2006 |
| EP | 2 226 847 A2 | 9/2010 |

(Continued)

OTHER PUBLICATIONS

Toshio Kamiya et al.; "Carrier Transport Properties and Electronic Structures of Amorphous Oxide Semiconductors: The present status"; Solid State Physics; Sep. 1, 2009; pp. 621-633; vol. 44, No. 9; Agne Gijutsu Center w/English language translation.

(Continued)

*Primary Examiner* — Son Dinh
(74) *Attorney, Agent, or Firm* — Fish & Richardson P.C.

(57) ABSTRACT

A memory device whose speed at the time of operation such as writing or reading is high and whose number of semiconductor elements per memory cell is small is provided. The memory device includes a control unit, an arithmetic unit, and a buffer memory device. The buffer memory device stores data sent from a main memory device and/or the arithmetic unit, in accordance with an instruction from the control unit. The buffer memory device includes a plurality of memory cells. The memory cells each include a transistor including a channel formation region including an oxide semiconductor, and a memory element to which charge with an amount in accordance with a value of the data is supplied through the transistor. Further, a data retention time of the memory cell corresponding to a valid bit is shorter than a data retention time of the memory cell corresponding to a data field.

26 Claims, 37 Drawing Sheets

(56) References Cited

U.S. PATENT DOCUMENTS

| | | |
|---|---|---|
| 7,105,868 B2 | 9/2006 | Nause et al. |
| 7,211,825 B2 | 5/2007 | Shih et al |
| 7,257,043 B2 * | 8/2007 | Tran et al. ............... 365/222 |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 7,848,131 B2 * | 12/2010 | Kim ............... 365/145 |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0148171 A1 | 6/2010 | Hayashi et al. |
| 2012/0163071 A1 | 6/2012 | Kurokawa |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 07-121444 A | 5/1995 |
| JP | 08-264794 A | 10/1996 |
| JP | 11-505377 A | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| WO | 2004/114391 A1 | 12/2004 |

OTHER PUBLICATIONS

Sanghun Jeon et al.; "180nm Gate Length Amorphous InGaZnO Thin Film Transistor for High Density Image Sensor Applications"; IEDM 10: Technical Digest of International Electron Devices Meeting; Dec. 6, 2010; pp. 504-507.

Tomoyuki Ishii et al.; "A Poly-Silicon TFT With a Sub-5-nm Thick Channel for Low-Power Gain Cell Memory in Mobile Applications"; IEEE Transactions on Electron Devices; Nov. 1, 2004; pp. 1805-1810; vol. 51, No. 11.

Wonchan Kim et al.; "An Experimental High-Density DRAM Cell with a Built-in Gain Stage"; IEEE Journal of Solid-State Circuits; Aug. 1, 1994; pp. 978-981; vol. 29, No. 8.

Shoji Shukuri et al.; "A Complementary Gain Cell Technology for Sub-1V Supply DRAMs"; IEDM 92: Technical Digest of International Electron Devices Meeting; Dec. 13, 1992; pp. 1006-1008.

Shoji Shukuri et al.; "A Semi-Static Complementary Gain Cell Technology for Sub-1 V Supply DRAM's"; IEEE Transactions on Electron Devices; Jun. 1, 1994; pp. 926-931; vol. 41, No. 6.

Asakuma, N et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: Al and Sn-Doped Zinc Indium Oxide Thin Film Transistors for Amoled Back-Plane," SID Digest '09 : SID International Symposium Digest of Technical Papers, May 31, 2009, pp. 280-283.

(56) References Cited

OTHER PUBLICATIONS

Clark, S et al., "First Principles Methods Using Castep," Zeitschrift fur Kristallographie, 2005, vol. 220, pp. 567-570.
Coates. D et al., "Optical Studies of the Amorphous Liquid-Cholesteric Liquid Crystal Transition: The Blue Phase," Physics Letters, Sep. 10, 1973, vol. 45A, No. 2, pp. 115-116.
Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.
Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.
Fortunato, E et al., "Wide-Bandgap High-Mobility ZnO Thin-Film Transistors Produced at Room Temperature," Appl. Phys. Lett. (Applied Physics Letters), Sep. 27, 2004, vol. 85, No. 13, pp. 2541-2543.
Fung, T et al., "2-D Numerical Simulation of High Performance Amorphous In-Ga-Zn-O TFTs for Flat Panel Displays," AM-FPD '08 Digest of Technical Papers, Jul. 2, 2008, pp. 251-252, The Japan Society of Applied Physics.
Godo, H et al., "P-9: Numerical Analysis on Temperature Dependence of Characteristics of Amorphous In—Ga—Zn—Oxide TFT," SID Digest '09 : SID International Symposium Digest of Technical Papers, May 31, 2009, pp. 1110-1112.
Godo, H et al., "Temperature Dependence of Characteristics and Electronic Structure for Amorphous In—Ga—Zn—Oxide TFT," AM-FPD '09 Digest of Technical Papers, Jul. 1, 2009, pp. 41-44.
Hayashi, R et al., "42.1: Invited Paper: Improved Amorphous In—Ga—Zn—O TFTS," SID Digest '08 : SID International Symposium Digest of Technical Papers, May 20, 2008, vol. 39, pp. 621-624.
Hirao, T et al., "Novel Top-Gate Zinc Oxide Thin-Film Transistors (ZnO TFTs) for AMLCDS," Journal of the SID, 2007, vol. 15, No. 1, pp. 17-22.
Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.
Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.
Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.
Ikeda., T et al., "Full-Functional System Liquid Crystal Display Using CG-Silicon Technology," SID Digest '04 : SID International Symposium Digest of Technical Papers, 2004, vol. 35, pp. 860-863.
Janotti, A et al., "Native Point Defects in ZnO," Phys. Rev. B (Physical Review. B), 2007, vol. 76, No. 16, pp. 165202-1-165202-22.
Janotti, A et al., "Oxygen Vacancies in ZnO," Appl. Phys. Lett. (Applied Physics Letters), 2005, vol. 87, pp. 122102-1-122102-3.
Jeong, J et al., "3.1: Distinguished Paper: 12.1-Inch WXGA AMOLED Display Driven by Indium-Gallium-Zinc Oxide TFTs Array," SID Digest '08 : SID International Symposium Digest of Technical Papers, May 20, 2008, vol. 39, No. 1, pp. 1-4.
Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.
Kanno, H et al., "White Stacked Electrophosphoreecnt Organic Light-Emitting Devices Employing MOO3 as a Charge-Generation Layer," Adv. Mater. (Advanced Materials), 2006, vol. 18, No. 3, pp. 339-342.
Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.
Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.
Kikuchi, H et al., "Polymer-Stabilized Liquid Crystal Blue Phases," Nature Materials, Sep. 1, 2002, vol. 1, pp. 64-68.
Kim, S et al., "High-Performance oxide thin film transistors passivated by various gas plasmas," The Electrochemical Society, 214th ECS Meeting, 2008, No. 2317, 1 page.
Kimizuka, N. et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures Over 1000° C.," Journal of Solid State Chemistry, 1985, vol. 60, pp. 382-384.
Kimizuka, N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the 2O3—ZnGa2O4—ZnO System," Journal of Solid State Chemistry, Apr. 1, 1995, vol. 116, No. 1, pp. 170-178.
Kitzerow, H et al., "Observation of Blue Phases in Chiral Networks," Liquid Crystals, 1993, vol. 14, No. 3, pp. 911-916.
Kurokawa, Y et al., "UHF RFCPUS on Flexible and Glass Substrates for Secure RFID Systems," Journal of Solid-State Circuits, 2008, vol. 43, No. 1, pp. 292-299.
Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.
Lee, H et al., "Current Status of, Challenges to, and Perspective View of AM-OLED," IDW '06 : Proceedings of the 13th International Display Workshops, Dec. 7, 2006, pp. 663-666.
Lee, J et al., "World's Largest (15-Inch) XGA AMLCD Panel Using IGZO Oxide TFT," SID Digest '08 : SID International Symposium Digest of Technical Papers, May 20, 2008, vol. 39, pp. 625-628.
Lee, M et al., "15.4: Excellent Performance of Indium-Oxide-Based Thin-Film Transistors by DC Sputtering," SID Digest '09 : SID International Symposium Digest of Technical Papers, May 31, 2009, pp. 191-193.
Li, C et al., "Modulated Structures of Homologous Compounds InMo3(ZnO)m (M=In,Ga; m=Integer) Described by Four-Dimensional Superspace Group," Journal of Solid State Chemistry, 1998, vol. 139, pp. 347-355.
Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.
Meiboom, S et al., "Theory of the Blue Phase of Cholesteric Liquid Crystals," Phys. Rev. Lett. (Physical Review Letters), May 4, 1981, vol. 46, No. 18, pp. 1216-1219.
Miyasaka, M, "SUFTLA Flexible Microelectronics on their way to business," SID Digest '07 : SID International Symposium Digest of Technical Papers, 2007, vol. 38, pp. 1673-1676.
Mo, Y et al., "Amorphous Oxide TFT Backplanes for Large Size AMOLED Displays," IDW '08 : Proceedings of the 6th International Display Workshops, Dec. 3, 2008, pp. 581-584.
Nakamura, "Synthesis of Homologous Compound with New Long-Period Structure," NIRIM Newsletter, Mar. 1995, vol. 150, pp. 1-4 with English translation.
Nakamura, M et al., "The phase relations in the In2O3—Ga2ZnO4—ZnO system at 1350° C.," Journal of Solid State Chemistry, Aug. 1, 1991, vol. 93, No. 2, pp. 298-315.
Nomura, K et al., "Thin-Film Transistor Fabricated in Single-Crystalline Transparent Oxide Semiconductor," Science, May 23, 2003, vol. 300, No. 5623, pp. 1269-1272.
Nomura, K et al., "Amorphous Oxide Semiconductors for High-Performance Flexible Thin-Film Transistors," Jpn. J. Appl. Phys. (Japanese Journal of Applied Physics), 2006, vol. 45, No. 5B, pp. 4303-4308.
Nomura, K et al., "Room-Temperature Fabrication of Transparent Flexible Thin-Film Transistors Using Amorphous Oxide Semiconductors," Nature, Nov. 25, 2004, vol. 432, pp. 488-492.

(56) References Cited

OTHER PUBLICATIONS

Nomura, K et al., "Carrier transport in transparent oxide semiconductor with intrinsic structural randomness probed using single-crystalline InGaO3(ZnO)5 films," Appl. Phys. Lett. (Applied Physics Letters), Sep. 13, 2004, vol. 85, No. 11, pp. 1993-1995.

Nowatari, H et al., "60.2: Intermediate Connector With Suppressed Voltage Loss for White Tandem OLEDS," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 in. QVGA AMOLED Display Using In-Ga-Zn-Oxide TFTs With a Novel Passivation Layer," SID Digest '09 : SID International Symposium Digest of Technical Papers, May 31, 2009, pp. 284-287.

Ohara, H et al., "Amorphous In-Ga-Zn-Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Orita, M et al., "Amorphous transparent conductive oxide InGaO3(ZnO)m (m<4):a Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al., "15.2: Development of Driver-Integrated Panel using Amorphous In-Ga-Zn-Oxide TFT," SID Digest '09 : SID International Symposium Digest of Technical Papers, May 31, 2009, pp. 184-187.

Osada, T et al., "Development of Driver-Integrated Panel Using Amorphous In-Ga-Zn-Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park. J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium-Gallium-Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium-Gallium-Zinc Oxide TFTs and Their Application for Large Size AMOLED," AM-FPD '08 Digest of Technical Papers, Jul. 2, 2008, pp. 275-278.

Park, S et al., "Challenge to Future Displays: Transparent AM-OLED Driven by Peald Grown ZnO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-In. AMOLED Display With Driver Circuit Using Amorphous In—Ga—Zn—OXIDE TFTs," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous GIZO (Ga2O3—In2O3—ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transistor on SrTiO3 with Sputtered Al2O3 Gate Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

\* cited by examiner

FIG. 1A
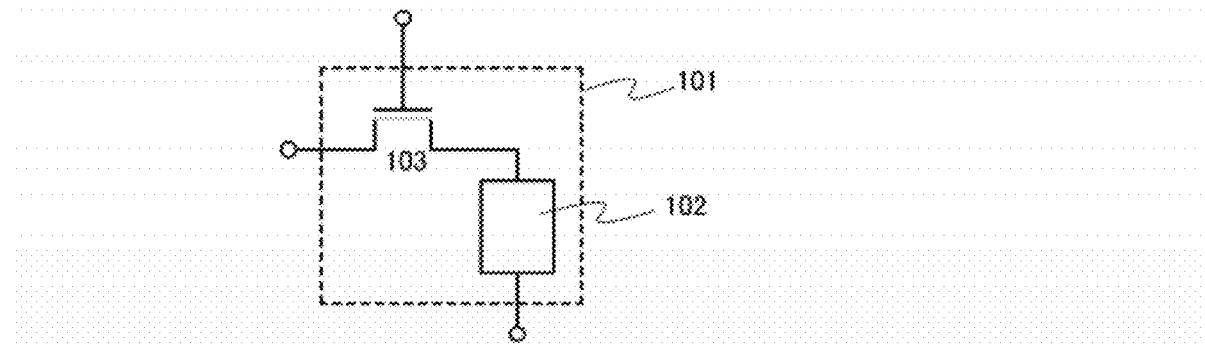
FIG. 1B
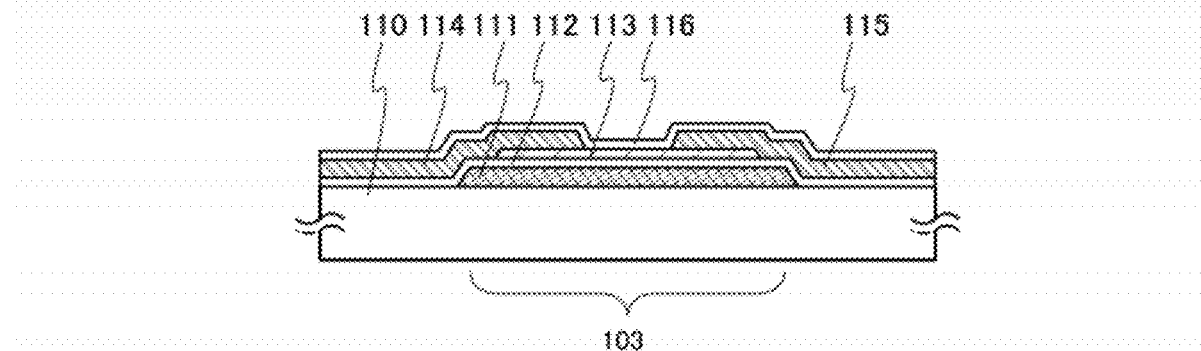
FIG. 1C
| cache line 0 | tag 0 | valid bit 0 | data field 0 |
|---|---|---|---|
| cache line 1 | tag 1 | valid bit 1 | data field 1 |
| cache line 2 | tag 2 | valid bit 2 | data field 2 |
| cache line 3 | tag 3 | valid bit 3 | data field 3 |
| | | | |
| cache line n-1 | tag n-1 | valid bit n-1 | data field n-1 |

FIG. 22A  FIG. 22B
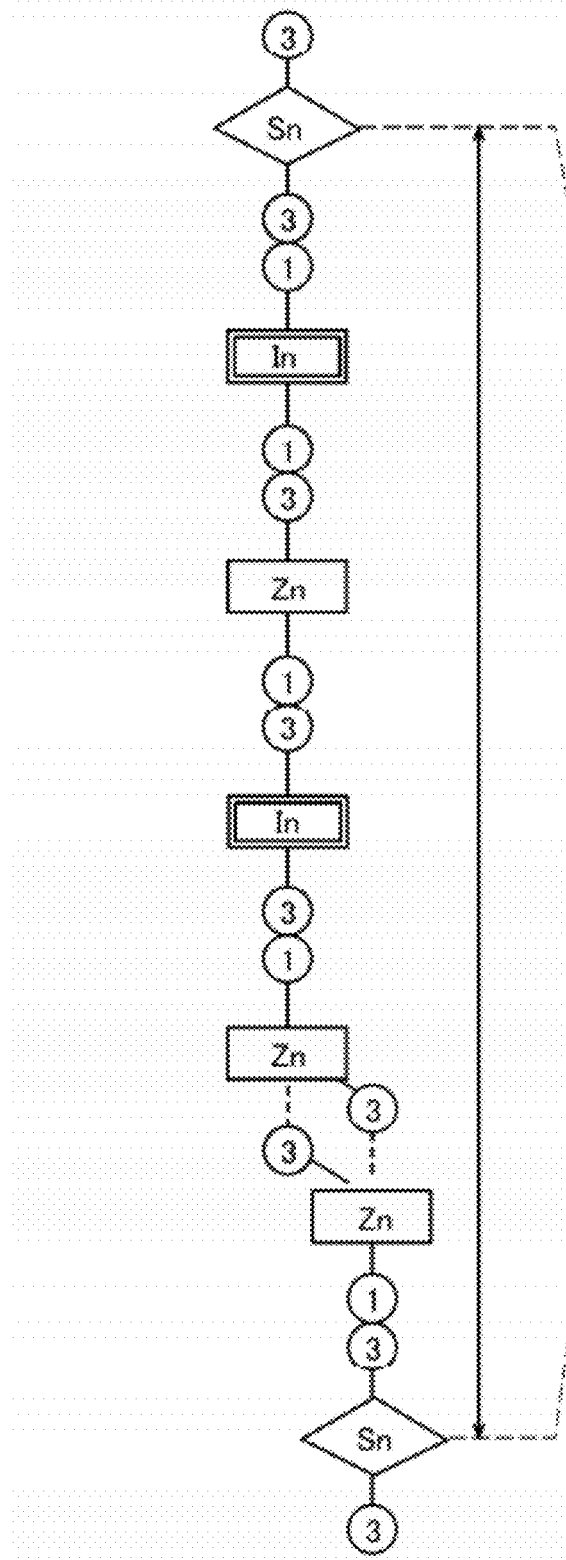
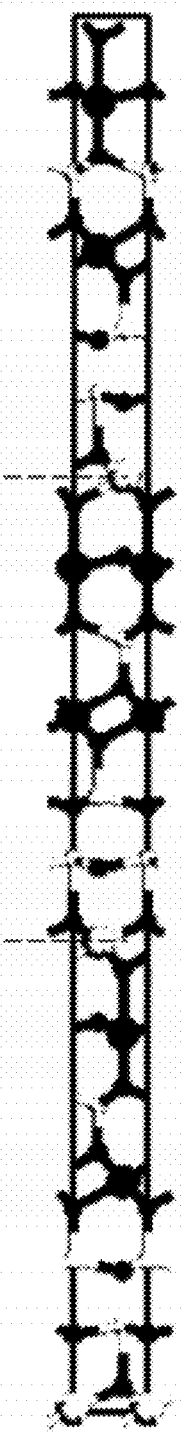
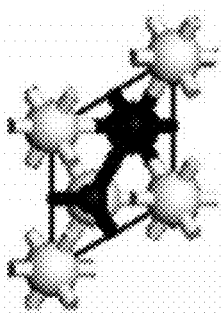
FIG. 22C
● In
☾ Sn
⌣ Zn
• O

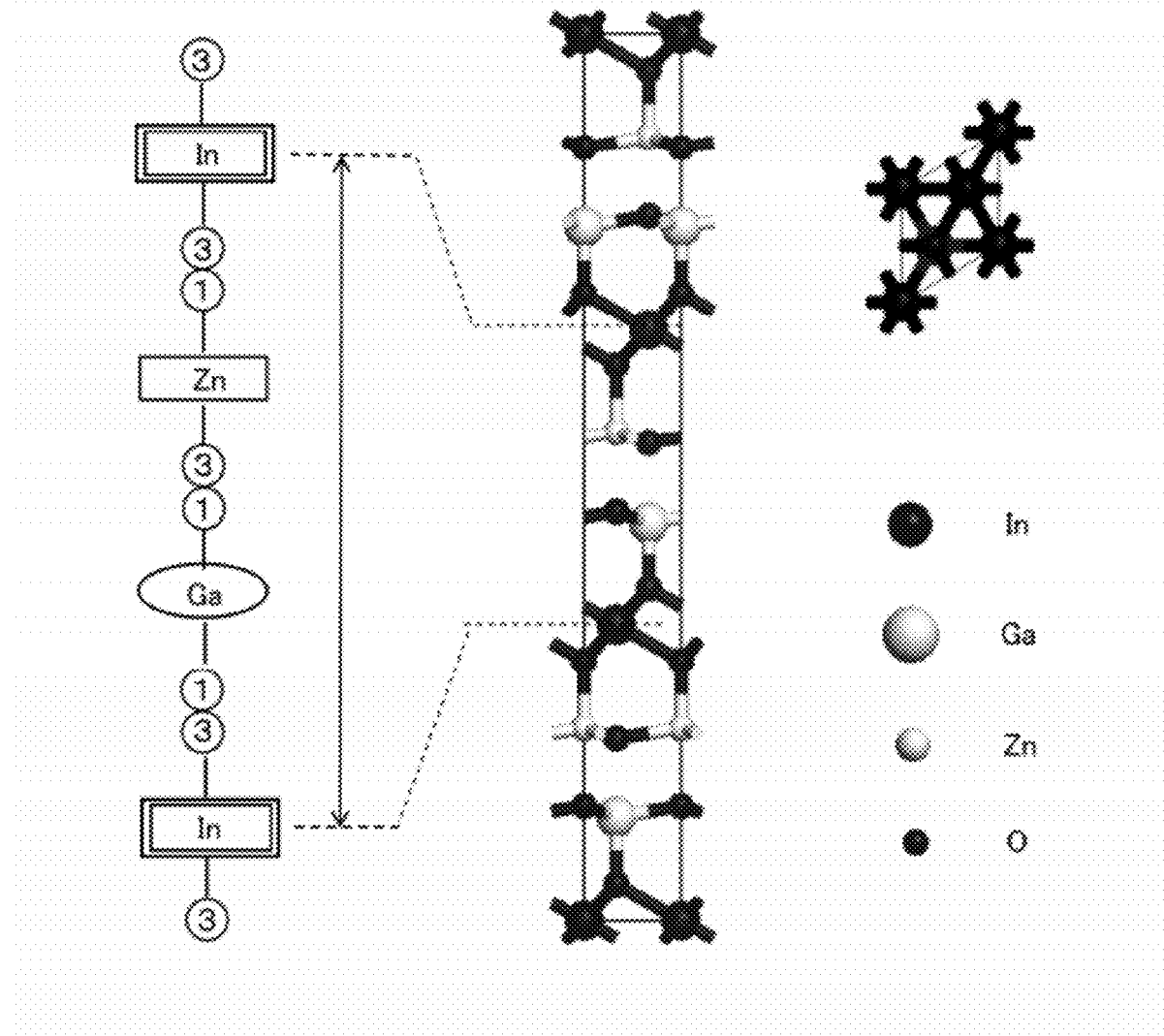

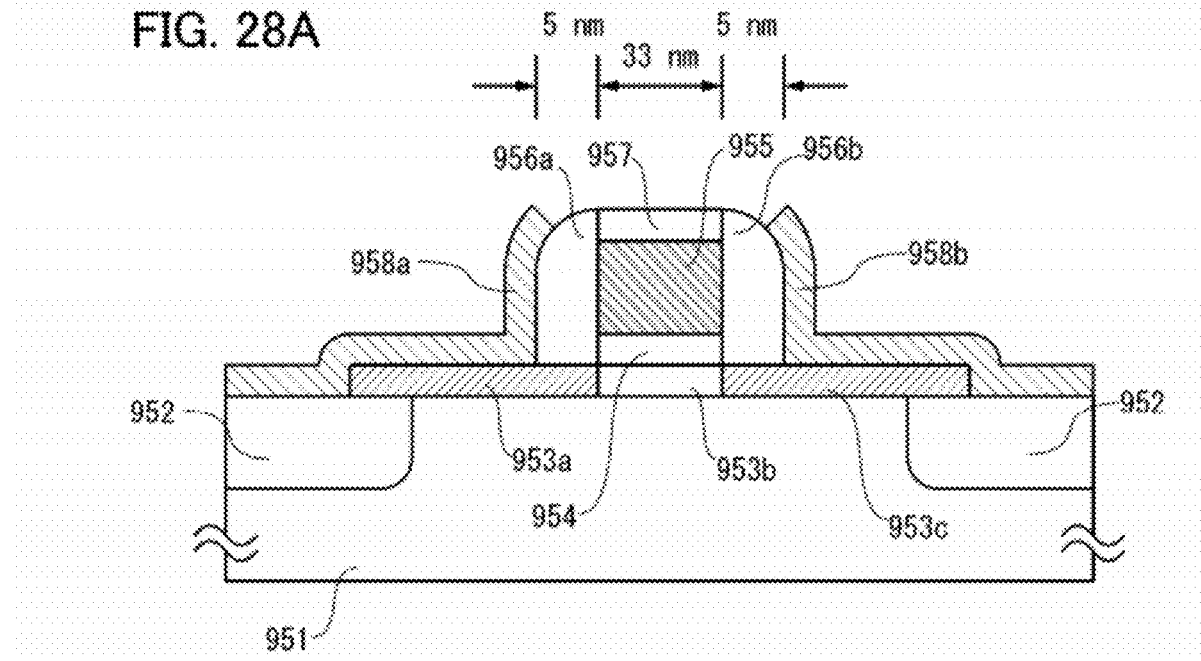
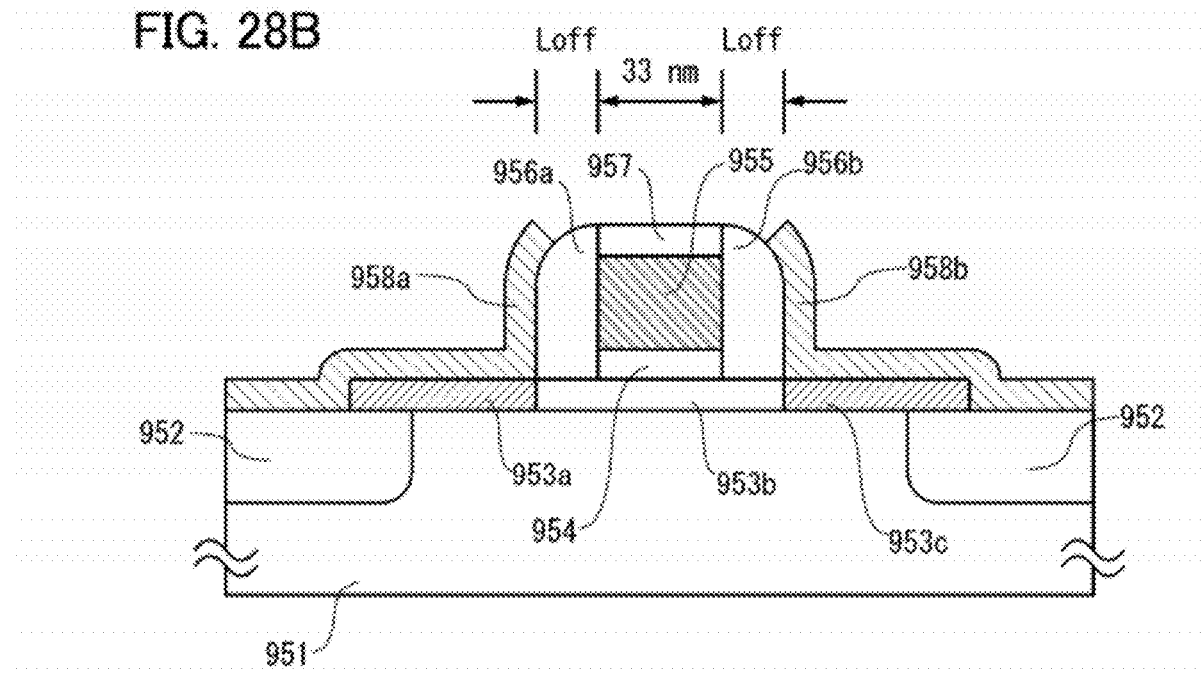

MEMORY DEVICE AND SEMICONDUCTOR DEVICE USING THE SAME

BACKGROUND OF THE INVENTION

1. Field of the Invention

The present invention relates to a memory device and a semiconductor device including the memory device.

2. Description of the Related Art

Central processing units (CPUs) have a variety of architecture depending on their usage, and architecture called stored-program architecture is predominant architecture of current CPUs. In a stored-program CPU, an instruction and data needed for carrying out the instruction are stored in a semiconductor memory device (hereinafter, simply referred to as a memory device), and the instruction and the data are sequentially read from the memory device, whereby the instruction is carried out.

As the memory device, besides a main memory device for storing data and instructions, a buffer memory device called a cache which can perform data writing and data reading at high speed is given. In order to reduce low-speed access to the main memory device and speed up the arithmetic processing, a cache is provided in a CPU to be located between an arithmetic unit or a control unit and a main memory device. In general, a static random access memory (SRAM) or the like is used as a cache. Patent Document 1 shown below discloses a structure in which a volatile memory such as an SRAM and a nonvolatile memory are used in combination as a cache.

REFERENCE

Patent Document

[Patent Document 1] Japanese Published Patent Application No. H7-121444

SUMMARY OF THE INVENTION

In a CPU including a buffer memory device, frequently used instruction or data in a main memory device is copied from the main memory device and stored in the buffer memory device. Then, in general, an arithmetic unit or a control unit included in the CPU accesses only the buffer memory device storing the frequently used data or instruction. However, there is a possibility that a needed instruction or data is not stored in the buffer memory device. In this case, in the CPU, it is necessary that the instruction or data is copied from the low-speed main memory device to be stored in the buffer memory device; therefore, it takes longer time to carry out the instruction as compared to the case where only an access to the buffer memory device is performed. A state where an instruction or data needed for the CPU is stored in the buffer memory device is called a cache hit, and a state where an instruction or data needed for the CPU is not stored in the buffer memory device is called a cache miss.

In order to reduce the frequency of the low-speed access to the main memory device as much as possible, it is effective to use a buffer memory device having large storage capacity in the CPU. A dynamic random access memory (DRAM) is advantageous for increasing the capacity of the memory device. However, a DRAM needs refresh, and thus there is a limitation on increase in the operation speed of DRAM. On the other hand, an SRAM can operate at high speed. However, an SRAM is not suitable for increasing the capacity because it is difficult to increase the integration degree due to a large number of semiconductor elements per memory cell.

In view of the above problems, one object of one embodiment of the present invention is to provide a memory device whose speed at the time of operation such as writing or reading can be higher than that of a DRAM and whose number of semiconductor elements per memory cell can be smaller than that of an SRAM. Another object of one embodiment of the present invention is to provide a semiconductor device including the memory device.

To solve the above problems, a memory device according to one embodiment of the present invention includes, in every memory cell, a memory element and a transistor which functions as a switching element for controlling supply, retention, and release of charge in the memory element. In addition, the transistor includes a channel formation region including a semiconductor whose bandgap is wider than that of silicon and whose intrinsic carrier density is lower than that of silicon. As such a semiconductor, for example, a semiconductor whose bandgap is twice or more as wide as that of silicon, such as an oxide semiconductor, silicon carbide, or gallium nitride can be given. Off current of the transistor including the semiconductor can be extremely small as compared to that of a general transistor formed using a semiconductor such as silicon or germanium. Therefore, the use of the transistor having the above structure as a switching element for retaining charge which flows into the memory element make is possible to prevent leakage of current from the memory element.

In addition, the semiconductor device according to one embodiment of the present invention includes, in addition to the memory device, an arithmetic unit which exchanges data with the memory device and a variety of circuits such as a control unit. The memory device functions as a buffer memory device.

As the memory element, a transistor, a capacitor, or the like can be used, for example.

In addition, in one embodiment of the present invention, the buffer memory device having the above structure includes a plurality of memory regions called cache lines each of which has a given amount of information. Each of the cache lines includes a memory region called a data field, a memory region called a tag, and a memory region called a valid bit. Cache data that is data sent from a main memory device or an arithmetic unit is stored in the data field. Address data that is data of an address corresponding to the cache data is stored in the tag. Valid data that is data indicating whether the cache data stored in the data field is valid or is invalid is stored in the valid bit.

In one embodiment of the present invention, among a plurality of memory cells included in the buffer memory device, a memory cell corresponding to the valid bit has a shorter data retention time than a memory cell corresponding to the data field. With this structure, the valid data stored in the valid bit can be invalidated before the reliability of the cache data stored in the data field becomes low. Accordingly, a state where the valid data is valid even when the cache data stored in the data field is invalid can be prevented.

In order to shorten the data retention time of the memory cell corresponding to the valid bit, at least one of the following two structures is employed. A first structure is the one in which the amount of charge retained in a memory element is reduced. A second structure is the one in which the potential of a data line at which a digital value is switched at data writing, that is, a threshold potential is increased.

Specifically, in the case of a buffer memory device having the first structure, the capacitance value of a memory element in a memory cell corresponding to a valid bit is smaller than that in a memory cell corresponding to a data field. With the structure, the data retention time of the memory cell corresponding to the valid bit is shorter than that of the memory cell corresponding to the data field. Note that in the case where the memory element is a transistor, the "capacitance value" means a capacitance value of a gate capacitance of the transistor.

Alternatively, specifically, in the case of a buffer memory device having the first structure, at the time of data retention, the potential of a data line of a memory cell corresponding to a valid bit is lower than that of a memory cell corresponding to a data field. With the above structure, the data retention time of the memory cell corresponding to the valid bit is shorter than that of the memory cell corresponding to the data field.

In addition, specifically, in the case of a buffer memory device having the second structure, precharge is performed so that predetermined potentials are applied to data lines when data stored in memory elements are output using differential amplifier circuits. The potential of the precharge to a memory cell corresponding to a valid bit is higher than that to a memory cell corresponding to a data field. In the case where a digital value indicating a large amount of charge is written in the memory cell, the charge of the memory element leaks as time passes. However, as the potential of the precharge is higher, the potential of the data line at the time of data reading tends to be lower than the potential of the precharge even when the amount of charge which leaks is small. Therefore, when the digital value is determined in the differential amplifier circuit in accordance with whether the potential of the data line is higher or is lower than the potential of the precharge, data of a digital value indicating a small amount of charge is read out more easily as the potential of the precharge becomes higher. Accordingly, with the structure, the data retention time of the memory cell corresponding to the valid bit is shorter than that of the memory cell corresponding to the data field.

Further alternatively, in the case of a buffer memory device having the second structure, potentials of data lines are output through logic circuits each including one or a plurality of logic elements which invert the polarity of an input potential and output the potential. As for the logic circuit, when an input potential at which the polarity of an output potential is switched is referred to as a threshold potential of the logic circuit, the threshold potential of the logic circuit of a memory cell corresponding to a valid bit is higher than that of a memory cell corresponding to a data field. In the case of the structure, as the threshold potential of the logic circuit becomes higher, data of a digital value indicating a small amount of charge is read out more easily. Accordingly, with the structure, the data retention time of the memory cell corresponding to the valid bit is shorter than that of the memory cell corresponding to the data field.

Further alternatively, specifically, in the case of a buffer memory device having the second structure, potentials of data lines are output through logic circuits each including one or a plurality of logic elements. In addition, before data stored in memory elements are read out, precharge is performed so that predetermined potentials are applied to the data lines. The potential of the precharge to a memory cell corresponding to a valid bit is lower than that to a memory cell corresponding to a data field. When a digital value indicating a large amount of charge is written in the memory cell, the charge in the memory element leaks as time passes. However, as the potential of the precharge becomes lower, the potential of the data line at the time data reading tends to be lower than the threshold potential of the logic circuit even when the amount of the charge which leaks is small. Therefore, as the potential of the precharge becomes lower, data of a digital value indicating a small amount of charge is read out more easily. Accordingly, with the structure, the data retention time of the memory cell corresponding to the valid bit is shorter than that of the memory cell corresponding to the data field.

Further alternatively, specifically, in the case of a buffer memory device having the second structure, potentials of data lines are output through logic circuits each including one or a plurality of logic elements. The capacitance value of a capacitor connected to a data line of a memory cell corresponding to a valid bit is smaller than that of a capacitor connected to a data line of a memory cell corresponding to a data field. When a digital value indicating a large amount of charge is written in the memory cell, the charge in a memory element leaks as time passes. However, as the capacitance value becomes smaller, the potential of the data line at the time of data reading tends to decrease faster to be lower than the threshold potential of the logic circuit even when the amount of charge which leaks is small. Therefore, as the capacitance value of the capacitor connected to the data line becomes smaller, data of a digital value indicating a small amount of charge is read out more easily. Accordingly, with the structure, the data retention time of the memory cell corresponding to the valid bit is shorter than that of the memory cell corresponding to the data field.

Further alternatively, specifically, in the case of a buffer memory device having the second structure, potentials of data lines are output through logic circuits each including one or a plurality of logic elements. A channel width of a transistor used at the time of data reading in a memory cell corresponding to a valid bit is larger than that in a memory cell corresponding to a data field. When a digital value indicating a large amount of charge is written in the memory cell, the charge in the memory element leaks as time passes. However, as the channel width of the transistor becomes larger, the potential of the data line at the time of data reading tends to decrease faster to be lower than the threshold potential of the logic circuit even when the amount of the charge which leaks is small. Therefore, as the channel width of the transistor becomes larger, data of a digital value indicating a small amount of charge is read out more easily. Accordingly, with the structure, the data retention time of the memory corresponding to the valid bit is shorter than that of the memory cell corresponding to the data field.

With any of the above structures, the frequency of refresh in the memory device according to one embodiment of the present invention can be lower than that of a DRAM, and thus the speed of operation such as writing or reading of the memory device according to one embodiment of the present invention is higher than that of a DRAM. In addition, the number of semiconductor elements per memory cell of the memory device according to one embodiment of the present invention can be smaller than that of an SRAM.

Alternatively, with the use of the structure in which the data retention time of a memory cell corresponding to a valid bit is shorter than that of a memory cell corresponding to a data field, the reliability of the memory device according to one embodiment of the present invention can be improved.

In the semiconductor device using the memory device according to one embodiment of the present invention, high-speed operation and high integration can be achieved. In addition, the semiconductor device using the memory device according to one embodiment of the present invention can have high reliability.

BRIEF DESCRIPTION OF THE DRAWINGS

In the accompanying drawings:
FIGS. 1A to 1C are a circuit diagram illustrating the structure of a memory cell, a cross-sectional view of a transistor, and a diagram illustrating the structure of a buffer memory device.

FIGS. 22A to 22C illustrate the crystal structure of an oxide semiconductor;

FIGS. 23A to 23C illustrate the crystal structure of an oxide semiconductor.

FIGS. 28A and 28B each illustrate a cross-sectional structure of a transistor used for calculation;

DETAILED DESCRIPTION OF THE INVENTION

Figure 2:
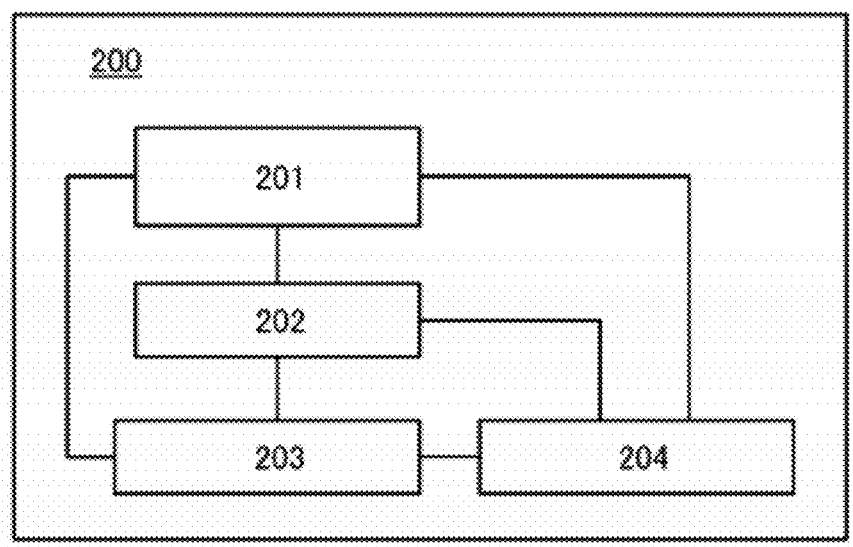
FIG. 2 illustrates the structure of a semiconductor device.

Hereinafter, embodiments and examples of the present invention will be described in detail with reference to the accompanying drawings. However, the present invention is not limited to the following description and it is easily understood by those skilled in the art that the mode and details can be variously changed without departing from the scope and spirit of the present invention. Therefore, the present invention should not be interpreted as being limited to the description of embodiments and examples to be given below.

A semiconductor device of the present invention includes, in its category, an integrated circuit such as a large scale integrated circuit (LSI) including a microprocessor, an image processing circuit, a digital signal processor (DSP), or a microcontroller.

Embodiment 1

Structure of Memory Cell and Structure of Transistor

FIG. 1A is a circuit diagram illustrating a structure of a memory cell included in a memory device according to one embodiment of the present invention, as an example. In the circuit diagram illustrated in FIG. 1A, a memory cell 101 includes a memory element 102 and a transistor 103 which functions as a switching element. A semiconductor element such as a capacitor or a transistor can be used for the memory element 102. In the memory element 102, charge is accumulated in a capacitor or a gate capacitance formed between a gate electrode and an active layer of a transistor, whereby data is stored.

The transistor 103 functioning as a switching element controls supply of charge to the memory element 102, discharge of the charge from the memory element 102, and retention of the charge in the memory element 102.

Note that the memory cell 101 may further include another circuit element such as a transistor, a diode, a resistor, or an inductor as needed.

In one embodiment of the present invention, a channel formation region of the transistor 103 which functions as a switching element includes a semiconductor material whose band gap is wider than that of a silicon semiconductor and whose intrinsic carrier density is lower than that of silicon. When a semiconductor material having such characteristics is included in the channel formation region, the transistor 103 with an extremely small off-state current or an extremely small leakage current can be achieved.

Note that a highly purified oxide semiconductor (a purified OS) obtained by reduction of impurities such as moisture or hydrogen which serve as electron donors (donors) and reduction of oxygen deficiency is an intrinsic (i-type) semiconductor or a substantially i-type semiconductor. Therefore, a transistor including the oxide semiconductor has a characteristic of very small off-state current. Specifically, the concentration of hydrogen in the highly purified oxide semiconductor that is measured by secondary ion mass spectrometry (SIMS) is less than $5 \times 10^{18}/cm^3$ or lower, preferably less than or equal to $5 \times 10^{17}/cm^3$, more preferably less than or equal to $1 \times 10^{16}/cm^3$. In addition, the carrier density of the oxide semiconductor film that can be measured by Hall effect measurement is less than $1 \times 10^{14}/cm^3$, preferably less than $1 \times 10^{12}/cm^3$, more preferably less than $1\times10^{11}/cm^3$. Furthermore, the band gap of the oxide semiconductor is greater than or equal to 2 eV, preferably greater than or equal to 2.5 eV, more preferably greater than or equal to 3 eV. With the use of the oxide semiconductor film which is highly purified by sufficiently reducing the concentration of impurities such as moisture or hydrogen and reducing the oxygen deficiency, off-state current of the transistor can be reduced.

The analysis of the concentration of hydrogen in the oxide semiconductor film is described here. The concentration of hydrogen in the semiconductor film is measured by SIMS. It is known that it is difficult to obtain precise data in the proximity of a surface of a sample or in the proximity of an interface between stacked films formed using different materials by the SIMS in principle. Thus, in the case where the distribution of the hydrogen concentration of the film in a thickness direction is analyzed by SIMS, an average value in a region of the film, in which the value is not greatly changed and almost the same value can be obtained is employed as the hydrogen concentration. Further, in the case where the thickness of the film is small, a region where almost the same value can be obtained cannot be found in some cases due to the influence of the hydrogen concentration of the films adjacent to each other. In that case, the maximum value or the minimum value of the hydrogen concentration in the region of the film is employed as the hydrogen concentration of the film. Further, in the case where a mountain-shaped peak having the maximum value or a valley-shaped peak having the minimum value do not exist in the region of the film, the value at the inflection point is employed as the hydrogen concentration.

Various experiments can actually prove low an off-state current of the transistor including the highly purified oxide semiconductor film as an active layer. For example, even with an element with a channel width of $1\times10^6$ μm and a channel length of 10 μm, in a range of 1 V to 10 V of voltage (drain voltage) between a source electrode and a drain electrode, an off-state current can be less than or equal to the measurement limit of a semiconductor parameter analyzer, that is, less than or equal to $1\times10^{-13}$ A. In this case, it can be found that an off current density corresponding to a value obtained by dividing the off current by the channel width of the transistor is less than or equal to 100 zA/μm.

Note that an oxide semiconductor used preferably contains at least indium (In) or zinc (Zn). In particular, In and Zn are preferably contained. As a stabilizer for reducing variation in electric characteristics of a transistor including the oxide, gallium (Ga) is preferably additionally contained. Tin (Sn) is preferably contained as a stabilizer. Hafnium (Hf) is preferably contained as a stabilizer. Aluminum (Al) is preferably contained as a stabilizer.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

As the oxide semiconductor, for example, an indium oxide, a tin oxide, a zinc oxide, a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide, a three-component metal oxide such as an In—Ga—Zn-based oxide, an In—Al—Zn-based oxide, an In—Sn—Zn-based oxide, an In—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide, a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide can be used.

Note that, here, for example, an In—Ga—Zn-based oxide means an oxide containing In, Ga, and Zn, and there is no limitation on the ratio of In, Ga, and Zn. Further, the In—Ga—Zn-based oxide may contain a metal element other than In, Ga, and Zn.

Alternatively, a material represented by $InMO_3(ZnO)_m$ (m>0, m is not an integer) may be used as the oxide semiconductor. Note that M represents one or more metal elements selected from Ga, Fe, Mn, and Co. Alternatively, as the oxide semiconductor, a material represented by $In_3SnO_5(ZnO)_n$ (n>0, n is an integer) may be used.

The length of a data retention time depends on the amount of leakage of charge accumulated in the memory element 102 via the transistor 103. Accordingly, the use of the transistor 103 having the above structure as a switching element for retaining the charge accumulated in the memory element 102 makes it possible to prevent leakage of the charge from the memory element 102 and to ensure a long data retention time.

Unless otherwise specified, in the case of an n-channel transistor, an off-state current in this specification is a current which flows between a source electrode and a drain electrode when a potential of the drain electrode is higher than that of the source electrode and that of a gate electrode while the potential of the gate electrode is less than or equal to zero when a reference potential is the potential of the source electrode. Alternatively, in this specification, in the case of a p-channel transistor, an off-state current is a current which flows between a source electrode and a drain electrode when a potential of the drain electrode is lower than that of the source electrode or that of a gate electrode while the potential of the gate electrode is greater than or equal to zero when a reference potential is the potential of the source electrode. Further, a leakage current is a current which flows between a source electrode and a gate electrode or between a drain electrode and the gate electrode, through an insulating film.

The names of a "source electrode" and a "drain electrode" of the transistor interchange with each other depending on the polarity of the transistor or which level of the potentials applied to the electrodes is high. In general, in an n-channel transistor, an electrode to which a lower potential is applied is called a source electrode, and an electrode to which a higher potential is applied is called a drain electrode. Further, in a p-channel transistor, an electrode to which a lower potential is applied is called a drain electrode, and an electrode to which a higher potential is applied is called a source electrode. In this specification, one of a source electrode and a drain electrode is referred to as a first terminal and the other is referred to as a second terminal in some cases.

As one example of a semiconductor whose band gap is wider than that of a silicon semiconductor and whose intrinsic carrier density is lower than that of silicon, a compound semiconductor such as silicon carbide (SiC) or gallium nitride (GaN), an oxide semiconductor formed of metal oxide such as zinc oxide (ZnO), or the like can be used. Among the above, an oxide semiconductor has an advantage of high mass productivity because the oxide semiconductor can be formed by a sputtering method, a wet process, or the like. Further, unlike silicon carbide or gallium nitride, the oxide semiconductor can be formed at room temperature, and thus the oxide semiconductor can be formed on a glass substrate or on an integrated circuit using a semiconductor element. Further, a larger substrate can be used. Accordingly, among the semiconductors with wide band gaps, the oxide semiconductor particularly has an advantage of high mass productivity. Further, in the case where an oxide semiconductor with high crystallinity is to be obtained in order to improve the properties of a transistor (e.g., field-effect mobility), the oxide semiconductor with crystallinity can be easily obtained by heat treatment at 250° C. to 800° C.

In the following description, an example in which an oxide semiconductor with the above advantages is used as a semiconductor film of the transistor 103 is given.

Note that in FIG. 1A, the transistor 103 has a gate electrode on one side of an active layer. When the transistor 103 has a pair of gate electrodes between which the active layer is provided, a signal for controlling switching is supplied to one of the gate electrodes, and the other of the gate electrodes may be in a floating state (i.e., electrically insulated) or a potential may be supplied to the other of the gate electrodes. In the latter case, potentials with the same level may be applied to the pair of electrodes, or a fixed potential such as a ground potential may be applied only to the other of the gate electrodes. By controlling the level of a potential applied to the other of the gate electrodes, a threshold voltage of the transistor 103 can be controlled.

Although FIG. 1A illustrates the structure in which the memory cell 101 includes one transistor 103 which functions as a switching element, one embodiment of the present invention is not limited to this structure. In one embodiment of the present invention, it is acceptable as long as one transistor which functions as a switching element is provided in every memory cell, and the number of such transistors may be two or more. In the case where the memory cell 101 includes switching elements including a plurality of transistors, the plurality of transistors may be connected to each other in parallel, in series, or in combination of parallel connection and series connection.

Note that in this specification, the state in which the transistors are connected to each other in series means, for example, the state in which only one of a first terminal and a second terminal of a first transistor is connected to only one of a first terminal and a second terminal of a second transistor. Further, the state in which the transistors are connected to each other in parallel means a state in which the first terminal of the first transistor is connected to the first terminal of the second transistor and the second terminal of the first transistor is connected to the second terminal of the second transistor.

Next, an example of a cross-sectional view of the transistor 103 illustrated in FIG. 1A is illustrated in FIG. 1B.

The transistor 103 in FIG. 1B includes, over a substrate 110 having an insulating surface, a gate electrode 111; an insulating film 112 over the gate electrode 111; an oxide semiconductor film 113 which functions as an active layer and overlaps with the gate electrode 111 with the insulating film 112 provided therebetween; and a source electrode 114 and a drain electrode 115 over the oxide semiconductor film 113. In FIG. 1B, an insulating film 116 is formed over the oxide semiconductor film 113, the source electrode 114, and the drain electrode 115. The insulating film 116 may be included as a component of the transistor 103.

Note that although FIG. 1B illustrate the case where the transistor 103 has a single-gate structure, the transistor 103 may have a multi-gate structure in which a plurality of connected gate electrodes is included so that a plurality of channel formation regions is included.

The memory device including the memory cell described above can ensure a longer data retention time than a general DRAM including a transistor whose active layer is formed using silicon or germanium. Therefore, the frequency of refresh in the memory device can be lower than that in a general DRAM, and thus power consumed in refresh can be reduced in the memory device. In addition, since the frequency of refresh in the memory device can be lower than that in a general DRAM, the speed of operation such as writing or reading is high in the memory device.

<<Structure of Buffer Memory Device>>

FIG. 1C illustrates an example of the structure of a buffer memory device in the case where the memory device is used as the buffer memory device. The buffer memory device illustrated in FIG. 1C includes n cache lines, that is, cache lines 0 to n−1. Each of the cache lines includes a tag, a valid bit, and a data field. Specifically, in FIG. 1C, a tag, a valid bit, and a data field included in an i-th (i is a natural number less than or equal to n) cache line are referred to as "tag i", "valid bit i", and "data field i", respectively.

Cache data that is data sent from a control unit, a main memory device, or an arithmetic unit is stored in every data field. Address data that is data of an address corresponding to the cache data is stored in every tag. Valid data that is data indicating whether or not the cache data stored in the data field is valid is stored in every valid bit.

The buffer memory device according to one embodiment of the present invention has a structure in which a data retention time of the memory cell corresponding to the valid bit is shorter than that of the memory cell corresponding to the data field. With this structure, the valid data stored in the valid bit can be invalidated before the reliability of the cache data stored in the data field becomes low. Accordingly, a state where the valid data is valid even when the cache data stored in the data field is invalid can be prevented. The above structure makes it possible to improve the reliability of the cache data stored in the data field.

Alternatively, the buffer memory device according to one embodiment of the present invention has a structure in which the data retention time of the memory cell corresponding to the valid bit is shorter than those of the memory cell corresponding to the data field and a memory cell corresponding to the tag. The above structure makes it possible to improve the reliability of the cache data stored in the data field and the reliability of the address data stored in the tag.

Note that any of a direct mapped structure, a fully associative structure, and a set associative structure may be employed as a data storage structure of the buffer memory device according to one embodiment of the present invention, <<Specific Structure of Memory Cell>>

Next, FIGS. 3A to 3C and FIGS. 4A and 4B illustrate specific examples of structures of the memory cell 101.

Note that the term "connection" in this specification refers to electrical connection and corresponds to the state in which current, a potential, or voltage can be supplied or transmitted. Accordingly, a connection state means not only a state of a direct connection but also a state of indirect connection through a circuit element such as a wiring, a resistor, a diode, or a transistor so that current, a potential, or voltage can be supplied or transmitted.

In addition, even when different components are connected to each other in a circuit diagram, there is actually a case where one conductive film has functions of a plurality of components such as a case where part of a wiring serves as an electrode. The term "connection" in this specification also means such a case where one conductive film has functions of a plurality of components.

Figure 3A:
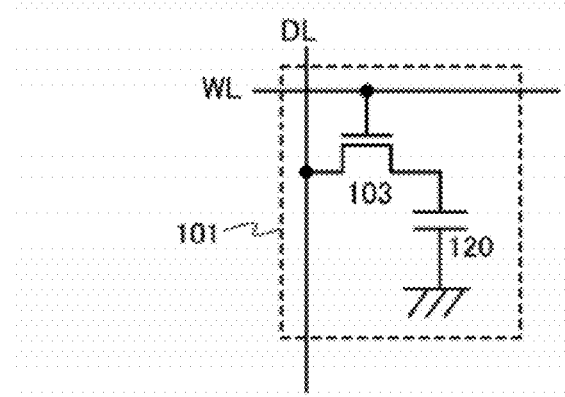
FIGS. 3A to 3C each illustrate the structure of a memory cell.

The memory cell 101 illustrated in FIG. 3A includes the transistor 103 functioning as a switching element and a capacitor 120 functioning as a memory element. A gate electrode of the transistor 103 is connected to a word line WL. A first terminal of the transistor 103 is connected to a data line DL and a second terminal thereof is connected to one electrode of the capacitor 120. The other electrode of the capacitor 120 is connected to a node to which a fixed potential such as a ground potential is supplied.

In the memory cell 101 illustrated in FIG. 3A, the transistor 103 is turned on at the time of data writing, so that a potential of a signal including data is supplied from the data line DL to the one electrode of the capacitor 120 via the transistor 103. The amount of charge accumulated in the capacitor 120 is controlled in accordance with the potential of the signal, so that data is written to the capacitor 120.

Then, the transistor 103 is turned off when data is retained, so that the charge is retained in the capacitor 120. As described above, the transistor 103 has a characteristic of an extremely small off-state current or an extremely small leakage current. Therefore, the charge accumulated in the capacitor 120 is difficult to leak, and thus, the data can be retained for a long period of time as compared to the case where a semiconductor material such as silicon is used for the transistor 103.

At the time of data reading, the transistor 103 is turned on, so that the charge accumulated in the capacitor 120 is taken out via the data line DL. The difference in the amount of charge is read, whereby data can be read.

Figure 3B:
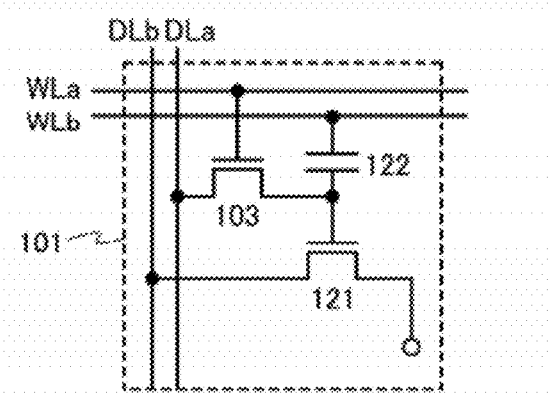

The memory cell 101 illustrated in FIG. 3B includes the transistor 103 functioning as a switching element, and a transistor 121 and a capacitor 122 which function as memory elements. The gate electrode of the transistor 103 is connected to a first word line WLa. The first terminal of the transistor 103 is connected to a first data line DLa and the second terminal thereof is connected to a gate electrode of the transistor 121. A first terminal of the transistor 121 is connected to a second data line DLb, and a second terminal thereof is connected to a node to which a predetermined potential is applied. The capacitor 122 includes a pair of electrodes, one of the electrodes is connected to the gate electrode of the transistor 121, and the other thereof is connected to a second word line WLb.

In the memory cell 101 illustrated in FIG. 3B, the transistor 103 is turned on at the time of data writing, so that a potential of a signal including data is supplied from the first data line DLa to the gate electrode of the transistor 121 via the transistor 103. A gate capacitance of the transistor 121 and the amount of charge accumulated in the capacitor 122 are controlled in accordance with the potential of the signal, so that data is written to the transistor 121 and the capacitor 122.

When data is retained, the transistor 103 is turned off, so that the charge accumulated in the gate capacitance of the transistor 121 and the capacitor 122 is retained. As described above, the transistor 103 has a characteristic of an extremely small off-state current or an extremely small leakage current. Therefore, the accumulated charge is difficult to leak, and thus, the data can be retained for a long period of time as compared to the case where a semiconductor material such as silicon is used for the transistor 103.

At the time of data reading, a potential of the second word line WLb is changed. A potential difference between the pair of electrodes included in the capacitor 122 is kept in accordance with the principle of charge conservation, and thus, the change in the potential of the second word line WLb is supplied to the gate electrode of the transistor 121. A threshold voltage of the transistor 121 is changed depending on the amount of charge accumulated in the gate capacitance of the transistor 121. Therefore, a difference in the amount of accumulated charge is read from the amount of a drain current of the transistor 121 which is obtained through the change in the potential of the gate electrode of the transistor 121, so that data can be read.

Note that an oxide semiconductor may be used for an active layer of the transistor 121 functioning as a memory element. Alternatively, for the active layer of the transistor 121, instead of the oxide semiconductor, any of the following semiconductors may be used: amorphous silicon, microcrystalline silicon, polycrystalline silicon, single crystal silicon, amorphous germanium, microcrystalline germanium, polycrystalline germanium, single crystal germanium, or the like. The use of an oxide semiconductor for active layers of all the transistors in the memory cell 101 makes it possible to simplify a manufacturing process. Further, for example, the active layer of the transistor 121 functioning as a memory element is formed using a semiconductor such as polycrystalline silicon or single crystal silicon which provides higher mobility (field-effect mobility) than an oxide semiconductor, whereby data can be read from the memory cell 101 at high speed.

Figure 3C:
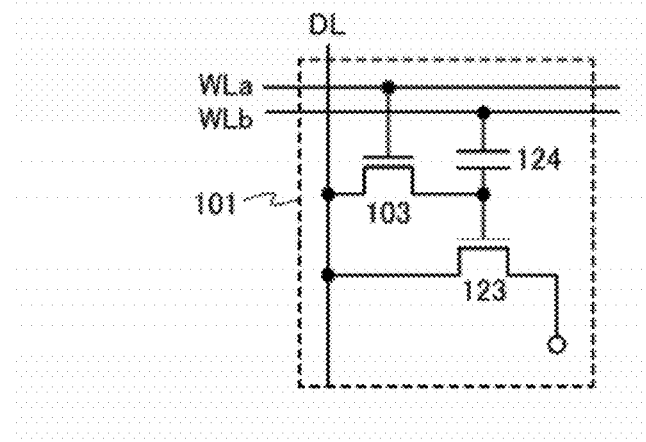

The memory cell 101 illustrated in FIG. 3C is different from the memory cell 101 illustrated in FIG. 3B in that one data line DL has functions of the first data line DLa and the second data line DLb. Specifically, the memory cell 101 illustrated in FIG. 3C includes the transistor 103 functioning as a switching element, and a transistor 123 and a capacitor 124 which function as memory elements. The gate electrode of the transistor 103 is connected to the first word line WLa. The first terminal of the transistor 103 is connected to the data line DL and the second terminal thereof is connected to a gate electrode of the transistor 123. The first terminal of a transistor 123 is connected to the data line DL and a second terminal thereof is connected to a node to which a predetermined potential is applied. The capacitor 124 includes a pair of electrodes, one of the electrodes is connected to a gate electrode of the transistor 123, and the other thereof is connected to the second word line WLb.

Operation such as writing, retention, and reading of data can be performed in the memory cell 101 illustrated in FIG. 3C in a manner similar to that in the memory cell 101 illustrated in FIG. 3B.

In addition, an oxide semiconductor may be used for an active layer of the transistor 123 functioning as a memory element. Alternatively, for the active layer of the transistor 123, instead of the oxide semiconductor, any of the following semiconductors may be used: amorphous silicon, microcrystalline silicon, polycrystalline silicon, single crystal silicon, amorphous germanium, microcrystalline germanium, polycrystalline germanium, single crystal germanium, or the like. The use of an oxide semiconductor for active layers of all the transistors in the memory cell 101 makes it possible to simplify a manufacturing process. Further, for example, the active layer of the transistor 123 functioning as a memory element is formed using a semiconductor such as polycrystalline silicon or single crystal silicon which provides higher mobility than an oxide semiconductor, whereby data can be read from the memory cell 101 at high speed.

Figure 4A:
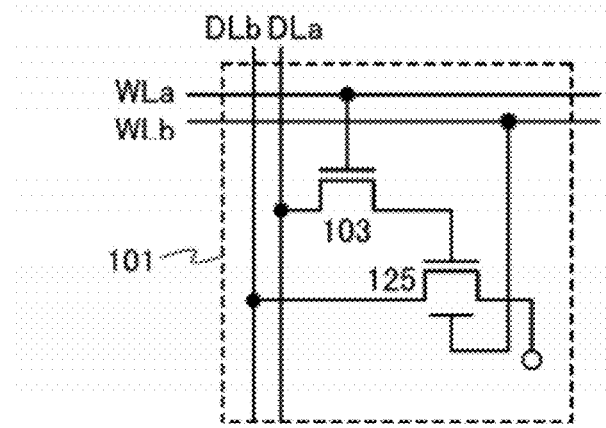
FIGS. 4A and 4B each illustrate the structure of a memory cell.

The memory cell 101 illustrated in FIG. 4A includes the transistor 103 functioning as a switching element and a transistor 125 functioning as a memory element. The transistor 125 includes a pair of gate electrodes between which an active layer is provided. One of the pair of gate electrodes serves as a first gate electrode and the other thereof serves as second gate electrode.

The gate electrode of the transistor 103 is connected to the first word line WLa. The first terminal of the transistor 103 is connected to the first data line DLa and the second terminal thereof is connected to the first gate electrode of the transistor 125. The second gate electrode of the transistor 125 is connected to the second word line WLb. A first terminal of the transistor 125 is connected to the second data line DLb, and a second terminal thereof is connected to a node to which a predetermined potential is applied.

In the memory cell 101 illustrated in FIG. 4A, the transistor 103 is turned on at the time of data writing, so that a potential of a signal including data is supplied from the first data line DLa to the first gate electrode of the transistor 125 via the transistor 103. The amount of charge accumulated in a gate capacitance of the transistor 125 is controlled in accordance with the potential of the signal, so that data is written to the transistor 125.

When data is retained, the transistor 103 is turned off, so that the charge accumulated in the gate capacitance of the transistor 125 is retained. As described above, the transistor 103 has a characteristic of an extremely small off-state current or an extremely small leakage current. Therefore, the accumulated charge is difficult to leak, and thus, the data can be retained for a long period of time as compared to the case where a semiconductor material such as silicon is used for the transistor 103.

At the time of data reading, the potential of the second word line WLb is changed to change the potential of the second gate electrode of the transistor 125. A threshold voltage of the transistor 125 is changed depending on the amount of charge accumulated in the gate capacitance of the transistor 125. Therefore, a difference in the amount of accumulated charge is read from the amount of a drain current of the transistor 125 which is obtained through the change in the potential of the second gate electrode of the transistor 125, and as a result, data can be read.

Note that, an oxide semiconductor may be used for the active layer of the transistor 125 functioning as a memory element. Alternatively, for the active layer of the transistor 125, instead of the oxide semiconductor, any of the following semiconductors may be used: amorphous silicon, microcrystalline silicon, polycrystalline silicon, single crystal silicon, amorphous germanium, microcrystalline germanium, polycrystalline germanium, single crystal germanium, or the like. The use of an oxide semiconductor for active layers of all the transistors in the memory cell 101 makes it possible to simplify a manufacturing process. Further, for example, the active layer of the transistor 125 functioning as a memory element is formed using a semiconductor such as polycrystalline silicon or single crystal silicon which provides higher mobility than an oxide semiconductor, whereby data can be read from the memory cell 101 at high speed.

Figure 4B:
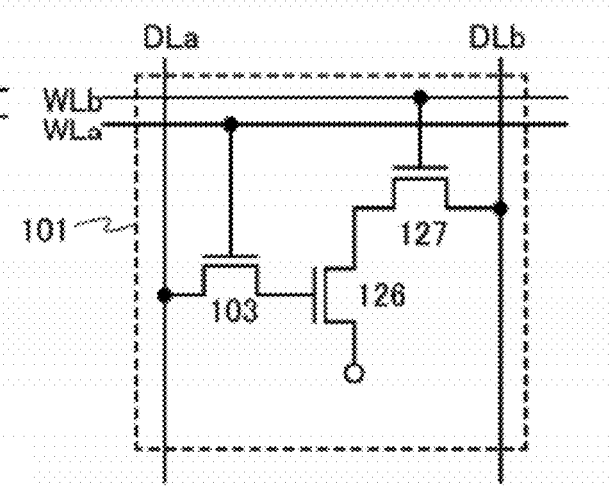

The memory cell 101 illustrated in FIG. 4B includes the transistor 103 functioning as a switching element, a transistor 126 functioning as a memory element, and a transistor 127 functioning as a switching element for controlling data reading. The gate electrode of the transistor 103 is connected to the first word line WLa. The first terminal of the transistor 103 is connected to the first data line DLa and the second terminal thereof is connected to a gate electrode of the transistor 126. A first terminal of the transistor 126 is connected to a second terminal of the transistor 127 and a second terminal of the transistor 126 is connected to a node to which a predetermined potential is applied. A first terminal of the transistor 127 is connected to the second data line DLb. A gate electrode of the transistor 127 is connected to the second word line WLb.

In the memory cell 101 illustrated in FIG. 4B, the transistor 103 is turned on at the time of data writing, so that a potential of a signal including data is supplied from the first data line DLa to the gate electrode of the transistor 126 via the transistor 103. The amount of charge accumulated in a gate capacitance of the transistor 126 is controlled in accordance with the potential of the signal, so that data is written to the transistor 126.

When data is retained, the transistor 103 is turned off, so that the charge accumulated in the gate capacitance of the transistor 126 is retained. As described above, the transistor 103 has a characteristic of an extremely low off-state current or an extremely low leakage current. Therefore, the accumulated charge is difficult to leak, and thus, data can be held for a long period of time as compared to the case where a semiconductor such as silicon is used.

At the time of data reading, the potential of the second word line WLb is changed, so that the transistor 127 is turned on. When the transistor 127 is turned on, a drain current having an amount corresponding to the amount of charge accumulated in its gate capacitance flows through the transistor 126. Therefore, a difference in the amount of accumulated charge is read from the amount of the drain current of the transistor 126, so that data can be read.

Note that an oxide semiconductor may be used for an active layer of the transistor 126 or the transistor 127. Alternatively, for the active layer of the transistor 126 or the transistor 127, instead of the oxide semiconductor, any of the following semiconductors may be used: amorphous silicon, microcrystalline silicon, polycrystalline silicon, single crystal silicon, amorphous germanium, microcrystalline germanium, polycrystalline germanium, single crystal germanium, or the like. The use of an oxide semiconductor for active layers of all the transistors in the memory cell 101 makes it possible to simplify a manufacturing process. Further, for example, the active layer of the transistor 126 or the transistor 127 is formed using a semiconductor material such as polycrystalline silicon or single crystal silicon which provides higher mobility than an oxide semiconductor, so that data can be read from the memory cell 101 at high speed.

The memory device including the memory cell is advantageous for increasing integration degree because the number of semiconductor elements per memory cell can be smaller than that of an SRAM.

<<Structure of Semiconductor Device>>

The semiconductor device according to one embodiment of the present invention includes at least one or a plurality of buffer memory devices each having the above structure, a control unit, and one or a plurality of arithmetic units. FIG. 2 illustrates a semiconductor device 200 according to one embodiment of the present invention. The semiconductor device 200 illustrated in FIG. 2 includes a control unit 201, an arithmetic unit 202, a buffer memory device 203, and a main memory device 204.

The control unit 201 is a circuit which controls operations of the arithmetic unit 202, the buffer memory device 203, and the main memory device 204 which are included in the semiconductor device 200. The arithmetic unit 202 is a logic circuit which performs arithmetic operations such as logic operations, four arithmetic operations, and the like. The buffer memory device 203 has a function of temporarily storing data at the time of the arithmetic operations in the arithmetic unit 202, and/or a function of temporarily storing an instruction which is carried out by the control unit 201.

The main memory device 204 can store the instruction which is carried out by the control unit 201 and/or can store data output from the arithmetic unit 202. Note that in FIG. 2, a structure in which the main memory device 204 is provided in the semiconductor device 200 as a part thereof is illustrated, but the main memory device 204 may be provided outside the semiconductor device 200.

The buffer memory device 203 is provided between the arithmetic unit 202 and the main memory device 204 and/or between the control unit 201 and the main memory device 204, so that low-speed access to the main memory device 204 can be reduced and the speed of signal processing such as arithmetic processing can be higher.

A plurality of memory cells is provided in the buffer memory device 203, and each of the memory cells includes a memory element and a transistor whose off-state current or leakage current is extremely small and which is used for controlling the retention of charge in the memory element.

As described above, the power consumption generated in refresh in the memory device according to one embodiment of the present invention can be smaller than that in a general DRAM. Accordingly, the use of the memory device according to one embodiment of the present invention as the buffer memory device 203 makes it possible to reduce power consumption of the semiconductor device.

In addition, as described above, the speed of operation such as writing or reading of the memory device according to one embodiment of the present invention is higher than that of a general DRAM. Therefore, the use of the memory device according to one embodiment of the present invention as the buffer memory device 203 makes it possible to achieve high speed driving of the semiconductor device.

In addition, as described above, the number of semiconductor elements per memory cell of the memory device according to one embodiment of the present invention can be smaller than that of a general SRAM. Therefore, the use of the memory device according to one embodiment of the present invention as the buffer memory device 203 makes it possible to achieve high integration of the semiconductor device.

Note that when the memory device is used as a buffer memory device in one embodiment of the present invention, among a plurality of memory cells, a memory cell corresponding to a valid bit has a shorter data retention time than a memory cell corresponding to a data field. With this structure, valid data stored in the valid bit can be invalidated before the reliability of cache data stored in the data field becomes low. Accordingly, a state where the valid data is valid even when the cache data stored in the data field is invalid can be prevented.

In order to shorten the data retention time of the memory cell corresponding to the valid bit, at least one of the following two structures is employed. A first structure is the one in which the amount of charge retained in a memory element is reduced. A second structure is the one in which the potential of a data line at which a digital value is switched at data writing, that is, a threshold potential is increased.

Note that in the case where the transistor 103 functioning as a switching element has extremely small off-state current, charge-retention characteristics of the memory element 102 are increased. However, a cell array might include a memory cell 101 having impaired charge-retention characteristics due to variation in the characteristics of the transistor 103. In this case, it is possible that the memory device has an error check and correct (ECC) function or the like to correct data of a defective bit. However, the memory device having the ECC function is not preferable as the buffer memory device because increase in the area of a circuit, reduction in the reading speed, and the like occur. In one embodiment of the present invention, the data retention time of the memory cell corresponding to the valid bit is made shorter than that of another memory cell, whereby the reliability of data can be increased even without loading the ECC function.

Note that when the valid data indicates invalidation, a cache miss occurs in the semiconductor device at the time of access to cache data of the cache line including the valid data. However, since data is copied from the main memory again at this time, correct data is stored in the buffer memory device. Further, in the case of an n-way set associative buffer memory device, it is effective to select a cache line whose valid data indicates invalidation as a candidate cache line to be rewritten. This indicates that such a long time that data cannot be retained has passed after the data is coped to the cache line. Therefore, an effect which is substantially equal to that in the case of using a least recently used (LRU) mode in which oldest data is rewritten can be obtained.

A specific structure of the memory device according to one embodiment of the present invention for the purpose of achieving the above structure is described below.

<<Structure 1 of Memory Device>>

Figure 5:
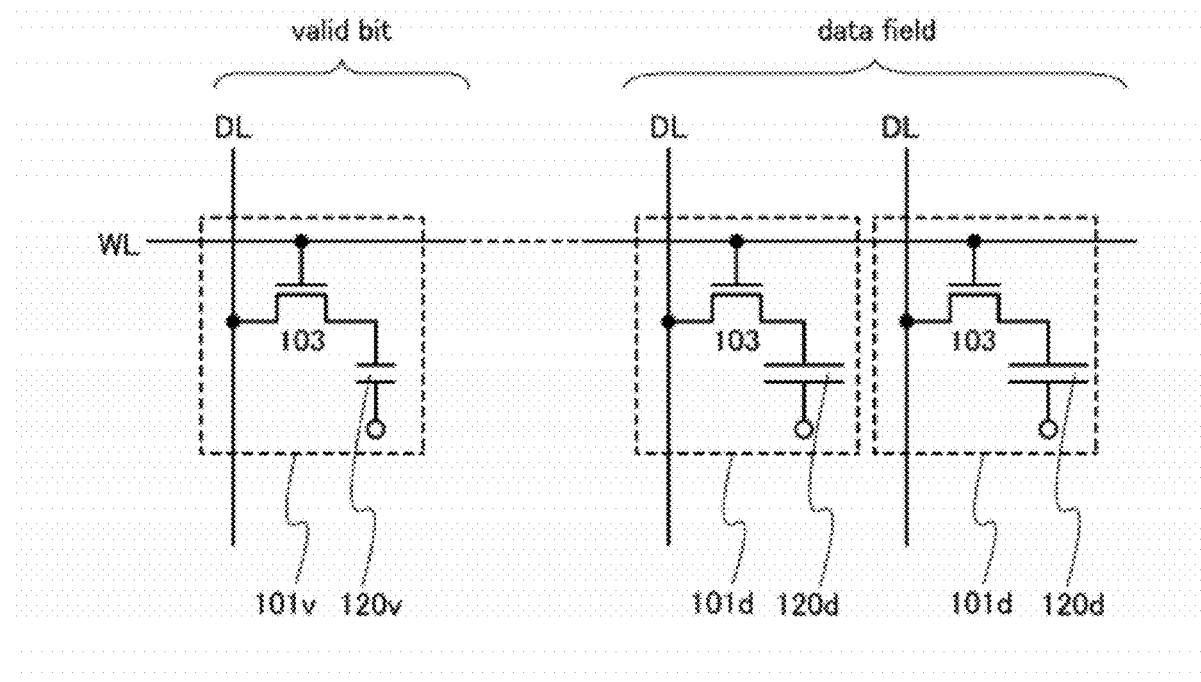
FIG. 5 illustrates the structure of a cell array.

FIG. 5 illustrates an example of a cell array of the memory device according to one embodiment of the present invention. Although FIG. 5 illustrates the example of the cell array which includes memory cells arranged in one row and a plurality of columns, the number and the arrangement of the memory cells included in the cell array is not limited to the structure of FIG. 5. In addition, although FIG. 5 illustrates the example using the memory cells each having the structure illustrated in FIG. 3A, any of the structures of the memory cells illustrated in FIGS. 3A to 3C and FIGS. 4A and 4B can be used.

In FIG. 5, a memory cell 101$v$ corresponding to a valid bit and memory cells 101$d$ corresponding to a data field are connected to one word line WL. A capacitor 120$v$ included in the memory cell 101$v$ has a smaller capacitance value than capacitors 120$d$ included in the memory cells 101$d$. With the above structure, the data retention time of the memory cell 101$v$ corresponding to the valid bit is shorter than that of the memory cells 101$d$ corresponding to the data field.

The memory device illustrated in FIG. 5 is an example in which the capacitor is used as a memory element. However, the above structure can be applied even when a transistor is used as a memory element. Specifically, the following structure is employed: the capacitance value of a gate capacitance formed between a gate electrode and an active layer of a transistor functioning as a memory element in the memory cell 101$v$ corresponding to the valid bit is smaller than those of transistors functioning as memory elements in the memory cells 101$d$ corresponding to the data field. Note that the capacitance value of the gate capacitance of the transistor can be increased by increasing the area of a region where the gate electrode and the active layer overlap with each other.

<<Structure 2 of Memory Device>>

Figure 6:
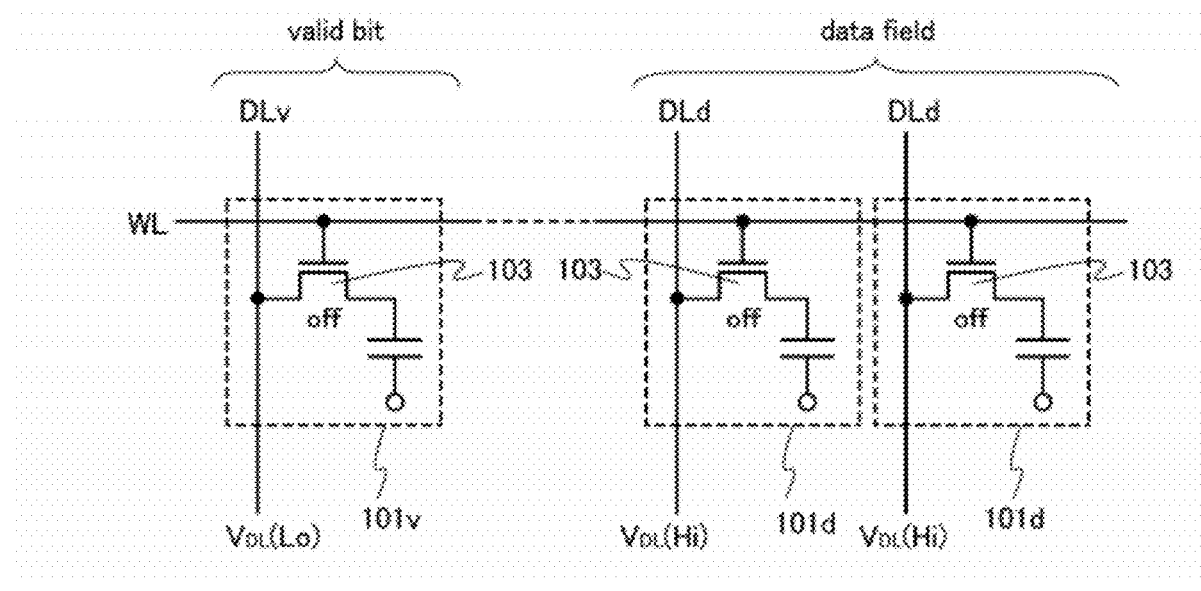
FIG. 6 illustrates the structure of a cell array.

FIG. 6 illustrates an example of a cell array of the memory device according to one embodiment of the present invention. Although FIG. 6 illustrates the example of the cell array which includes memory cells arranged in one row and a plurality of columns, the number and the arrangement of the memory cells included in the cell array is not limited to the structure of FIG. 6. In addition, although FIG. 6 illustrates the example using the memory cells each having the structure illustrated in FIG. 3A, any of the structures of the memory cells illustrated in FIGS. 3A to 3C and FIGS. 4A and 4B can be used.

In FIG. 6, the memory cell 101v corresponding to the valid bit and the memory cells 101d corresponding to the data field are connected to one word line WL. In addition, a data line DLv corresponding to the valid bit is connected to the memory cell 101v, and data lines DLd corresponding to the data field are connected the respective memory cells 101d.

In one embodiment of the present invention, when the transistor 103 included in the memory cell 101v and the transistors 103 included in the memory cells 101d are off at the time of data retention, a potential $V_{DL}$(Lo) of the data line DLv is lower than a potential $V_{DL}$(Hi) of each of the data lines DLd. With the above structure, the leakage current of the transistor 103 of the memory cell 101v corresponding to the valid bit is larger than those of the transistors 103 of the memory cells 101d corresponding to the data field, and thus the data retention time of the memory cell 101v corresponding to the valid bit becomes shorter than that of the transistors 103 of the memory cells 101d corresponding to the data field.

Note that in the case where a plurality of data lines is connected to one memory cell, when data writing is performed, the above structure may be applied to a data line to which a potential of a signal including data is applied, that is, a first data line DLa.

<<Structure 3 of Memory Device>>

Figure 7:
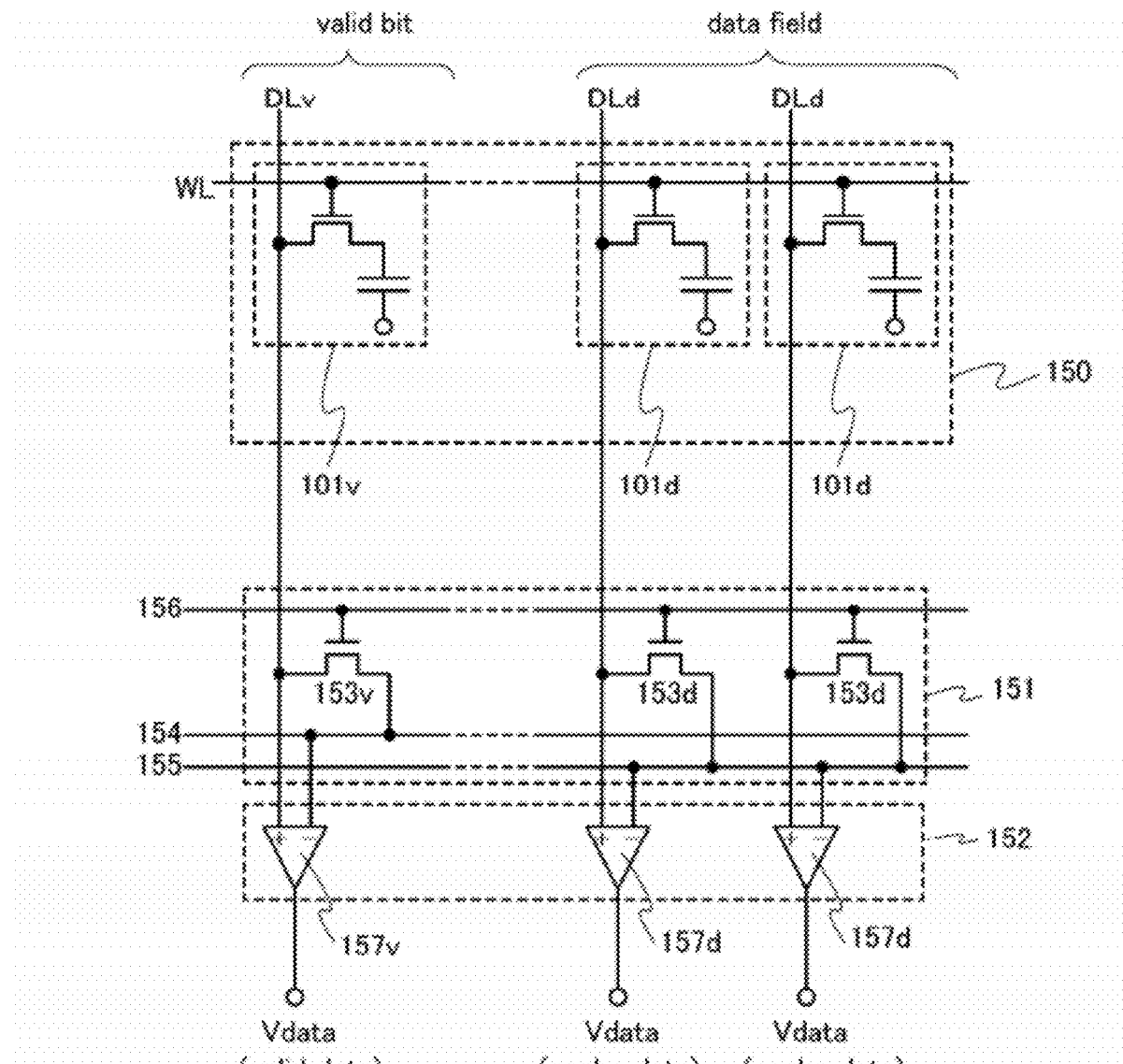
FIG. 7 illustrates the structure of a cell array, a precharge circuit, and a reading circuit.

FIG. 7 illustrates examples of a cell array 150, a precharge circuit 151 which resets the potential of a data line, and a reading circuit 152 which converts the potential of the data line into a digital value in the memory device according to one embodiment of the present invention. Although FIG. 7 illustrates the example of the cell array 150 which includes memory cells arranged in one row and a plurality of columns, the number and the arrangement of the memory cells included in the cell array is not limited to the structure of FIG. 7. In addition, although FIG. 7 illustrates the example using the memory cells each having the structure illustrated in FIG. 3A, any of the structures of the memory cells illustrated in FIGS. 3A to 3C and FIGS. 4A and 4B can be used.

In FIG. 7, the memory cell 101v corresponding to the valid bit and the memory cells 101d corresponding to the data field are connected to one word line WL. In addition, the data line DLv corresponding to the valid bit is connected to the memory cell 101v, and the data lines DLd corresponding to the data field are connected the respective memory cells 101d.

The precharge circuit 151 includes a switching element 153v which controls supply of a first precharge potential Vp(Hi) to the data line DLv and switching elements 153d which control supply of second precharge potentials Vp(Lo) to the data lines DLd. Note that in FIG. 7, the first precharge potential Vp(Hi) is supplied to the precharge circuit 151 via a wiring 154, and the second precharge potentials Vp(Lo) are supplied to the precharge circuit 151 via a wiring 155. In addition, switching of each of the switching element 153v and the switching elements 153d is controlled in accordance with a potential applied to a wiring 156.

The reading circuit 152 includes a differential amplifier circuit 157v corresponding to the valid bit and differential amplifier circuits 157d corresponding to the data field. Specifically, the potential of the data line DLv is applied to a non-inverting input terminal (+) included in the differential amplifier circuit 157v, and the first precharge potential Vp(Hi) is applied to an inverting input terminal (−) included in the differential amplifier circuit 157v. Further, the potentials of the data lines DLd are applied to non-inverting input terminals (+) included in the differential amplifier circuits 157d, and the second precharge potentials Vp(Lo) are applied to inverting input terminals (−) included in the differential amplifier circuits 157d. A potential Vdata output from the differential amplifier circuit 157v includes valid data read out from the memory cell 101v and potentials Vdata output from the differential amplifier circuits 157d include cache data read out from the memory cells 101d.

According to one embodiment of the present invention, before the data stored in the memory cell 101v and the data stored in the memory cells 101d are read out, the first precharge potential Vp(Hi) is applied to the data line DLv and the second precharge potentials Vp(Lo) are applied to the data lines DLd. Then, the first precharge potential Vp(Hi) is set to a value higher than the second precharge potentials Vp(Lo).

Note that in the case where data of a digital value indicating a large amount of charge is written in the memory cell, charge of the memory element leaks as time passes. However, as the precharge potential becomes higher, the potential of the data line at the time of data reading tends to be lower than the precharge potential even when the amount of the charge which leaks is small. Therefore, when the digital value is determined in accordance with whether the potential of the data line is higher or is lower than the precharge potential, data of a digital value indicating a small amount of charge is read out more easily as the precharge potential becomes higher.

Specifically, in the case of FIG. 7, the potential Vdata output from the differential amplifier circuit 157v is more likely to be a low level than the potentials Vdata output from the differential amplifier circuits 157d even when elapsed retention time is short. Therefore, with the structure, the data retention time of the memory cell 101v corresponding to the valid bit becomes shorter than that of the memory cells 101d corresponding to the data field.

<<Structure 4 of Memory Device>>

Figure 8:
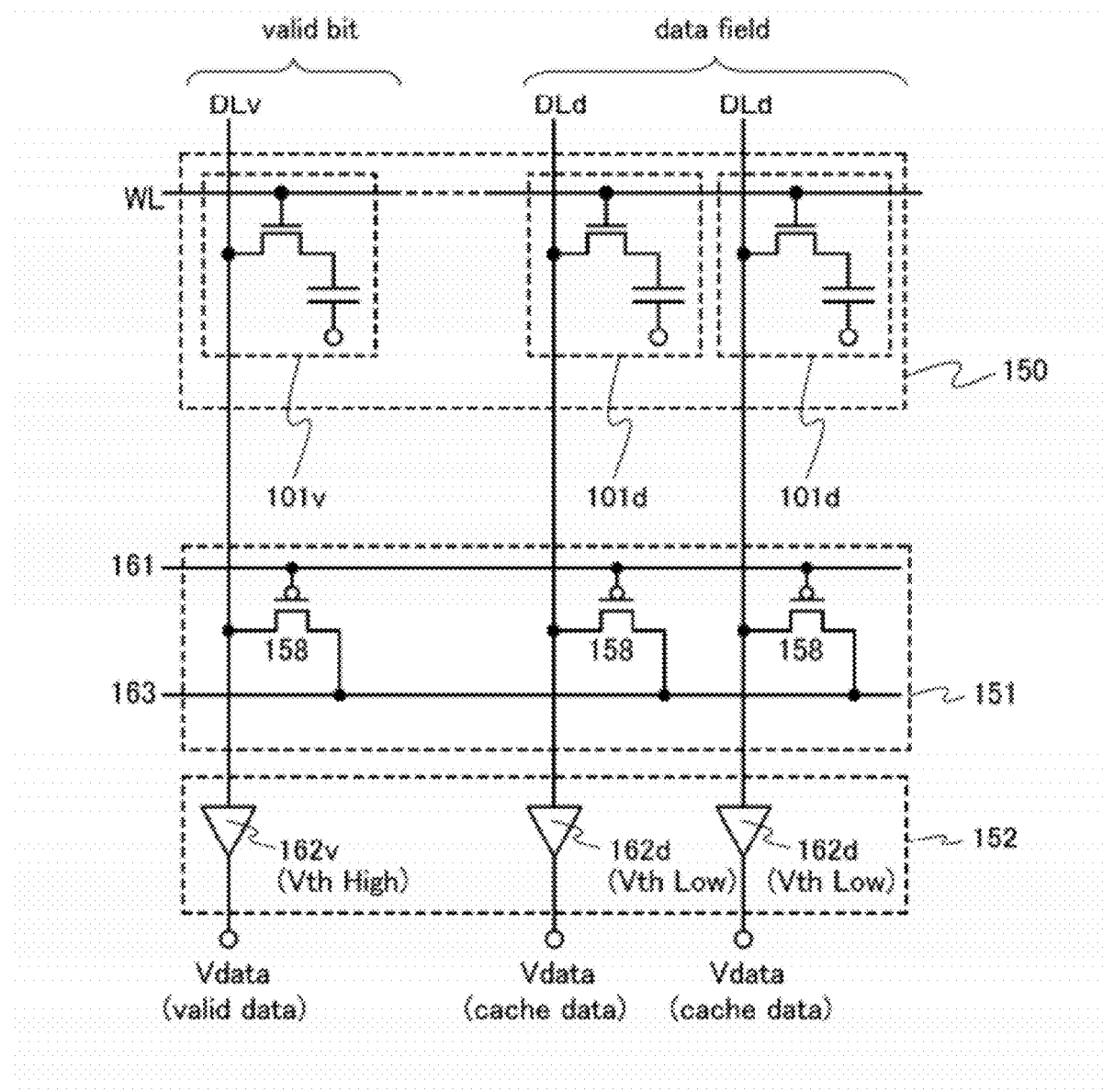
FIG. 8 illustrates the structure of a cell array, a precharge circuit, and a reading circuit.

FIG. 8 illustrates examples of the cell array 150, the precharge circuit 151 which resets the potential of a data line, and the reading circuit 152 which converts the potential of the data line into a digital value in the memory device according to one embodiment of the present invention. Although FIG. 8 illustrates the example of the cell array 150 which includes memory cells arranged in one row and a plurality of columns, the number and the arrangement of the memory cells included in the cell array is not limited to the structure of FIG. 8. In addition, although FIG. 8 illustrates the example using the memory cells each having the structure illustrated in FIG. 3A, any of the structures of the memory cells illustrated in FIGS. 3A to 3C and FIGS. 4A and 4B can be used.

In FIG. 8, the memory cell 101v corresponding to the valid bit and the memory cells 101d corresponding to the data field are connected to one word line WL. In addition, the data line DLv corresponding to the valid bit is connected to the memory cell 101v, and the data lines DLd corresponding to the data field are connected the respective memory cells 101d.

The precharge circuit 151 includes switching elements 158 which control supply of precharge potentials Vp to the data line DLv and the data lines DLd. Note that in FIG. 8, the precharge potentials Vp are supplied to the precharge circuit 151 via a wiring 163. In addition, switching of the switching elements 158 is controlled in accordance with a potential applied to a wiring 161. The precharge potentials Vp are applied to the data line DLv and the data lines DLd before data stored in the memory cell 101v and data stored in the memory cells 101d are read out.

The reading circuit 152 includes a buffer 162v corresponding to the valid bit and buffers 162d corresponding to the data field. Specifically, the potential of the data line DLv is applied to an input terminal of the buffer 162v. The potentials of the data lines DLd are applied to input terminals of the buffers 162d. The potential Vdata output from the buffer 162v includes the valid data read out from the memory cell 101v and the potentials Vdata output from the buffers 162d include the cache data read out from the memory cells 101d.

Note that the buffer 162v and the buffers 162d each include an even number of logic elements. Instead of the buffer 162v and the buffers 162d, inverters each including an odd number of logic elements may be used in one embodiment of the present invention.

In this embodiment of the present invention, an input potential at which the polarity of the output potential is switched (threshold potential) of the buffer 162v is higher than those of the buffers 162d. In the case of the structure, data of a digital value indicating a small amount of charge is read out more easily from the buffer 162v whose threshold potential is high.

Specifically, in the case of FIG. 8, the potential Vdata output from the buffer 162v is more likely to be a low level than the potentials Vdata output from the buffers 162d even when elapsed retention time is short. Therefore, with the structure, the data retention time of the memory cell 101v corresponding to the valid bit becomes shorter than those of the memory cells 101d corresponding to the data field.

<<Structure 5 of Memory Device>>

Figure 9:
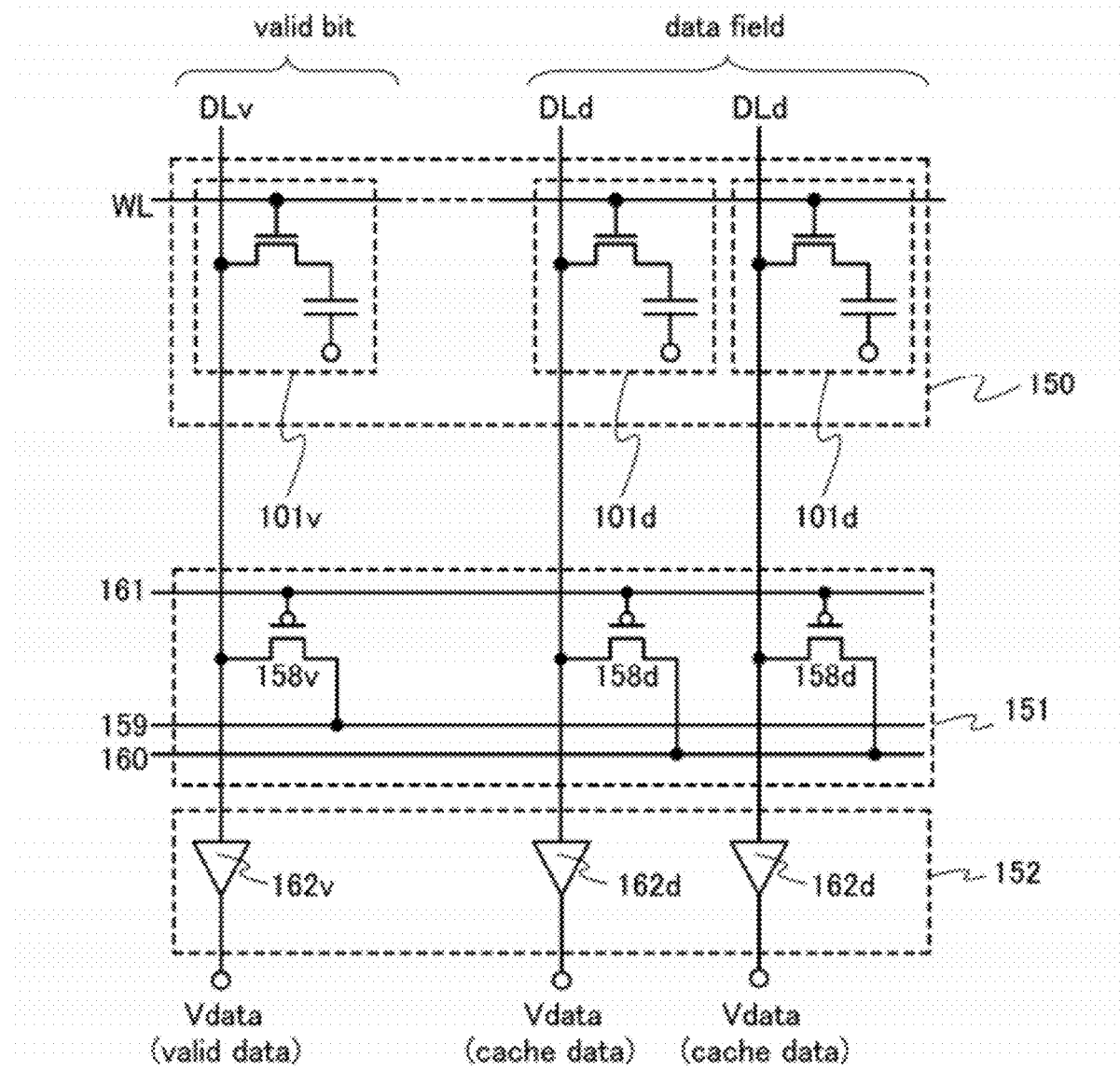
FIG. 9 illustrates the structure of a cell array, a precharge circuit, and a reading circuit.

FIG. 9 illustrates examples of the cell array 150, the precharge circuit 151 which resets the potential of a data line, and the reading circuit 152 which converts the potential of the data line into a digital value in the memory device according to one embodiment of the present invention. Although FIG. 9 illustrates the example of the cell array 150 which includes memory cells arranged in one row and a plurality of columns, the number and the arrangement of the memory cells included in the cell array is not limited to the structure of FIG. 9. In addition, although FIG. 9 illustrates the example using the memory cells each having the structure illustrated in FIG. 3A, any of the structures of the memory cells illustrated in FIGS. 3A to 3C and FIGS. 4A and 4B can be used.

In FIG. 9, the memory cell 101y corresponding to the valid bit and the memory cells 101d corresponding to the data field are connected to one word line WL. In addition, the data line DLv corresponding to the valid bit is connected to the memory cell 101v, and the data lines DLd corresponding to the data field are connected the respective memory cells 101d.

The precharge circuit 151 includes a switching element 158v which controls supply of a first precharge potential Vp(Lo) to the data line DLv and switching elements 158d which control supply of second precharge potentials Vp(Hi) to the data lines DLd. Note that in FIG. 9, the first precharge potential Vp(Lo) is supplied to the precharge circuit 151 via a wiring 159, and the second precharge potentials Vp(Hi) are supplied to the precharge circuit 151 via a wiring 160. In addition, switching of each of the switching element 158v and the switching elements 158d is controlled in accordance with a potential applied to the wiring 161.

The reading circuit 152 includes the buffer 162v corresponding to the valid bit and the buffers 162d corresponding to the data field. Specifically, the potential of the data line DLv is applied to the input terminal of the buffer 162v. The potentials of the data lines DLd are applied to the input terminals of the buffers 162d. The potential Vdata output from the buffer 162v includes the valid data read out from the memory cell 101y and the potentials Vdata output from the buffers 162d include the cache data read out from the memory cells 101d.

Note that the buffer 162v and the buffers 162d each include an even number of logic elements. Instead of the buffer 162v and the buffers 162d, inverters each including an odd number of logic elements may be used in one embodiment of the present invention.

According to one embodiment of the present invention, before the data stored in the memory cell 101v and the data stored in the memory cells 101d are read out, the first precharge potential Vp(Lo) is applied to the data line DLv and the second precharge potentials Vp(Hi) are applied to the data lines DLd. Then, the first precharge potential Vp(Lo) is set to a value lower than the second precharge potentials Vp(Hi).

Note that in the case where a digital value indicating a large amount of charge is written in the memory cell, charge of the memory element leaks as time passes. However, as the potential of precharge becomes lower, the potential of the data line at the time of data reading tends to be lower than the threshold potential of the buffer included in the reading circuit 152 even when the amount of the charge which leaks is small. Therefore, as the potential of precharge becomes lower, data of a digital value indicating a small amount of charge is more likely to be read out.

Specifically, in the case of FIG. 9, the potential Vdata output from the buffer 162v is more likely to be a low level than the potentials Vdata output from the buffers 162d even when elapsed retention time is short. Therefore, with the structure, the data retention time of the memory cell 101v corresponding to the valid bit becomes shorter than those of the memory cells 101d corresponding to the data field.

<<Structure 6 of Memory Device>>

Figure 10:
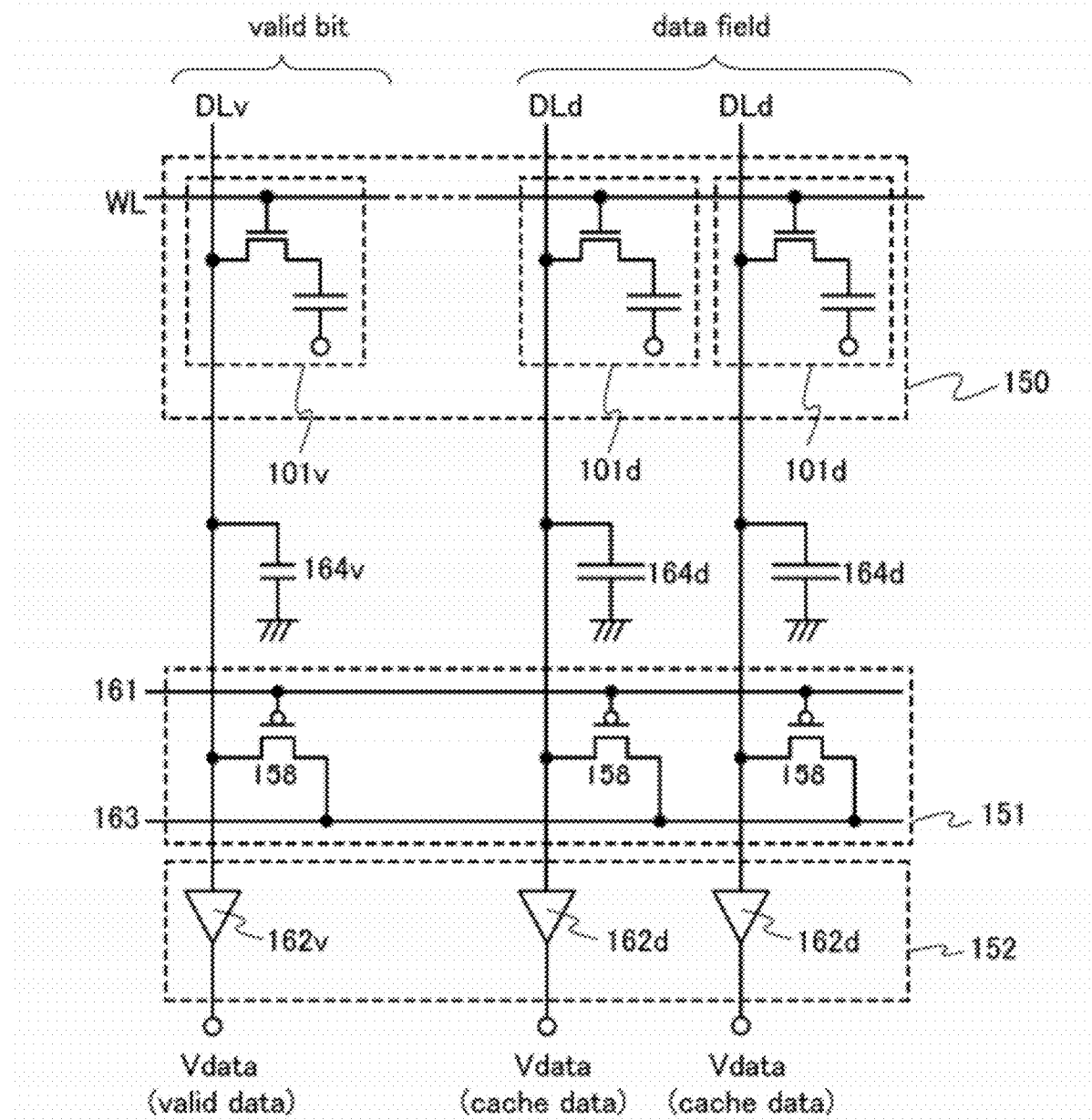
FIG. 10 illustrates the structure of a cell array, a capacitor, a precharge circuit, and a reading circuit.

FIG. 10 illustrates examples of the cell array 150, the precharge circuit 151 which resets the potential of a data line, and the reading circuit 152 which converts the potential of the data line into a digital value in the memory device according to one embodiment of the present invention. Although FIG. 10 illustrates the example of the cell array 150 which includes memory cells arranged in one row and a plurality of columns, the number and the arrangement of the memory cells included in the cell array is not limited to the structure of FIG. 10. In addition, although FIG. 10 illustrates the example using the memory cells each having the structure illustrated in FIG. 3A, any of the structures of the memory cells illustrated in FIGS. 3A to 3C and FIGS. 4A and 4B can be used.

In FIG. 10, the memory cell 101v corresponding to the valid bit and the memory cells 101d corresponding to the data field are connected to one word line WL. In addition, the data line DLv corresponding to the valid bit is connected to the memory cell 101v, and the data lines DLd corresponding to the data field are connected the respective memory cells 101d. Capacitors are connected to the respective data lines. Specifically, in FIG. 10, a capacitor 164v is connected to the data line DLv corresponding to the valid bit and capacitors 164d are connected to the data lines DLd corresponding to the data field.

The precharge circuit 151 includes switching elements 158 which control supply of precharge potentials Vp to the data line DLv and the data lines DLd. Note that in FIG. 10, the precharge potentials Vp are supplied to the precharge circuit 151 via the wiring 163. In addition, switching of the switching elements 158 is controlled in accordance with a potential applied to the wiring 161. The precharge potentials Vp are applied to the data line DLv and the data lines DLd before data stored in the memory cell 101v and data stored in the memory cells 101d are read out.

The reading circuit 152 includes the buffer 162v corresponding to the valid bit and the buffers 162d corresponding to the data field. Specifically, the potential of the data line DLv is applied to the input terminal of the buffer 162v. The potentials of the data lines DLd are applied to the input terminals of the buffers 162d. The potential Vdata output from the buffer 162v includes the valid data read out from the memory cell 101v and the potentials Vdata output from the buffers 162d include the cache data read out from the memory cells 101d.

Note that the buffer 162v and the buffers 162d each include an even number of logic elements. Instead of the buffer 162v and the buffers 162d, inverters each including an odd number of logic elements may be used in one embodiment of the present invention.

In this embodiment, the capacitance value of the capacitor 164v connected to the data line DLv is smaller than those of the capacitors 164d connected to the data lines DLd. Note that in the case where a digital value indicating a large amount of charge is written in the memory cell, charge of the memory element in the memory cell leaks as time passes. However, as the capacitance value becomes smaller, the potential of the data line at the time of data reading tends to decrease faster to be lower than the threshold potential of the buffer even when the amount of the charge which leaks is small. Therefore, as the capacitance value of the capacitor connected to the data line becomes smaller, data of a digital value indicating a small amount of charge is read out more easily. Accordingly, with the structure, the data retention time of the memory cell corresponding to the valid bit becomes shorter than those of the memory cells corresponding to the data field.

<<Structure 7 of Memory Device>>

The buffer memory device according to one embodiment of the present invention outputs respective potentials of data lines through logic circuits including one or a plurality of logic elements. A channel width of a transistor which is used at time of data reading in the memory cell corresponding to the valid bit is larger than that in the memory cell corresponding to the data field.

As in the case of the memory cell 101 illustrated in FIG. 3A, a channel width of the transistor 103 is adjusted as described above when data writing and data reading are both performed using the transistor 103. In addition, in the cases of the memory cells 101 illustrated in FIGS. 3B and 3C and FIGS. 4A and 4B, a channel width of a transistor used at the time of data reading (specifically, the transistor 121 in FIG. 3B, the transistor 123 in FIG. 3C, the transistor 125 in FIG. 4A, and the transistors 126 and 127 in FIG. 4B) may be adjusted as described above.

Note that in the case where a digital value indicating a large amount of charge is written in the memory cell, charge of the memory element leaks as time passes. However, as the channel width of the transistor becomes larger, the potential of the data line at the time of data reading tends to decrease faster to be lower than the threshold potential of the logic circuit even when the amount of the charge which leaks is small. Therefore, as the channel width of the transistor becomes larger, data of a digital value indicating a small amount of charge is read out more easily. Accordingly, with the structure, the data retention time of the memory cell corresponding to the valid bit becomes shorter than that of the memory cell corresponding to the data field.

Embodiment 2

In this embodiment, examples of the structure of a memory device including a plurality of memory cells and a method for driving the memory device are described.

Figure 11:
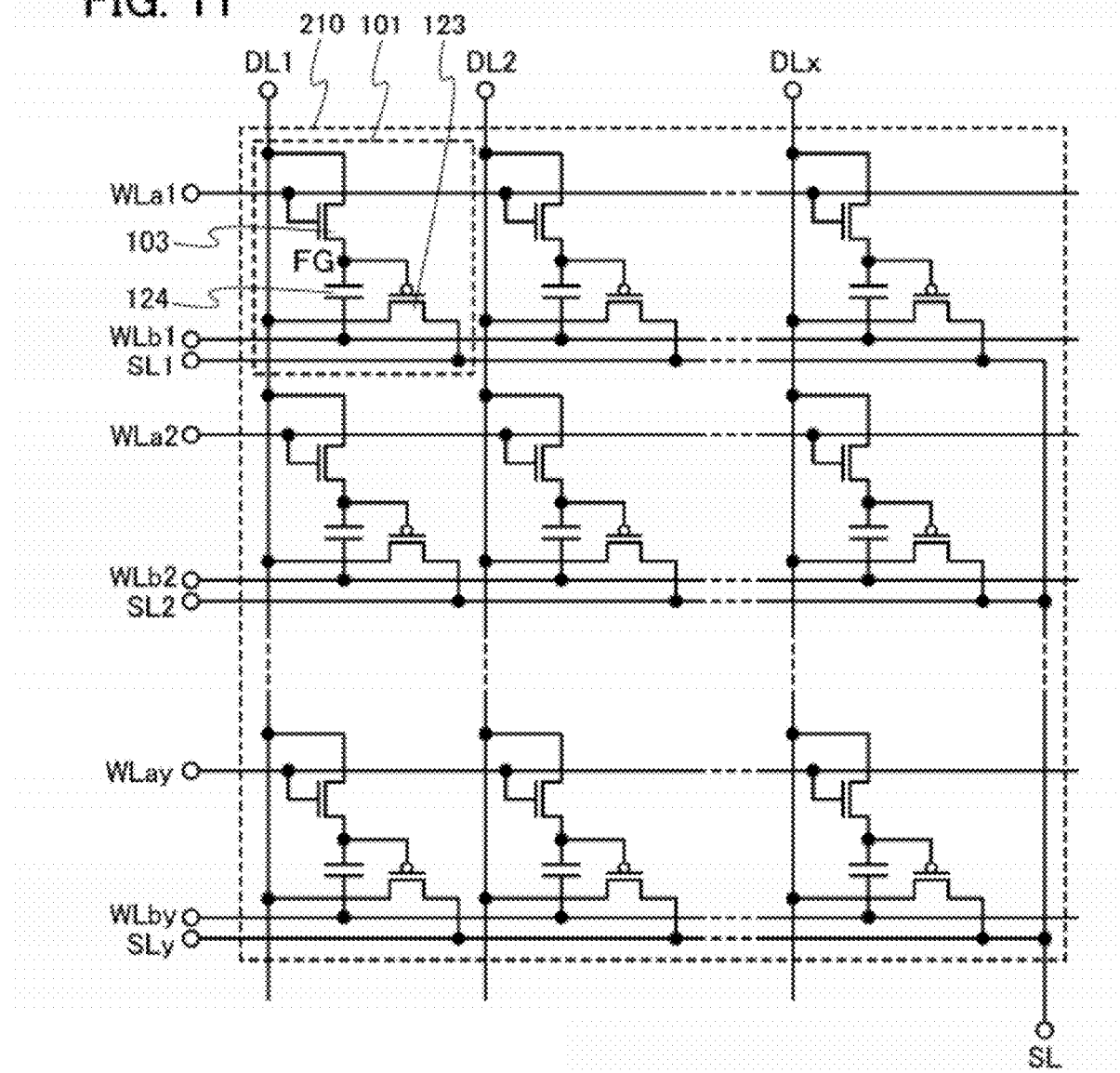
FIG. 11 is a circuit diagram of a cell array.

FIG. 11 is an example of a circuit diagram of a cell array 210 including the plurality of memory cells 101 one of which is illustrated in FIG. 3C. Unlike FIG. 3C, FIG. 11 illustrates an example of a circuit diagram in which a transistor 123 is a p-channel transistor.

In the cell array 210 illustrated in FIG. 11, a variety of wirings such as a plurality of first word lines WLa, a plurality of data lines DL, a plurality of second word lines WLb, and a plurality of source lines SL are provided, and a signal or a potential from a driver circuit is supplied to each of the memory cells 101 via the wirings. The source line SL is connected to a second terminal of the transistor 123.

Note that the number of the wirings can be determined by the number of the memory cells 101 and arrangement of the memory cells 101. Specifically, in the case of the cell array 210 illustrated in FIG. 11, the memory cells 101 are arranged in a matrix of y rows by x columns, and first word lines WLa1 to WLay, second word lines WLb1 to WLby, source lines SL1 to SLy, and data lines DL1 to DLx are provided in the cell array 210.

Figure 12:
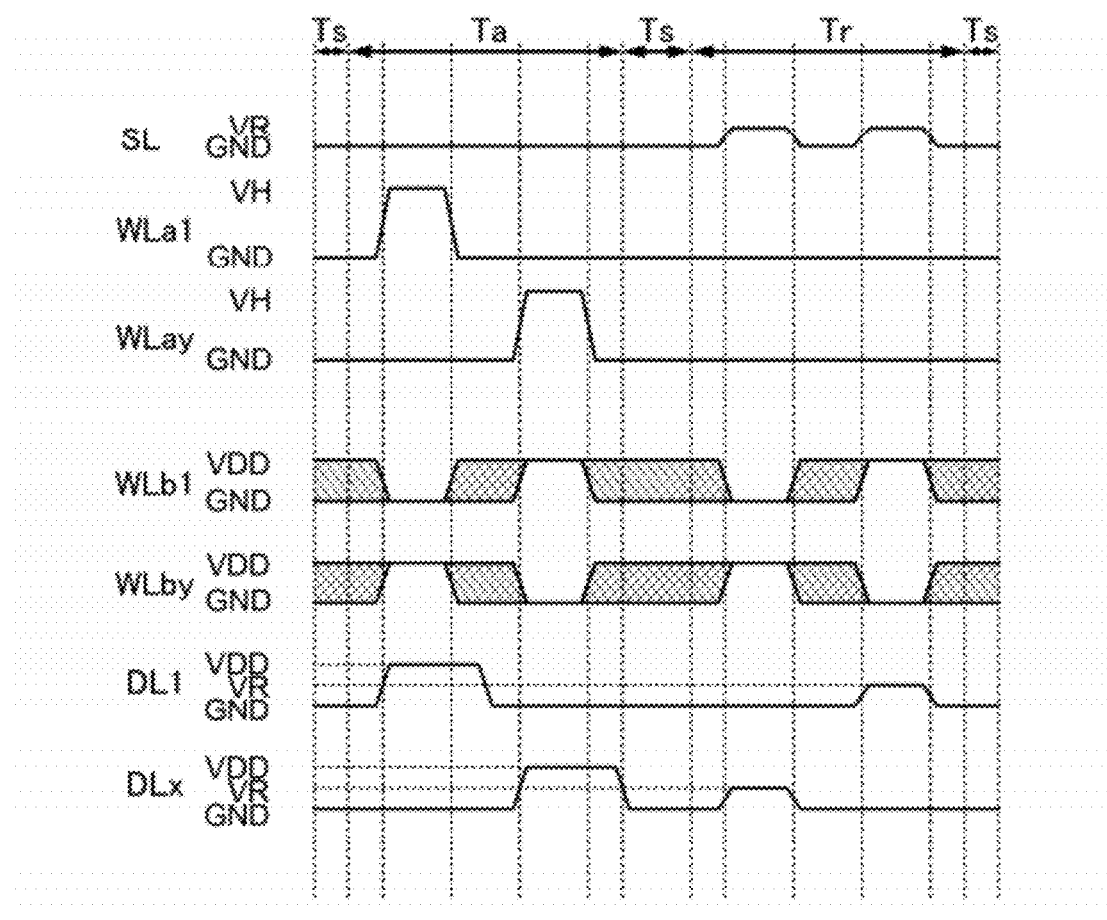
FIG. 12 is a timing chart showing the operation of a cell array.

Next, the operation of the cell array 210 illustrated in FIG. 11 is described with reference to a timing chart in FIG. 12. Note that FIG. 12 illustrates the case where writing, retention, and reading of data are performed on the memory cell 101 in a first row and a first column, the memory cell 101 in the first row and an x-th column, the memory cell 101 in a y-th row and the first column, and the memory cell 101 in the y-th row and the x-th column. FIG. 12 illustrates the case where the transistor 123 is a p-channel transistor.

Note that the shaded areas in the timing chart in FIG. 12 indicate periods during which a potential may be either a high-level potential or a low-level potential.

First, the operation of the cell array 210 in a data writing period Ta is described.

Data is written row by row. In FIG. 12, data is written to the memory cell 101 in the first row and the first column and the memory cell 101 in the first row and the x-th column, and then, data is written to the memory cell 101 in the y-th row and the first column and the memory cell 101 in the y-th row and the x-th column.

First, the first word line WLa1 and the second word line WLb1 in the memory cells 101 in the first row to which data is written are selected. Specifically, in FIG. 12, the high-level potential VH is applied to the first word line WLa1, and a ground potential GND is applied to the first word lines WLa2 to WLay. Thus, only transistors 103 whose gate electrodes are connected to the first word line WLa1 are selectively turned on. Further, the ground potential GND is applied to the second word line WLb1, and the high-level potential VDD is applied to the other second word lines WLb2 to WLby.

In a period during which the first word line WLa1 and the second word line WLb1 are selected, potentials of signals including data are applied to the data lines DL1 and DLx. Needless to say, the levels of the potentials supplied to the data lines DL1 and DLx are varied depending on the content of the data. FIG. 12 illustrates the case where the high-level potential VDD is applied to the data line DL1 and the ground potential GND is applied to the data line DLx. The potentials applied to the data lines DL1 and DLx are applied to one electrode of a capacitor 124 and a gate electrode of the transistor 123 via the transistors 103 that are on. When a node where the one electrode of the capacitor 124 and the gate electrode of the transistor 123 are connected to each other is referred to as a node FG, the amount of charge accumulated in the node FG is controlled in accordance with the potentials of the signals, so that data is written to the memory cell 101 in the first row and the first column and the memory cell 101 in the first row and the x-th column.

Then, the ground potential GND is applied to the first word line WLa1, and the transistors 103 whose gate electrodes are connected to the first word line WLa1 are turned off.

Then, the first word line WLay and the second word line WLby in the memory cells 101 in the y-th row to which data is written are selected. Specifically, in FIG. 12, the high-level potential VH is applied to the first word line WLay, and the ground potential GND is applied to the first word lines WLa1 to WLa(y−1). Thus, only the transistors 103 whose gate electrodes are connected to the first word line WLay are selectively turned on. The ground potential GND is applied to the second line WLby, and the high-level potential VDD is applied to the second word lines WLb1 to WLb(y−1).

In a period during which the first word line WLay and the second line WLby are selected, potentials of signals including data are applied to the data lines DL1 and DLx. FIG. 12 illustrates the case where the ground potential GND is applied to the data line DL1 and the high-level potential VDD is applied to the data line DLx. The potentials applied to the data lines DL1 and DLx are applied to one electrode of the capacitor 124 and the gate electrode of the transistor 123 via the transistors 103 that are on. The amount of charge accumulated in the node FG is controlled in accordance with the potentials of the signals, so that data is written to the memory cell 101 in the y-th row and the first column and the memory cell 101 in the y-th row and the x-th column.

Note that in the writing period Ta, the ground potential GND is applied to all the source lines SL. With the above structure, in the case where the ground potential GND is applied to the node FG, generation of current in the data line DL and the source line SL can be suppressed.

In order to prevent writing of erroneous data to the memory cell 101, it is preferable to terminate a period during which the potential of the signal including data is input to the data line DL after a selection period of the first word line WLa and the second word line WLb is terminated.

Then, the operation of the cell array 210 in a data retention period Ts is described.

In the retention period Ts, a potential at which the transistor 103 is turned off, specifically, the ground potential GND is applied to all the first word lines WLa. In one embodiment of the present invention, the transistor 103 has extremely low off-state current as described above. When the off-state current of the transistor 103 is low, the charge accumulated in the node FG is less likely to leak; thus, data can be retained for a long time.

Then, the operation of the cell array 210 in a data reading period Tr is described.

First, the second word line WLb1 in the memory cells 101 in the first row on which reading is performed is selected. Specifically, in FIG. 12, the ground potential GND is applied to the second word line WLb1, and the high-level potential VDD is applied to the second word lines WLb2 to WLby. In the reading period Tr, all the first word lines WLa are not selected by application of the ground potential GND. In a period during which the second word line WLb 1 is selected, a high-level potential VR is applied to all the source lines SL. Note that the potential VR is equal to the potential VDD, or lower than the potential VDD and higher than the ground potential GND.

Resistance between the source electrode and the drain electrode of the transistor 123 depends on the amount of charge accumulated in the node FG. Thus, a potential based on the amount of charge accumulated in the node FG is applied to the data lines DL1 and DLx. Then, by reading a difference in the amount of charge from the potential, data can be read from the memory cell 101 in the first row and the first column and the memory cell 101 in the first row and the x-th column.

Then, the second word line WLby in the memory cells 101 in the y-th row from which data is read is selected. Specifically, in FIG. 12, the ground potential GND is applied to the second word line WLby, and the high-level potential VDD is applied to the second word lines WLb1 to WLb(y−1). As described above, in the reading period Tr, all the first word lines WLa are not selected by application of the ground potential GND. In a period during which the second word line WLby is selected, the high-level potential VR is applied to all the source lines SL.

Resistance between the source electrode and the drain electrode of the transistor 123 depends on the amount of charge accumulated in the node FG. Thus, a potential based on the amount of charge accumulated in the node FG is applied to the data lines DL1 and DLx. Then, by reading a difference in the amount of charge from the potential, data can be read from the memory cell 101 in the y-th row and the first column and the memory cell 101 in the y-th row and the x-th column.

Note that a reading circuit is connected to an end of each data line DL, and a signal output from the reading circuit includes data which is actually read from the cell array 210.

Then, different examples of the structure of a memory device including a plurality of memory cells and a method for driving the memory device are described.

Figure 13:
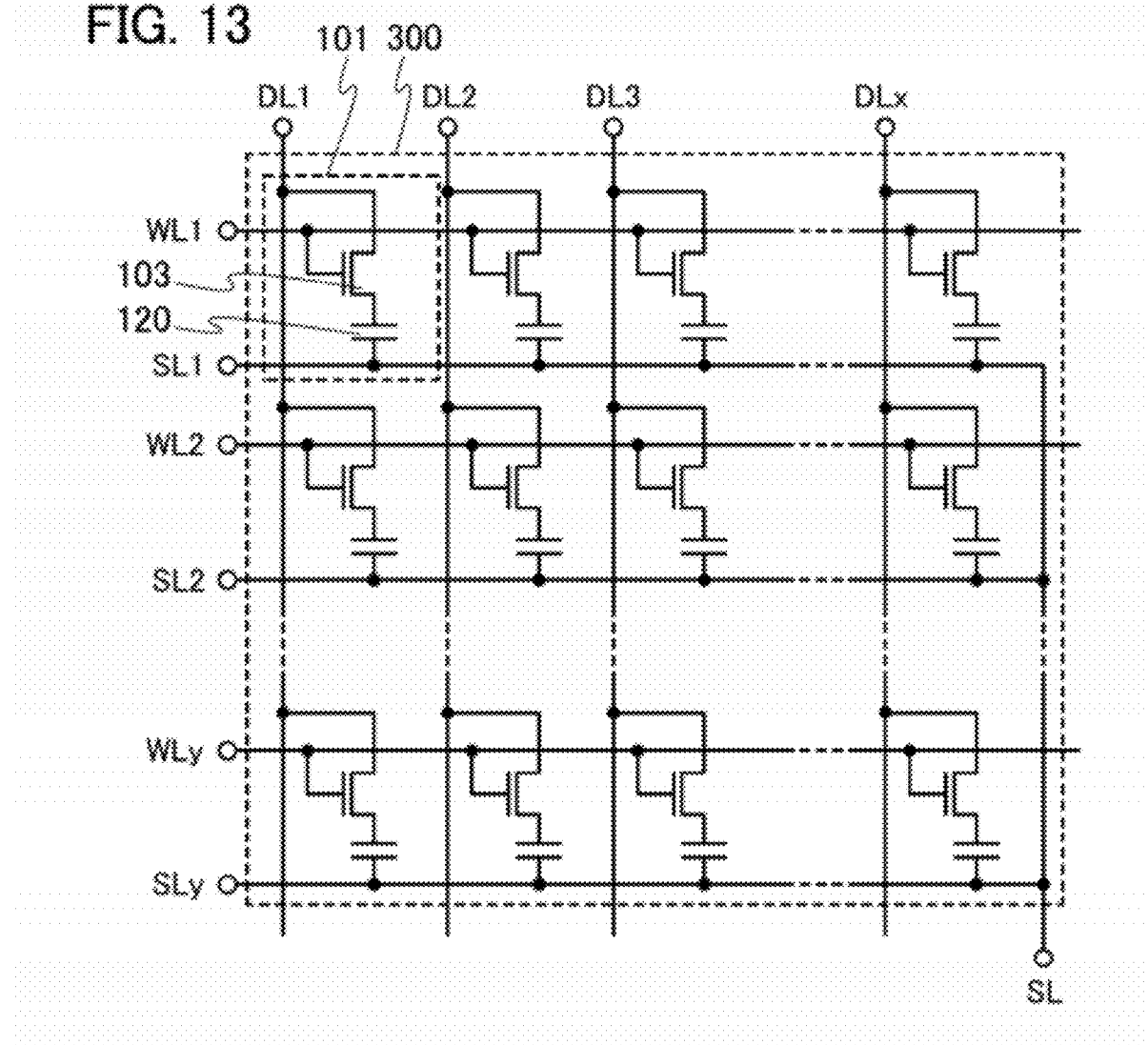
FIG. 13 is a circuit diagram of a cell array.

FIG. 13 is an example of a circuit diagram of a cell array 300 including the plurality of memory cells 101 one of which is illustrated in FIG. 3A.

In the cell array 300 illustrated in FIG. 13, a variety of wirings such as a plurality of word lines WL, a plurality of data lines DL, and a plurality of source lines SL are provided, and a signal or a potential from a driver circuit is supplied to each memory cell 101 via the wirings. The source line SL is connected to the other electrode of a capacitor 120 and supplied with the ground potential.

Note that the number of the wirings can be determined by the number of the memory cells 101 and arrangement of the memory cells 101. Specifically, in the cell array 300 illustrated in FIG. 13, memory cells are arranged in a matrix of y rows by x columns, and the word lines WL1 to WLy, the data lines DL1 to DLx, the source lines SL1 to SLy are provided in the cell array 300.

Next, the operation of the cell array 300 illustrated in FIG. 13 is described. Note that a fixed potential such as a ground potential is applied to the source lines SL1 to SLy.

First, the operation of the cell array 300 in a data writing period is described. In the writing period, when a signal with a pulse is input to the word line WL1, the potential of the pulse, specifically, a high-level potential, is applied to gate electrodes of the transistors 103 connected to the word line WL1. Thus, all the transistors 103 whose gate electrodes are connected to the word line WL1 are turned on.

Then, signals including data are input to the data lines DL1 to DLx. Needless to say, the levels of the potentials of the signals input to the data lines DL1 to DLx are varied depending on the content of data. The potentials input to the data lines DL1 to DLx are each applied, via the transistor 103 which is on, to one of electrodes of the capacitor 120. The amount of accumulated in the capacitor 120 is controlled in accordance with the potential of the signal, so that data is written into the capacitor 120.

When the input of the signal with the pulse to the writing word line WL1 is finished, all the transistors 103 whose gate electrodes are connected to the writing word line WL1 are turned off. The signal with pulse is input to the word lines WL2 to WLy in sequence, and the above operation is repeated in the memory cells 101 including the word lines WL2 to WLy.

Then, the operation of the cell array 300 in a data retention period is described. In the retention period, potentials with levels at which the transistor 103 is turned off, specifically, low-level potentials, are applied to all of the word lines WL1 to WLy. In one embodiment of the present invention, the off-state current of the transistor 103 is extremely small as described above. When the off-state current of the transistor 103 is small, the charge accumulated in the capacitor 120 is less likely to leak; thus, data can be retained for a long time.

Then, the operation of the cell array 300 in a data reading period is described. In the data reading period, a signal with pulse is sequentially input to the word lines WL1 to WLy in a manner similar to that in the data writing period. When the potential of the pulse, specifically, a high-level potential, is applied to the gate electrodes of the transistors 103 which are connected to the word line WL1, the transistors 103 connected to the word line WL1 are turned on.

When the transistors 103 are turned on, charge accumulated in the capacitors 120 is taken out via the data lines DL. By reading a difference in the amount of charge from the potential of the data line DL, data can be read.

Note that a reading circuit is connected to an end of each data line DL, and a signal output from the reading circuit includes data which is actually read from the memory portion.

Although in this embodiment, a driving method in which writing, retention, and reading of data are sequentially performed in the plurality of memory cells 101 is described, the present invention is not limited to this structure. Only a memory cell 101 with the specified address may perform the above operation.

Note that in the memory device according to one embodiment of the present invention, different data can be written so that data which has been written is overwritten. Thus, unlike a conventional flash memory, erasing of data which has been written is not needed at the time of rewriting data, which is one of advantages.

In the case of a general flash memory, a floating gate in which electrical charge is accumulated is covered with an insulating film and in an insulating state. Accordingly, a high voltage of approximately 20 V needs to be applied to a memory element in order that electric charge may be accumulated in the floating gate by the use of a tunnel effect. Further, it takes long time to perform data writing. However, in the memory device included in the semiconductor device according to one embodiment of the present invention, data can be written and read by a transistor including a highly-purified oxide semiconductor as an active layer. Accordingly, a voltage of several volts needed for operation of the memory device, so that power consumption can be remarkably reduced. Further, data writing can be performed at higher speed than that in the case of a flash memory.

Further, in a semiconductor device including a general flash memory, since voltage needed for operation (operating voltage) of the flash memory is high, voltage applied to the flash memory is usually raised with the use of a step-up circuit or the like. However, since the operation voltage of the memory device can be lowered in the semiconductor device according to one embodiment of the present invention, it is possible to reduce power consumption. Accordingly, a load of an external circuit used for operation of the memory device, such as a step-up dc-dc converter, in the semiconductor device can be decreased, so that the functions of the external circuit are expanded, and the higher performance of the signal processing circuit can be realized.

Further, in this embodiment, although the driving method when binary digital data is used is described, the memory device according to one embodiment of the present invention can also use multi-valued data that has three or more values. Note that in the case of multi-valued data that has three or more values, a difference between the amounts of charge becomes smaller as the number of values is increased to four, five, and six, for example. Thus, if a slight amount of off-state current exists, it is difficult to maintain the accuracy of data, and a retention period tends to be shorter. However, in the memory device according to one embodiment of the present invention, since the transistor whose off-state current is considerably reduced is used as a switching element, shortening of a retention period due to value multiplexing can be suppressed.

This embodiment can be implemented in appropriate combination with the above embodiment.

Embodiment 3

Figure 14:
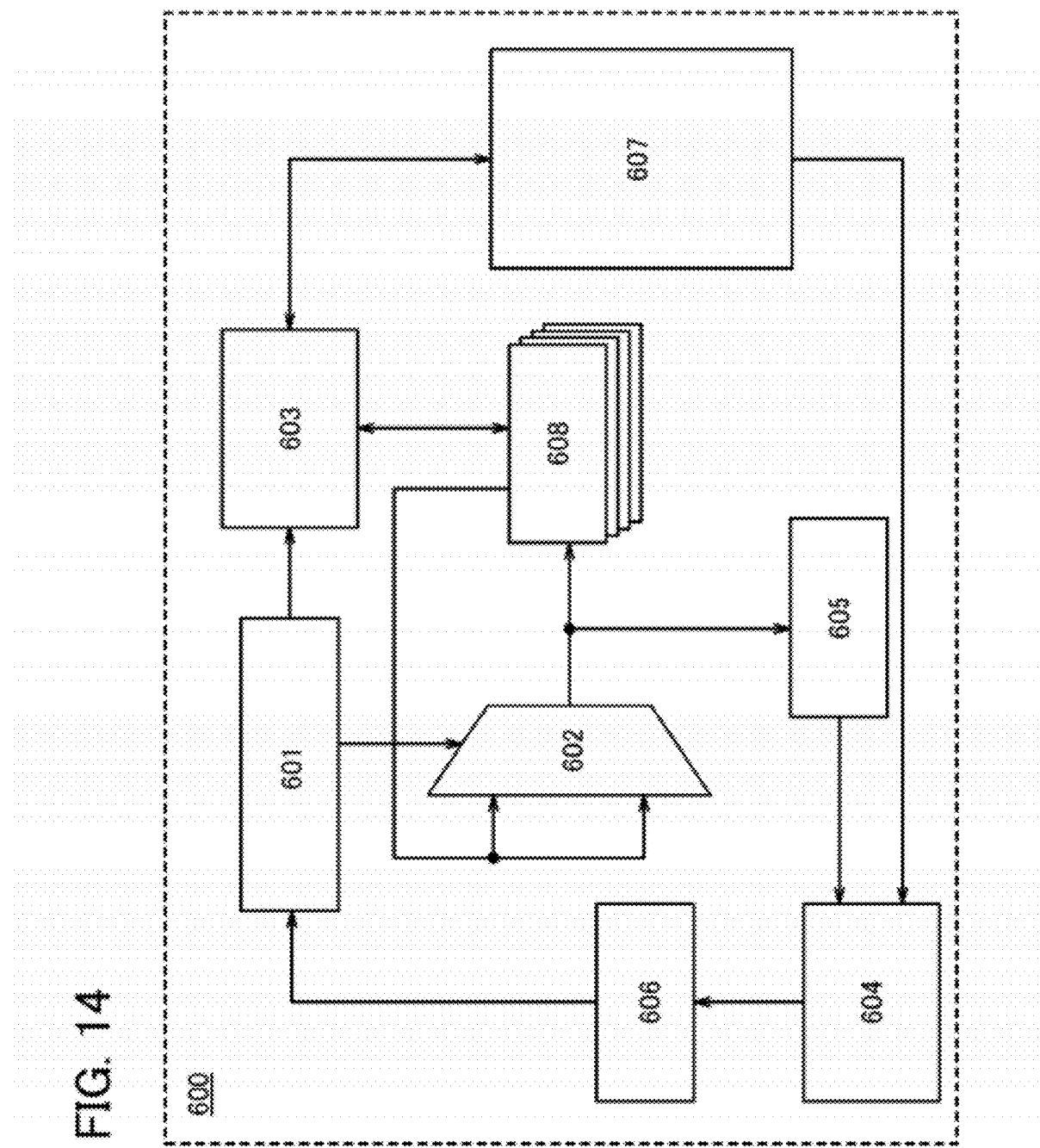
FIG. 14 is a block diagram showing the structure of a semiconductor device.

In this embodiment, a specific embodiment of a semiconductor device according to the present invention will be described. An example of the structure of the semiconductor device is illustrated as a block diagram in FIG. 14.

A semiconductor device 600 includes a control unit 601, an arithmetic logic unit (ALU) 602 corresponding to an arithmetic unit, a data cache 603, an instruction cache 604, a program counter 605, an instruction register 606, a main memory device 607, and a register file 608.

The control unit 601 has a function of decoding and carrying out an input instruction. The ALU 602 has a function of performing a variety of arithmetic operations such as four arithmetic operations and logic operations. The data cache 603 is a buffer memory device which temporary stores frequently used data. The instruction cache 604 is a buffer memory device which temporary stores frequently used instructions of instructions (programs) sent to the control unit 601. The program counter 605 is a register which stores an address of an instruction to be carried out next. The instruction register 606 is a register which stores an instruction to be carried out next. Data used for the arithmetic operations in the ALU 602 and an instruction which is carried out in the control unit 601 are stored in the main memory device 607. The register file 608 includes a plurality of registers including a general purpose register and can store data which is read out from the main memory device 607, data which is obtained during the arithmetic operations in the ALU 602, data which is obtained as a result of the arithmetic operations in the ALU 602, and/or the like.

Next, the operation of the semiconductor device 600 is described.

The control unit 601 reads an instruction from an address of the instruction cache 604 corresponding to the address of the instruction to be carried out next which is stored in the program counter 605, and makes the instruction register 606 store the instruction. When the instruction is not stored in the corresponding address of the instruction cache 604, the control unit 601 gets access to a corresponding address of the main memory device 607, reads the instruction from the main memory device 607, and makes the instruction register 606 store the instruction. In this case, the instruction is also stored in the instruction cache 604.

The control unit 601 decodes the instruction stored in the instruction register 606 and carries out the instruction. Specifically, the control unit 601 generates various signals for controlling the operation of the ALU 602 in accordance with the instruction.

When the instruction which is to be carried out is an arithmetic instruction, the control unit 601 makes the ALU 602 perform arithmetic operations using the data stored in the register file 608, and stores a result of the arithmetic operations in the register file 608.

When the instruction which is to be carried out is a loading instruction, the control unit 601, first, gets access to a corresponding address of the data cache 603, and checks whether or not a corresponding data exists in the data cache 603. When the corresponding data exists in the data cache 603, the data is copied from the corresponding address of the data cache 603 to the register file 608. When the corresponding data does not exist in the data cache 603, the data is copied from a corresponding address of the main memory device 607 to the corresponding address of the data cache 603, and then the data is copied from the corresponding address of the data cache 603 to the register file 608. Note that in the case where the corresponding data does not exist, since it is necessary to get access to the low-speed main memory device 607 as described above, it takes long time to carry out the instruction as compared to the case where the control unit gets access to only the buffer memory device such as the data cache 603. However, when not only the above data but also the address of the data and data of addresses of the vicinities of the data in the main memory device 607 are copied to the buffer memory device, second and the subsequent accesses to the address of the data and the addresses of the vicinities thereof in the main memory device 607 can be performed at high speed.

When the instruction which is to be carried out is a store instruction, the control unit 601 stores data of the register file 608 in a corresponding address of the data cache 603. In this case, the control unit 601, first, gets access to the corresponding address of the data cache 603 and checks whether or not the corresponding data can be stored in the data cache 603. When the data can be stored in the data cache 603, the data is copied from the register file 608 to the corresponding address of the data cache 603. When the data cannot be stored, a new corresponding address is assigned in part of the data cache 603, and the data is copied from the register file 608 to the corresponding address of the data cache 603. Note that the data may be copied to the main memory device 607 immediately after the data is copied to the data cache 603. Alternatively, some pieces of data may be copied to the data cache 603 and then the pieces of data may be collectively copied to the main memory device 607.

Then, after the control unit 601 carries out the instruction, the control unit 601 gets access to the program counter 605 again, and repeats the above operation in which an instruction read out from the instruction register 606 is decoded and carried out.

In one embodiment of the present invention, the memory device described in the above embodiment is applied to the data cache 603 and the instruction cache 604, whereby erasure of data can be prevented even when power supply is stopped. Accordingly, power supply can be stopped even for a short time in the whole of the semiconductor device 600, or in the logic circuit such as the control unit 601 or the ALU 602 included in the semiconductor device 600. Therefore, power consumption of the semiconductor device 600 can be reduced.

Further, in one embodiment of the present invention, among a plurality of memory cells included in the buffer memory device such as the data cache 603 or the instruction cache 604, a memory cell corresponding to a valid bit has a shorter data retention time than a memory cell corresponding to a data field. With the structure, before the reliability of cache data stored in the data field becomes low, valid data stored in the valid bit can be invalidated. Accordingly, a state where the valid data is valid even when the cache data stored in the data field is invalid can be prevented, and the reliability of the semiconductor device 600 can be increased.

Note that in the case where supply of a power supply voltage to the semiconductor device 600 is stopped for a long time, in the buffer memory device such as the data cache 603 or the instruction cache 604, data stored in a cache line might have an undefined value. Therefore, after the supply of the power supply voltage to the semiconductor device 600 starts, the valid bits of all of the cache lines in the buffer memory device need to be invalidated. However, during processing for invalidating the valid bits, the control unit 601 and the arithmetic unit such as the ALU 602 need to be in a standby state. Therefore, after the supply of the power supply voltage starts, it takes time until the semiconductor device 600 actually starts to process an instruction.

In the memory device according to one embodiment of the present invention, data writing can be performed concurrently in all memory cells in the memory device. In other words, it is not necessary to write data of the valid bit in every cache line, and data of the valid bits included in all the cache lines can be written concurrently. Specifically, with the structure in which potentials of all word lines WL or potentials of all first word lines WLa of the memory cells can be controlled concurrently, transistors functioning as switching elements are turned on concurrently, and data of a digital value indicating invalidation is written to all the memory cells. Further, when the transistor functioning as a switching element includes a pair of gate electrodes between which an active layer is provided, and one gate electrode is connected to the word line WL or the first word line WLa, the data of the digital value indicating invalidation may be written in all the memory cells concurrently by controlling a potential of the other gate electrode.

Accordingly, the time needed for invalidating the valid bits can be shortened in the semiconductor device 600 according to one embodiment of the present invention as compared to a general semiconductor device including a buffer memory device in which data needs to be written in every cache line. Therefore, the starting time after the supply of the power supply voltage starts until the semiconductor device 600 actually starts to process a signal can be shortened.

In particular, when the number of the cache lines becomes larger as the capacity of a buffer memory device is increased, the semiconductor device 600 according to one embodiment of the invention makes it possible to considerably shorten the starting time as compared to a general semiconductor device.

For example, an instruction which invalidates all the valid bits in the buffer memory device is prepared in an instruction set of the semiconductor device 600. The instruction is stored in an address in the main memory device 607, to which the control unit 601 gets access first. Further, the buffer memory device is put in a standby state just after the supply of the power supply voltage starts and starts its operation after the invalidation of the valid bits is completed. Specifically, a register indicating the state of the buffer memory device is prepared, and just after the supply of the power supply voltage to the semiconductor device 600 starts, the register has data indicating the standby state of the buffer memory device.

Since the buffer memory device is in the standby state after the supply of the power supply voltage to the semiconductor device 600 starts, the control unit 601 gets access to the main memory device 607. The control unit 601 reads the instruction which invalidates all the valid bits from the main memory device 607. The control unit 601 decodes the read instruction and carriers it out.

This embodiment can be implemented in appropriate combination with any of the above embodiments.

Embodiment 4

In this embodiment, a method for manufacturing a memory device will be described by giving an example in which an oxide semiconductor is used for an active layer of a transistor 103 and silicon is used for an active layer of a transistor 123 in a memory cell 101 illustrated in FIG. 3C.

Besides silicon, a semiconductor such as germanium, silicon germanium, or single crystal silicon carbide may be used for the transistor 123. For example, the transistor 123 including silicon can be formed using a single crystal semiconductor substrate such as a silicon wafer, a silicon thin film which is formed by an SOI method, a silicon thin film which is formed by a vapor deposition method, or the like. Alternatively, in one embodiment of the present invention, all the transistors included in the memory cells may include an oxide semiconductor.

Figure 15A:
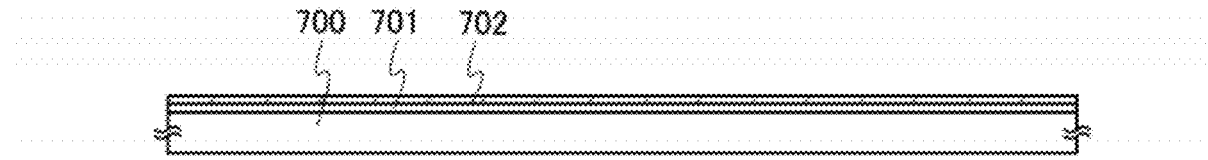
FIGS. 15A to 15D illustrate a method for manufacturing a memory device.

In this embodiment, first, as illustrated in FIG. 15A, an insulating film 701 and a semiconductor film 702 that is separated from a single crystal semiconductor substrate are formed over a substrate 700.

Although there is no particular limitation on a material which can be used as the substrate 700, it is necessary that the material have at least heat resistance high enough to withstand heat treatment to be performed later. For example, a glass substrate formed by a fusion process or a float process, a quartz substrate, a semiconductor substrate, a ceramic substrate, or the like can be used as the substrate 700. In the case where the temperature of the heat treatment to be performed later is high, a glass substrate whose strain point is higher than or equal to 730° C. is preferably used as the glass substrate.

In this embodiment, an example in which the semiconductor film 702 is formed using single crystal silicon is given as a method for forming the transistor 123. Note that a specific example of a method for forming the single crystal semiconductor film 702 is briefly described. First, an ion beam including ions which are accelerated by an electric field enters a bond substrate which is the single crystal semiconductor substrate and an embrittlement layer which is fragile because of local disorder of the crystal structure is formed in a region at a certain depth from a surface of the bond substrate. The depth at which the embrittlement layer is formed can be adjusted by the acceleration energy of the ion beam and the angle at which the ion beam enters. Then, the bond substrate and the substrate 700 which is provided with the insulating film 701 are attached to each other so that the insulating film 701 is provided therebetween. After the bond substrate and the substrate 700 overlap with each other, a pressure of approximately 1 N/cm$^2$ to 500 N/cm$^2$, preferably 11 N/cm$^2$ to 20 N/cm$^2$ is applied to part of the bond substrate and part of the substrate 700 so that the substrates are attached to each other. When the pressure is applied, bonding between the bond substrate and the insulating film 701 starts from the parts, which results in bonding of the entire surface where the bond substrate and the insulating film 701 are in close contact with each other. Subsequently, heat treatment is performed, whereby microvoids that exist in the embrittlement layer are bonded and the area of the microvoids is increased. Accordingly, a single crystal semiconductor film which is part of the bond substrate is separated from the bond substrate along the embrittlement layer. The heat treatment is performed at a temperature not exceeding the strain point of the substrate 700. Then, the single crystal semiconductor film is processed into a desired shape by etching or the like, so that the semiconductor film 702 can be formed.

In order to control the threshold voltage, an impurity element imparting p-type conductivity, such as boron, aluminum, or gallium, or an impurity element imparting n-type conductivity, such as phosphorus or arsenic, may be added to the semiconductor film 702. An impurity element for controlling the threshold voltage may be added to the semiconductor film which is not patterned or may be added to the patterned semiconductor film 702. Alternatively, the impurity element for controlling the threshold voltage may be added to the bond substrate. Alternatively, the impurity element may be added to the bond substrate in order to roughly control the threshold voltage, and the impurity element may be further added to the semiconductor film which is not patterned or the patterned semiconductor film 702 in order to finely control the threshold voltage.

Note that although an example in which a single crystal semiconductor film is used is described in this embodiment, one embodiment of the present invention is not limited to this structure. For example, a polycrystalline, microcrystalline, or amorphous semiconductor film which is formed over the insulating film 701 by a vapor deposition method may be used. Alternatively, the semiconductor film may be crystallized by a known technique. As the known techniques of crystallization, a laser crystallization method using a laser beam and a crystallization method using a catalytic element are given. Alternatively, a crystallization method using a catalytic element and a laser crystallization method may be combined. When a heat-resistant substrate such as a quartz substrate is used, a crystallization method combined with a thermal crystallization method using an electrically heated oven, a lamp annealing crystallization method using infrared light, a crystallization method using a catalytic element, or a high-temperature annealing method at approximately 950° C., may be used.

Figure 15B:
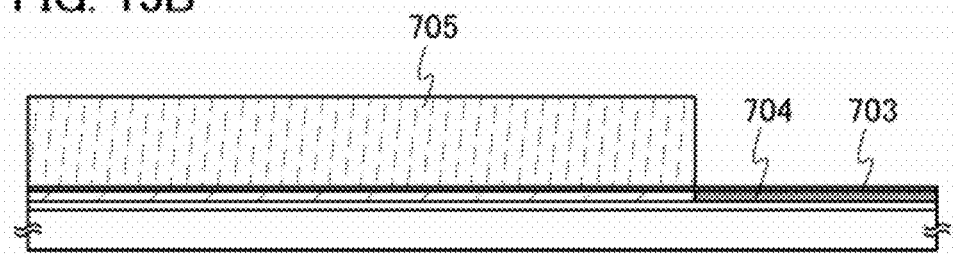

Next, as illustrated in FIG. 15B, a gate insulating film 703 is formed over the semiconductor film 702. Then, a mask 705 is formed over the gate insulating film 703 and an impurity element imparting conductivity is added to part of the semiconductor film 702, so that an impurity region 704 is formed.

The gate insulating film 703 can be formed by oxidation or nitriding of a surface of the semiconductor film 702 by high-density plasma treatment, heat treatment, or the like. The high-density plasma treatment is performed, for example, by using a mixed gas of an inert gas such as He, Ar, Kr, or Xe, and oxygen, nitrogen oxide, ammonia, nitrogen, hydrogen, or the like. In this case, by exciting plasma by introduction of microwaves, plasma with a low electron temperature and high density can be generated. By oxidation or nitriding of the surface of the semiconductor film with oxygen radicals (including OH radicals in some cases) or nitrogen radicals (including NH radicals in some cases) generated by such high-density plasma, an insulating film with a thickness of 1 nm to 20 nm, preferably 5 nm to 10 nm can be formed so as to be in contact with the semiconductor film. For example, a surface of the semiconductor film 702 is oxidized or nitrided using nitrous oxide ($N_2O$) diluted with Ar by one time to three times (flow ratio) by application of a microwave (2.45 GHz) power of 3 kW to 5 kW at a pressure of 10 Pa to 30 Pa. By this treatment, an insulating film having a thickness of 1 nm to 10 nm (preferably 2 nm to 6 nm) is formed. Further, nitrous oxide ($N_2O$) and silane ($SiH_4$) are introduced and a microwave (2.45 GHz) electric power of 3 kW to 5 kW is applied with a pressure of 10 Pa to 30 Pa so that a silicon oxynitride film is formed by a vapor deposition method, thereby forming the gate insulating film. With a combination of a solid-phase reaction and a reaction by a vapor deposition method, the gate insulating film with low interface state density and excellent withstand voltage can be formed.

The oxidation or nitriding of the semiconductor film by the high-density plasma treatment proceeds by solid-phase reaction. Thus, interface state density between the gate insulating film 703 and the semiconductor film 702 can be extremely low. Further, by direct oxidation or nitriding of the semiconductor film 702 by high-density plasma treatment, variation in the thickness of the insulating film to be formed can be suppressed. Moreover, in the case where the semiconductor film has crystallinity, the surface of the semiconductor film is oxidized with solid-phase reaction by the high-density plasma treatment to suppress fast oxidation only in a crystal grain boundary; therefore, the gate insulating film with uniformity and low interface state density can be formed. Variations in the characteristics of a transistor whose gate insulating film partly or entirely includes an insulating film formed by high-density plasma treatment can be suppressed.

The gate insulating film 703 may be formed using a single layer or a stack of layers using a film containing silicon oxide, silicon nitride oxide, silicon oxynitride, silicon nitride, hafnium oxide, aluminum oxide, tantalum oxide, yttrium oxide, hafnium silicate ($HfSi_xO_y$, (x>0, y>0)), hafnium silicate ($HfSi_xO_y$, (x>0, y>0)) to which nitrogen is added, hafnium aluminate ($HfAl_xO_y$, (x>0, y>0)) to which nitrogen is added, or the like by a plasma CVD method, a sputtering method, or the like.

Note that, in this specification, an oxynitride refers to a material containing a larger amount of oxygen than that of nitrogen, and a nitride oxide compound refers to a material containing a larger amount of nitrogen than that of oxygen.

The thickness of the gate insulating film 703 can be, for example, greater than or equal to 1 nm and less than or equal to 100 nm, preferably greater than or equal to 10 nm and less than or equal to 50 nm. In this embodiment, a single-layer insulating film containing silicon oxide is used as the gate insulating film 703 by a plasma CVD method.

Figure 15C:
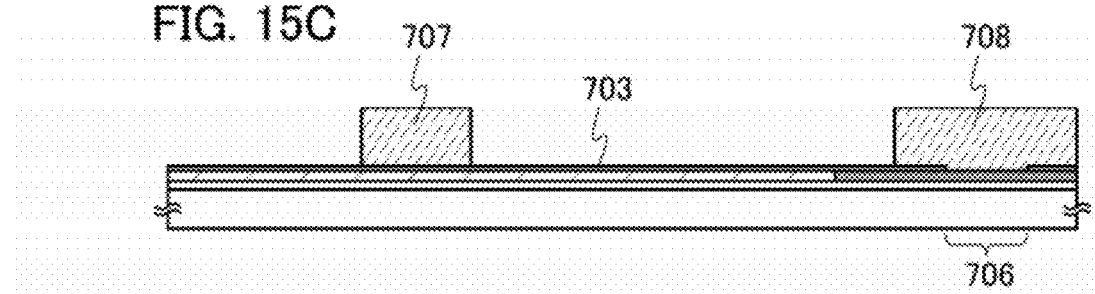

Then, after the mask 705 is removed, part of the gate insulating film 703 is removed as illustrated in FIG. 15C and an opening 706 is formed in a region overlapping with the impurity region 704 by etching or the like. After that, a gate electrode 707 and a conductive film 708 are formed.

A conductive film is formed so as to cover the opening 706 and then is processed (patterned) into a predetermined shape, so that the gate electrode 707 and the conductive film 708 can be formed. The conductive film 708 is in contact with the impurity region 704 in the opening 706. The conductive film can be formed by a CVD method, a sputtering method, a vapor deposition method, a spin coating method, or the like. For the conductive film, tantalum (Ta), tungsten (W), titanium (Ti), molybdenum (Mo), aluminum (Al), copper (Cu), chromium (Cr), niobium (Nb), or the like can be used. An alloy containing the above metal as a main component or a compound containing the above metal may be used. Alternatively, the conductive film may be formed using a semiconductor such as polycrystalline silicon doped with an impurity element such as phosphorus which imparts conductivity to the semiconductor film.

Note that although the gate electrode 707 and the conductive film 708 are formed using a single-layer conductive film in this embodiment, this embodiment is not limited to this structure. The gate electrode 707 and the conductive film 708 may be formed of a plurality of stacked conductive films.

As a combination of two conductive films, tantalum nitride or tantalum can be used for a first conductive film and tungsten can be used for a second conductive film. Besides, the following combinations are given: tungsten nitride and tungsten, molybdenum nitride and molybdenum, aluminum and tantalum, aluminum and titanium, and the like. Since tungsten and tantalum nitride have high heat resistance, a heat treatment aimed at thermal activation can be performed in subsequent steps after forming the two conductive films. Alternatively, as the combination of the two conductive films, for example, nickel silicide and silicon doped with an impurity element which imparts n-type conductivity, tungsten silicide and silicon doped with an impurity element which imparts n-type conductivity, or the like can be used.

In the case of using a three-layer structure including three conductive films, a stacked structure of a molybdenum film, an aluminum film, and a molybdenum film is preferable.

A light-transmitting oxide conductive film of indium oxide, a mixture of indium oxide and tin oxide, a mixture of indium oxide and zinc oxide, zinc oxide, zinc aluminum oxide, zinc aluminum oxynitride, zinc gallium oxide, or the like can be used as the gate electrode 707 and the conductive film 708.

Alternatively, the gate electrode 707 and the conductive film 708 may be selectively formed by a droplet discharge method without the use of a mask. A droplet discharge method refers to a method for forming a predetermined pattern by discharge or ejection of a droplet containing a predetermined composition from an orifice, and includes an inkjet method in its category.

In addition, the gate electrode 707 and the conductive film 708 may be formed by forming a conductive film, and the conductive film is etched by inductively coupled plasma (ICP) etching under appropriately controlled conditions (e.g., the amount of electric power applied to a coiled electrode layer, the amount of electric power applied to an electrode layer on the substrate side, and the electrode temperature on the substrate side) to have a desired tapered shape. In addition, angles and the like of the tapered shapes may also be controlled by a shape of a mask. Note that as an etching gas, a chlorine-based gas such as chlorine, boron chloride, silicon chloride, or carbon tetrachloride; a fluorine-based gas such as carbon tetrafluoride, sulfur fluoride, or nitrogen fluoride; or oxygen can be used as appropriate.

Figure 15D:
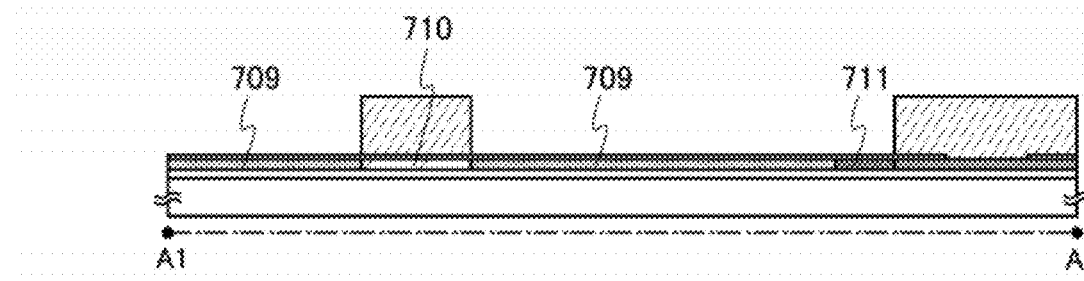

Next, as illustrated in FIG. 15D, when an impurity element which impart one conductivity is added to the semiconductor film 702 with the gate electrode 707 and the conductive film 708 used as masks, a channel formation region 710 overlapping with the gate electrode 707, a pair of impurity regions 709 between which the channel formation region 710 is provided, and an impurity region 711 obtained by further adding an impurity element to part of the impurity region 704 are formed in the semiconductor film 702.

In this embodiment, the case where an impurity element which imparts p-type conductivity (e.g., boron) is added to the semiconductor film 702 is described.

Figure 18A:
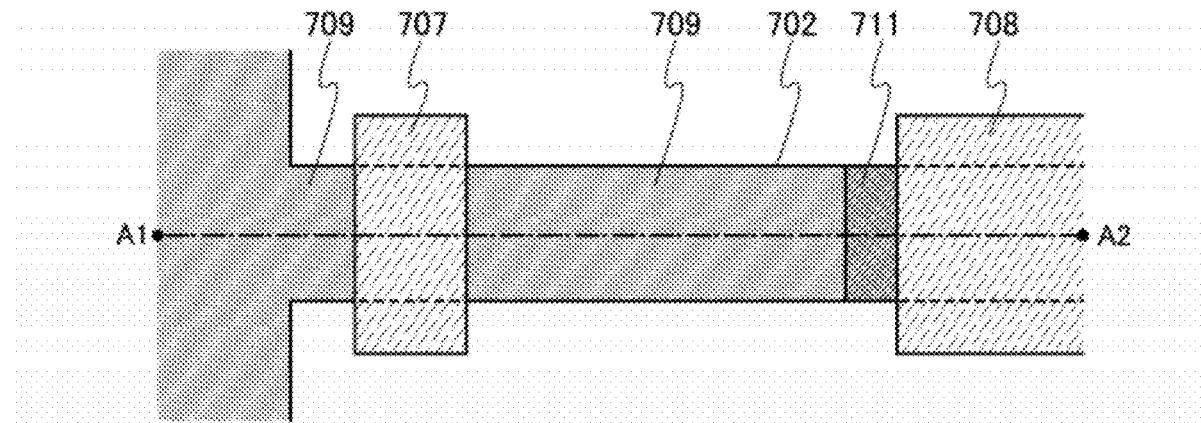
FIGS. 18A to 18C illustrate a method for manufacturing a memory device.

Note that FIG. 18A is a top view of the memory cell at the time when the above steps are finished. A cross-sectional view taken along dashed line A1-A2 in FIG. 18A corresponds to FIG. 15D.

Figure 16A:
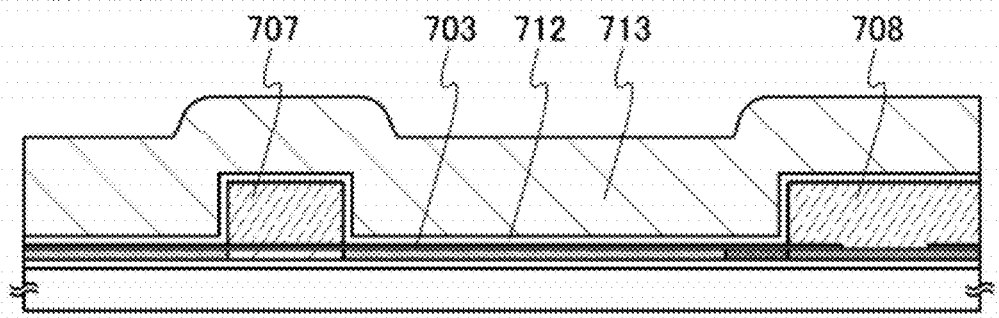
FIGS. 16A to 16C illustrate a method for manufacturing a memory device.

Next, as illustrated in FIG. 16A, insulating films 712 and 713 are formed so as to cover the gate insulating film 703, the gate electrode 707, and the conductive film 708. Specifically, an inorganic insulating film of silicon oxide, silicon nitride, silicon nitride oxide, silicon oxynitride, aluminum nitride, aluminum nitride oxide, or the like can be used as the insulating films 712 and 713. In particular, the insulating films 712 and 713 are preferably formed using a low dielectric constant (low-k) material because capacitance due to overlapping of electrodes or wirings can be sufficiently reduced.

Note that a porous insulating film including such a material may be employed as the insulating films 712 and 713. Since the porous insulating film has lower dielectric constant than a dense insulating layer, parasitic capacitance due to electrodes or wirings can be further reduced.

In this embodiment, an example in which silicon oxynitride is used for the insulating film 712 and silicon nitride oxide is used for the insulating film 713 is described. In addition, in this embodiment, although an example in which the insulating films 712 and 713 are formed over the gate electrode 707 and the conductive film 708, in one embodiment of the present invention, only one insulating film may be formed over the gate electrode 707 and the conductive film 708, or three or more insulating layers may be stacked.

Figure 16B:
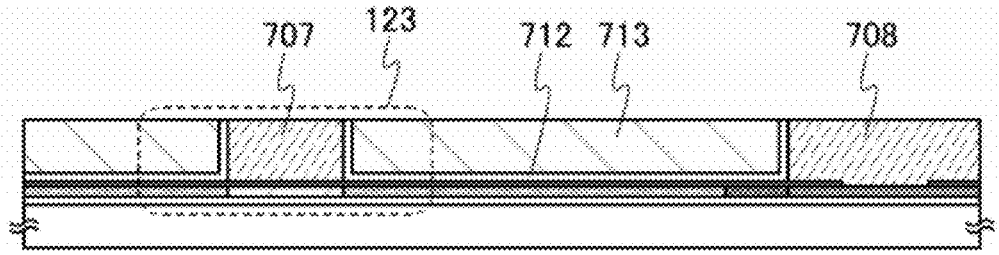

Next, as illustrated in FIG. 16B, the insulating films 712 and 713 are subjected to CMP (chemical mechanical polishing) or etching, so that surfaces of the gate electrode 707 and the conductive film 708 are exposed. Note that in order to improve the characteristics of the transistor 103 which is formed later, surfaces of the insulating films 712 and 713 are preferably flattened as much as possible.

By the above process, the transistor 123 can be formed.

Figure 16C:
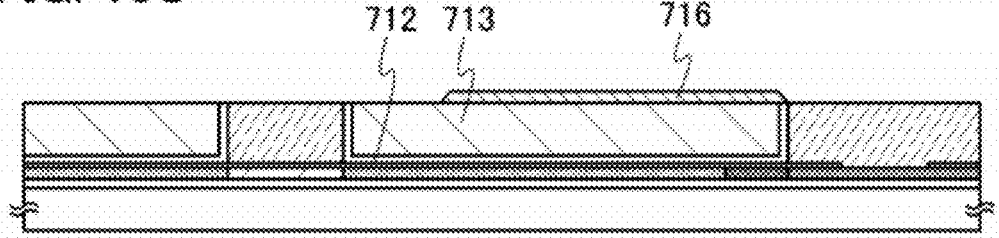

Next, a method for manufacturing the transistor 103 is described. First, as illustrated in FIG. 16C, an oxide semiconductor film 716 is formed over the insulating film 712 or the insulating film 713.

The oxide semiconductor film 716 can be formed by processing an oxide semiconductor film formed over the insulating films 712 and 713 into a desired shape. The thickness of the oxide semiconductor film is greater than or equal to 2 nm and less than or equal to 200 nm, preferably greater than or equal to 3 nm and less than or equal to 50 nm, more preferably greater than or equal to 3 nm and less than or equal to 20 nm. The oxide semiconductor film is deposited by a sputtering method using an oxide semiconductor target. Moreover, the oxide semiconductor film can be formed by a sputtering method in a rare gas (e.g., argon) atmosphere, an oxygen atmosphere, or a mixed atmosphere of a rare gas (e.g., argon) and oxygen.

Note that before the oxide semiconductor film is deposited by a sputtering method, dust attached to the surfaces of the insulating films 712 and 713 is preferably removed by reverse sputtering in which an argon gas is introduced and plasma is generated. The reverse sputtering refers to a method in which, without application of voltage to a target side, an RF power source is used for application of voltage to a substrate side in an argon atmosphere to generate plasma in the vicinity of the substrate to modify a surface. Note that instead of an argon atmosphere, a nitrogen atmosphere, a helium atmosphere, or the like may be used. Alternatively, an argon atmosphere to which oxygen, nitrous oxide, or the like is added may be used. Alternatively, an argon atmosphere to which chlorine, carbon tetrafluoride, or the like is added may be used.

As the oxide semiconductor, for example, an indium oxide, a tin oxide, a zinc oxide, a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide, a three-component metal oxide such as an In—Ga—Zn-based oxide, an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide, a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide can be used.

For example, an In—Ga—Zn-based oxide with an atomic ratio of In:Ga:Zn=1:1:1 (=1/3:1/3:1/3) or In:Ga:Zn=2:2:1 (=2/5:2/5:1/5), or an oxide with an atomic ratio close to the above atomic ratios can be used. Alternatively, an In—Sn—Zn-based oxide with an atomic ratio of In:Sn:Zn=1:1:1 (=1/3:1/3:1/3), In:Sn:Zn=2:1:3 (=1/3:1/6:1/2), or In:Sn:Zn=2:1:5 (=1/4:1/8:5/8), or an oxide with an atomic ratio close to the above atomic ratios may be used.

However, without limitation to the materials given above, a material with an appropriate composition may be used depending on needed semiconductor characteristics (e.g., mobility, threshold voltage, and variation). In order to obtain the needed semiconductor characteristics, it is preferable that the carrier density, the impurity concentration, the defect density, the atomic ratio between a metal element and oxygen, the interatomic distance, the density, and the like be set to appropriate values.

For example, high mobility can be obtained relatively easily in the case of using an In—Sn—Zn oxide. However, mobility can be increased by reducing the defect density in a bulk also in the case of using an In—Ga—Zn-based oxide.

Note that for example, the expression "the composition of an oxide with an atomic ratio of In:Ga:Zn=a:b:c (a+b+c=1) is in the neighborhood of the composition of an oxide with an atomic ratio of In:Ga:Zn=A:B:C (A+B+C=1)" means that a, b, and c satisfy the following relation: $(a-A)^2+(b-B)^2+(c-C)^2 \leq r^2$. A variable r may be 0.05, for example. The same applies to other oxides.

The oxide semiconductor may be either single crystal or non-single-crystal. In the latter case, the oxide semiconductor may be either amorphous or polycrystal. Further, the oxide semiconductor may have either an amorphous structure including a portion having crystallinity or a non-amorphous structure.

In an oxide semiconductor in an amorphous state, a flat surface can be obtained relatively easily, so that when a transistor is manufactured with the use of the oxide semiconductor, interface scattering can be reduced, and relatively high mobility can be obtained relatively easily.

In an oxide semiconductor having crystallinity, defects in the bulk can be further reduced and when a surface flatness is improved, mobility higher than that of an oxide semiconductor in an amorphous state can be obtained. In order to improve the surface flatness, the oxide semiconductor is preferably formed over a flat surface. Specifically, the oxide semiconductor may be formed over a surface with the average surface roughness ($R_a$) of less than or equal to 1 nm, preferably less than or equal to 0.3 nm, further preferably less than or equal to 0.1 nm.

Note that the average surface roughness ($R_a$) is obtained by expanding, into three dimensions, center line average roughness that is defined by JIS B 0601 so as to be able to apply it to a measurement surface. $R_a$ can be expressed as an "average value of the absolute values of deviations from a reference surface to a designated surface" and is defined by Formula 1 shown below.

[Formula 1]

$$Ra = \frac{1}{S_0} \int_{y_1}^{y_2} \int_{x_1}^{x_2} |f(x, y) - Z_0| dx dy \quad \text{(Formula 1)}$$

In the above formula, $S_0$ represents the area of a plane to be measured (a rectangular region which is defined by four points represented by coordinates $(x_1, y_1)$, $(x_1, y_2)$, $(x_2, y_1)$, and $(x_2, y_2)$), and $Z_0$ represents an average height of the plane to be measured. $R_a$ can be measured using an atomic force microscope (AFM).

In this embodiment, as the oxide semiconductor film, an In—Ga—Zn-based oxide semiconductor thin film with a thickness of 30 nm, which is obtained by a sputtering method using a target containing indium (In), gallium (Ga), and zinc (Zn), is used. As the above target, a target having a composition ratio of, for example, $In_2O_3:Ga_2O_3:ZnO=1:1:1$ [molar ratio] is used. Alternatively, a target having a composition ratio of $In_2O_3:Ga_2O_3:ZnO=1:1:2$ [molar ratio] or a target having a composition ratio of $In_2O_3:Ga_2O_3:ZnO=1:1:4$ [molar ratio] can be used. The filling rate of the target containing In, Ga, and Zn is higher than or equal to 90% and lower than or equal to 100%, and preferably higher than or equal to 95% and lower than 100%. With the use of the target with high filling rate, a dense oxide semiconductor film is deposited.

In the case where an In—Zn-based material is used as an oxide semiconductor, a target used has a composition ratio of In:Zn=50:1 to 1:2 in an atomic ratio ($In_2O_3:ZnO$=25:1 to 1:4 in a molar ratio), preferably, In:Zn=20:1 to 1:1 in an atomic ratio ($In_2O_3:ZnO$=10:1 to 1:2 in a molar ratio), further preferably, In:Zn=15:1 to 1.5:1 in an atomic ratio ($In_2O_3:ZnO$=15:2 to 3:4 in a molar ratio). For example, in a target used for formation of an In—Zn-based oxide semiconductor which has an atomic ratio of In:Zn:O=X:Y:Z, the relation of Z>1.5X+Y is satisfied.

Further, an In—Sn—Zn-based oxide can be formed using an oxide target which has a composition ratio of In:Sn:Zn=1:2:2, 2:1:3, 1:1:1, 20:45:35, or the like in an atomic ratio.

In this embodiment, the oxide semiconductor film is deposited in such a manner that the substrate is held in a treatment chamber kept in a reduced pressure state, moisture remaining in the treatment chamber is removed, a sputtering gas from which hydrogen and moisture are removed is introduced, and the target is used. The substrate temperature may be higher than or equal to 100° C. and lower than or equal to 600° C., preferably higher than or equal to 200° C. and lower than or equal to 400° C. at the deposition. By depositing the oxide semiconductor film in a state where the substrate is heated, the concentration of impurities contained in the deposited oxide semiconductor film can be reduced. In addition, damage by sputtering can be reduced. In order to remove remaining moisture in the treatment chamber, an entrapment vacuum pump is preferably used. For example, a cryopump, an ion pump, or a titanium sublimation pump is preferably used. The evacuation unit may be a turbo pump provided with a cold trap. In the treatment chamber which is evacuated with the cryopump, for example, a hydrogen atom, a compound containing a hydrogen atom, such as water ($H_2O$), (more preferably, also a compound containing a carbon atom), and the like are removed, whereby the impurity concentration in the oxide semiconductor film deposited in the treatment chamber can be reduced.

As one example of the deposition condition, the distance between the substrate and the target is 100 mm, the pressure is 0.6 Pa, the direct-current (DC) power source is 0.5 kW, and the atmosphere is an oxygen atmosphere (the proportion of the oxygen flow rate is 100%). Note that a pulsed direct-current (DC) power supply is preferable because dust generated in deposition can be reduced and the film thickness can be made uniform.

Moreover, when the leakage rate of the treatment chamber of the sputtering apparatus is set to lower than or equal to $1 \times 10^{-10}$ Pa·m$^3$/second, the entry of impurities such as an alkali metal or hydride into the oxide semiconductor film that is being formed by a sputtering method can be reduced. Further, with the use of an entrapment vacuum pump as an exhaustion system, counter flow of impurities, such as alkali metal, hydrogen atoms, hydrogen molecules, water, a hydroxyl group, or hydride, from the exhaustion system can be reduced.

When the purity of the target is set to 99.99% or higher, alkali metal, hydrogen atoms, hydrogen molecules, water, a hydroxyl group, hydride, or the like mixed to the oxide semiconductor film can be reduced. In addition, when the target is used, the concentration of alkali metal such as lithium, sodium, or potassium can be reduced in the oxide semiconductor film.

Note that in order that hydrogen, a hydroxyl group, and moisture be contained in the oxide semiconductor film as little as possible, it is preferable that an impurity such as hydrogen or moisture that is adsorbed on the substrate 700 is eliminated and exhausted by preheating of the substrate 700 over which the insulating films 712 and 713 are formed in a preheating chamber of a sputtering apparatus, as pretreatment for deposition. The temperature for the preheating is higher than or equal to 100° C. and lower than or equal to 400° C., preferably higher than or equal to 150° C. and lower than or equal to 300° C. As an evacuation means, a cryopump is preferably provided in the preheating chamber. Note that this preheating treatment can be skipped. This preheating may be similarly performed on the substrate 700 over which conductive films 719 and 720 are formed before the deposition of a gate insulating film 721.

Note that etching for forming the oxide semiconductor film 716 may be dry etching, wet etching, or both dry etching and wet etching. As an etching gas used for dry etching, a gas containing chlorine (a chlorine-based gas such as chlorine ($Cl_2$), boron trichloride ($BCl_3$), silicon tetrachloride ($SiCl_4$), or carbon tetrachloride ($CCl_4$)) is preferably used. Alternatively, a gas containing fluorine (a fluorine-based gas such as carbon tetrafluoride ($CF_4$), sulfur hexafluoride ($SF_6$), nitrogen trifluoride ($NF_3$), or trifluoromethane ($CHF_3$)), hydrogen bromide (HBr), oxygen ($O_2$), any of these gases to which a rare gas such as helium (He) or argon (Ar) is added, or the like can be used.

As the dry etching method, a parallel plate RIE (reactive ion etching) method or an ICP (inductively coupled plasma) etching method can be used. In order to etch the film to have a desired shape, the etching conditions (e.g., the amount of electric power applied to a coiled electrode, the amount of electric power applied to an electrode on the substrate side, and the electrode temperature on the substrate side) are adjusted as appropriate.

As an etchant used for the wet etching, a mixed solution of phosphoric acid, acetic acid, and nitric acid, or organic acid such as citric acid or oxalic acid can be used. In this embodiment, ITO-07N (produced by KANTO CHEMICAL CO., INC.) is used.

A resist mask used for forming the oxide semiconductor film 716 may be formed by an inkjet method. Formation of the resist mask by an inkjet method needs no photomask; thus, manufacturing cost can be reduced.

Note that it is preferable that reverse sputtering be performed before the formation of a conductive film in a subsequent step so that a resist residue and the like that attaches onto surfaces of the oxide semiconductor film 716 and the insulating films 712 and 713 are removed.

Note that the oxide semiconductor film deposited by sputtering or the like contains a large amount of moisture or hydrogen (including a hydroxyl group) as an impurity in some cases. Moisture or hydrogen easily forms donor levels and thus serves as an impurity in the oxide semiconductor. In one embodiment of the present invention, in order to reduce impurities such as moisture or hydrogen in the oxide semiconductor film (dehydration or dehydrogenation), the oxide semiconductor film 716 is preferably subjected to heat treatment in a reduced pressure atmosphere, an inert gas atmosphere of nitrogen, a rare gas, or the like, an oxygen gas atmosphere, or an ultra dry air atmosphere (the moisture amount is 20 ppm (−55° C. by conversion into a dew point) or less, preferably 1 ppm or less, further preferably 10 ppb or less, in the case where the measurement is performed by a dew point meter in a cavity ring down laser spectroscopy (CRDS) method).

By subjection the oxide semiconductor film 716 to heat treatment, moisture or hydrogen in the oxide semiconductor film 716 can be eliminated. Specifically, heat treatment may be performed at a temperature higher than or equal to 250° C. and lower than or equal to 750° C., preferably higher than or equal to 400° C. and lower than the strain point of a substrate. For example, heat treatment may be performed at 500° C. for approximately three minutes to six minutes. When an RTA method is used for the heat treatment, dehydration or dehydrogenation can be performed in a short time; thus, treatment can be performed even at a temperature higher than the strain point of a glass substrate.

In this embodiment, an electrical furnace that is one of heat treatment apparatuses is used.

Note that the heat treatment apparatus is not limited to an electric furnace, and may have a device for heating an object by heat conduction or heat radiation from a heating element such as a resistance heating element. For example, an RTA (rapid thermal anneal) apparatus such as a GRTA (gas rapid thermal anneal) apparatus or an LRTA (lamp rapid thermal anneal) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high-temperature gas. As the gas, an inert gas which does not react with an object to be processed by heat treatment, like nitrogen or a rare gas such as argon is used.

In the heat treatment, it is preferable that moisture, hydrogen, and the like be not contained in nitrogen or a rare gas such as helium, neon, or argon. Alternatively, the purity of nitrogen or a rare gas such as helium, neon, or argon which is introduced into the heat treatment apparatus is preferably greater than or equal to 6 N (99.9999%), more preferably greater than or equal to 7 N (99.99999%) (i.e., the impurity concentration is less than or equal to 1 ppm, preferably less than or equal to 0.1 ppm).

Note that it has been pointed out that an oxide semiconductor is insensitive to impurities, there is no problem when a considerable amount of metal impurities is contained in the film, and therefore, soda-lime glass which contains a large amount of alkali metal such as sodium and is inexpensive can also be used (Kamiya, Nomura, and Hosono, "Engineering application of solid state physics: Carrier transport properties and electronic structures of amorphous oxide semiconductors: the present status", *KOTAI BUTSURI (SOLID STATE PHYSICS)*, 2009, Vol. 44, pp. 621-633). But such consideration is not appropriate. Alkali metal is not an element contained in an oxide semiconductor, and therefore, is an impurity. Also, alkaline earth metal is impurity in the case where alkaline earth metal is not contained in an oxide semiconductor. Alkali metal, in particular, Na becomes Na$^+$ when an insulating film in contact with the oxide semiconductor film is an oxide and Na diffuses into the insulating layer. In addition, in the oxide semiconductor film, Na cuts or enters a bond between metal and oxygen which are contained in an oxide semiconductor. As a result, for example, deterioration of characteristics of the transistor, such as a normally-on state of the transistor due to shift of a threshold voltage in the negative direction, or reduction in mobility, occurs. In addition, variation in characteristics also occurs. Such deterioration of characteristics of the transistor and variation in characteristics due to the impurity remarkably appear when the hydrogen concentration in the oxide semiconductor film is very low. Therefore, when the hydrogen concentration in the oxide semiconductor film is less than or equal to $1 \times 10^{18}/\text{cm}^3$, preferably less than or equal to $1 \times 10^{17}/\text{cm}^3$, the concentration of the above impurity is preferably reduced. Specifically, a measurement value of a Na concentration by secondary ion mass spectrometry is preferably less than or equal to $5 \times 10^{16}/\text{cm}^3$, more preferably less than or equal to $1 \times 10^{16}/\text{cm}^3$, still more preferably less than or equal to $1 \times 10^{15}/\text{cm}^3$. In a similar manner, a measurement value of a Li concentration is preferably less than or equal to $5 \times 10^{15}/\text{cm}^3$, more preferably less than or equal to $1 \times 10^{15}/\text{cm}^3$. In a similar manner, a measurement value of a K concentration is preferably less than or equal to $5 \times 10^{15}/\text{cm}^3$, more preferably less than or equal to $1 \times 10^{15}/\text{cm}^3$.

Through the above steps, the concentration of hydrogen in the oxide semiconductor film 716 can be reduced and the oxide semiconductor film can be highly purified. Thus, the oxide semiconductor film can be stabilized. In addition, heat treatment at a temperature lower than or equal to the glass transition temperature makes it possible to form an oxide semiconductor film with a wide bandgap and a very low carrier density. Therefore, the transistor can be manufactured using a large-sized substrate, so that the productivity can be increased. In addition, with the highly purified oxide semiconductor film in which the hydrogen concentration is reduced and oxygen deficiency is reduced, a transistor with high withstand voltage and a very small off-state current can be manufactured.

An oxide semiconductor film is in a single crystal state, a polycrystalline (also referred to as polycrystal) state, an amorphous state, or the like. The oxide semiconductor film is preferably a CAAC-OS (c-axis aligned crystalline oxide semiconductor) film.

The CAAC-OS film is not completely single crystal nor completely amorphous. The CAAC-OS film is an oxide semiconductor film with a crystal-amorphous mixed phase structure where crystal portions are included in an amorphous phase. Some crystal portions have a size of several nanometers to several tens of nanometers. Note that from an observation image obtained with a transmission electron microscope (TEM), a boundary between an amorphous portion and a crystal portion in the CAAC-OS film is not clear. Further, a grain boundary in the CAAC-OS film is not found. Since the CAAC-OS film does not include a grain boundary, a reduction in electron mobility due to a grain boundary does not easily occur.

In each of the crystal portions included in the CAAC-OS film, a c-axis is aligned in a direction perpendicular to a surface where the CAAC-OS film is formed or a surface of the CAAC-OS film, triangular or hexagonal atomic arrangement which is seen from the direction perpendicular to the a-b plane is formed, and metal atoms are arranged in a layered manner or metal atoms and oxygen atoms are arranged in a layered manner when seen from the direction perpendicular to the c-axis. Note that, among crystal portions, the directions of the a-axis and the b-axis of one crystal portion may be different from those of another crystal portion.

Note that the proportions of the amorphous portions and the crystal portions in the CAAC-OS film are not necessarily uniform. For example, in the case where crystal growth occurs from a surface side of the CAAC-OS film, in some cases, the proportion of the crystal portions in the vicinity of the surface of the CAAC-OS is high and the proportion of the amorphous portions in the vicinity of the surface where the CAAC-OS film is formed is high.

Since the c-axes of the crystal portions included in the CAAC-OS film are aligned in the direction perpendicular to the surface where the CAAC-OS film is formed or the surface of the CAAC-OS film, the directions of the c-axes of the crystal portions may be different from each other depending on the shape of the CAAC-OS film (the cross-sectional shape of the surface where the CAAC-OS film is formed or the cross-sectional shape of the surface of the CAAC-OS film). Note that when the CAAC-OS film is formed, the direction of c-axis of the crystal portion is the direction perpendicular to the surface where the CAAC-OS film is formed or the surface of the CAAC-OS film. The crystal portion is formed after deposition or is formed by performing treatment for crystallization such as heat treatment after deposition.

With use of the CAAC-OS film, change in electric characteristics of the transistor due to irradiation with visible light or ultraviolet light can be reduced, so that the highly reliable transistor can be obtained.

An example of a crystal structure of the CAAC-OS film is described in detail with reference to FIGS. 21A to 21E, FIGS. 22A to 22C, and FIGS. 23A to 23C. In FIGS. 21A to 21E, FIGS. 22A to 22C, and FIGS. 23A to 23C, the vertical direction corresponds to the c-axis direction and a plane perpendicular to the c-axis direction corresponds to the a-b plane, unless otherwise specified. When the expressions "an upper half" and "a lower half" are simply used, they refer to an upper half above the a-b plane and a lower half below the a-b plane (an upper half and a lower half with respect to the a-b plane). Furthermore, in FIGS. 21A to 21E, O surrounded by a circle represents tetracoordinate O and O surrounded by a double circle represents tricoordinate O.

Figure 21A:
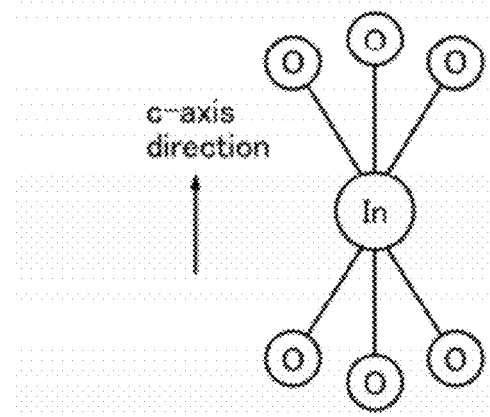
FIGS. 21A to 21E each illustrate the crystal structure of an oxide semiconductor.

FIG. 21A illustrates a structure including one hexacoordinate In atom and six tetracoordinate oxygen (hereinafter referred to as tetracoordinate O) atoms proximate to the In atom. Here, a structure including one metal atom and oxygen atoms proximate thereto is referred to as a small group. The structure in FIG. 21A is actually an octahedral structure, but is illustrated as a planar structure for simplicity. Note that three tetracoordinate O atoms exist in each of an upper half and a lower half in FIG. 21A. In the small group illustrated in FIG. 21A, electric charge is 0.

Figure 21D:
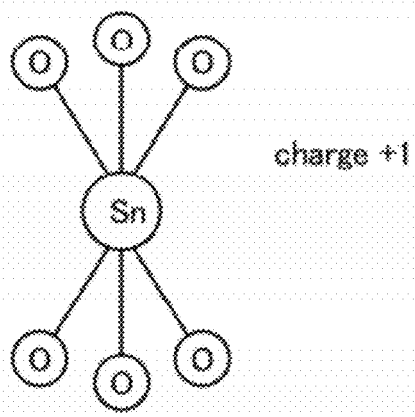
Figure 21B:
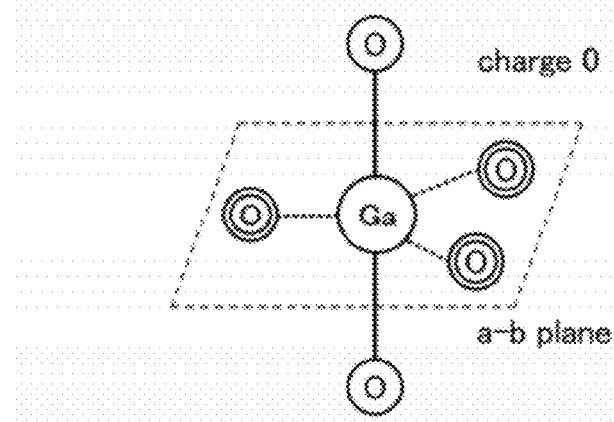

FIG. 21B illustrates a structure including one pentacoordinate Ga atom, three tricoordinate oxygen (hereinafter referred to as tricoordinate O) atoms proximate to the Ga atom, and two tetracoordinate O atoms proximate to the Ga atom. All the tricoordinate O atoms exist on the a-b plane. One tetracoordinate O atom exists in each of an upper half and a lower half in FIG. 21B. An In atom can also have the structure illustrated in FIG. 21B because an In atom can have five ligands. In the small group illustrated in FIG. 21B, electric charge is 0.

Figure 21E:
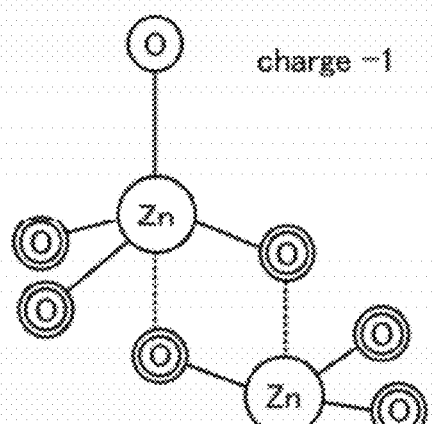
Figure 21C:
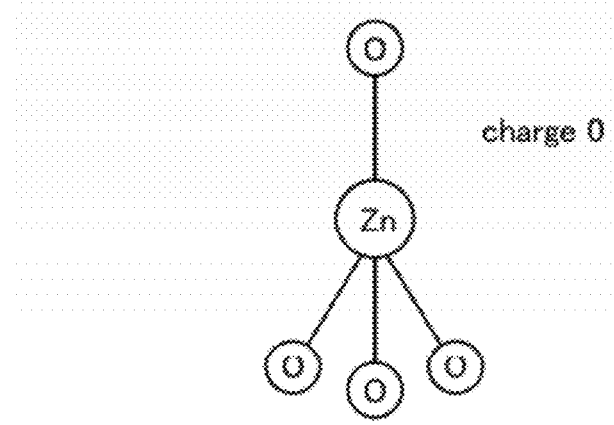

FIG. 21C illustrates a structure including one tetracoordinate Zn atom and four tetracoordinate O atoms proximate to the Zn atom. In FIG. 21C, one tetracoordinate O atom exists in an upper half and three tetracoordinate O atoms exist in a lower half. Alternatively, three tetracoordinate O atoms may exist in the upper half and one tetracoordinate O atom may exist in the lower half in FIG. 21C. In the small group illustrated in FIG. 21C, electric charge is 0.

FIG. 21D illustrates a structure including one hexacoordinate Sn atom and six tetracoordinate O atoms proximate to the Sn atom. In FIG. 21D, three tetracoordinate O atoms exist in each of an upper half and a lower half. In the small group illustrated in FIG. 21D, electric charge is +1.

FIG. 21E illustrates a small group including two Zn atoms. In FIG. 21E, one tetracoordinate O atom exists in each of an upper half and a lower half. In the small group illustrated in FIG. 21E, electric charge is −1.

Here, a plurality of small groups forms a medium group, and a plurality of medium groups forms a large group (also referred to as a unit cell).

Now, a rule of bonding between the small groups is described. The three O atom in the upper half with respect to the hexacoordinate In atom each have three proximate In atoms in the downward direction, and the three O atom in the lower half each have three proximate In atoms in the upward direction. The one O atom in the upper half with respect to the pentacoordinate Ga atom has one proximate Ga atom in the downward direction, and the one O atom in the lower half has one proximate Ga atom in the upward direction. The one O atom in the upper half with respect to the tetracoordinate Zn atom has one proximate Zn atom in the downward direction, and the three O atoms in the lower half each have three proximate Zn atoms in the upward direction. In this manner, the number of the tetracoordinate O atoms proximate to and above the metal atom is equal to the number of the metal atoms proximate to and below each of the tetracoordinate O atoms. Similarly, the number of the tetracoordinate O atoms proximate and below the metal atom is equal to the number of the metal atoms proximate to and above each of the tetracoordinate O atoms. Since the coordination number of the tetracoordinate O atom is 4, the sum of the number of the metal atoms proximate to and below the O atom and the number of the metal atoms proximate to and above the O atom is 4. Accordingly, when the sum of the number of tetracoordinate O atoms above a metal atom and the number of tetracoordinate O atoms below another metal atom is 4, the two kinds of small groups including the metal atoms can be bonded. For example, in the case where the hexacoordinate metal (In or Sn) atom is bonded through three tetracoordinate O atoms in the lower half, it is bonded to the pentacoordinate metal (Ga or In) atom or the tetracoordinate metal (Zn) atom.

A metal atom having the above coordination number is bonded to another metal atom having the above coordination number through a tetracoordinate O atom in the c-axis direction. In addition to the above, a medium group can be formed in a different manner by combining a plurality of small groups so that the total electric charge of the layered structure is 0.

FIG. 22A illustrates a model of a medium group included in a layered structure of an In—Sn—Zn-based oxide. FIG. 22B illustrates a large group including three medium groups.

FIG. 22C illustrates an atomic arrangement in the case where the layered structure in FIG. 22B is observed from the c-axis direction.

In FIG. 22A, a tricoordinate O atom is omitted for simplicity, and a tetracoordinate O atom is illustrated by a circle; the number in the circle shows the number of tetracoordinate O atoms. For example, three tetracoordinate O atoms existing in each of an upper half and a lower half with respect to a Sn atom are denoted by circled 3. Similarly, in FIG. 22A, one tetracoordinate O atom existing in each of an upper half and a lower half with respect to an In atom is denoted by circled 1. FIG. 22A also illustrates a Zn atom proximate to one tetracoordinate O atom in a lower half and three tetracoordinate O atoms in an upper half, and a Zn atom proximate to one tetracoordinate O atom in an upper half and three tetracoordinate O atoms in a lower half.

In the medium group included in the layered structure of the In—Sn—Zn-based oxide in FIG. 22A, in the order starting from the top, a Sn atom proximate to three tetracoordinate O atoms in each of an upper half and a lower half is bonded to an In atom proximate to one tetracoordinate O atom in each of an upper half and a lower half, the In atom is bonded to a Zn atom proximate to three tetracoordinate O atoms in an upper half, the Zn atom is bonded to an In atom proximate to three tetracoordinate O atoms in each of an upper half and a lower half through one tetracoordinate O atom in a lower half with respect to the Zn atom, the In atom is bonded to a small group that includes two Zn atoms and is proximate to one tetracoordinate O atom in an upper half, and the small group is bonded to a Sn atom proximate to three tetracoordinate O atoms in each of an upper half and a lower half through one tetracoordinate O atom in a lower half with respect to the small group. A plurality of such medium groups is bonded, so that a large group is formed.

Here, electric charge for one bond of a tricoordinate O atom and electric charge for one bond of a tetracoordinate O atom can be assumed to be −0.667 and −0.5, respectively. For example, electric charge of a (hexacoordinate or pentacoordinate) In atom, electric charge of a (tetracoordinate) Zn atom, and electric charge of a (pentacoordinate or hexacoordinate) Sn atom are +3, +2, and +4, respectively. Accordingly, electric charge in a small group including a Sn atom is +1. Therefore, electric charge of −1, which cancels +1, is needed to form a layered structure including a Sn atom. As a structure having electric charge of −1, the small group including two Zn atoms as illustrated in FIG. 21E can be given. For example, with one small group including two Zn atoms, electric charge of one small group including a Sn atom can be cancelled, so that the total electric charge of the layered structure can be 0.

When the large group illustrated in FIG. 22B is repeated, an In—Sn—Zn-based crystal ($In_2SnZn_3O_8$) can be obtained. Note that a layered structure of the obtained In—Sn—Zn-based oxide can be represented by a composition formula, $In_2SnZn_2O_7(ZnO)_m$ (m is 0 or a natural number).

The above-described rule also applies to the following oxides: a four-component metal oxide such as an In—Sn—Ga—Zn-based oxide; a three-component metal oxide such as an In—Ga—Zn-based oxide, an In—Al—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide; and the like.

As an example, FIG. 23A illustrates a model of a medium group included in a layered structure of an In—Ga—Zn-based oxide.

In the medium group included in the layered structure of the In—Ga—Zn-based oxide in FIG. 23A, in the order starting from the top, an In atom proximate to three tetracoordinate O atoms in each of an upper half and a lower half is bonded to a Zn atom proximate to one tetracoordinate O atom in an upper half, the Zn atom is bonded to a Ga atom proximate to one tetracoordinate O atom in each of an upper half and a lower half through three tetracoordinate O atoms in a lower half with respect to the Zn atom, and the Ga atom is bonded to an In atom proximate to three tetracoordinate O atoms in each of an upper half and a lower half through one tetracoordinate O atom in a lower half with respect to the Ga atom. A plurality of such medium groups is bonded, so that a large group is formed.

FIG. 23B illustrates a large group including three medium groups. Note that FIG. 23C illustrates an atomic arrangement in the case where the layered structure in FIG. 23B is observed from the c-axis direction.

Here, since electric charge of a (hexacoordinate or pentacoordinate) In atom, electric charge of a (tetracoordinate) Zn atom, and electric charge of a (pentacoordinate) Ga atom are +3, +2, +3, respectively, electric charge of a small group including any of an In atom, a Zn atom, and a Ga atom is 0. As a result, the total electric charge of a medium group having a combination of such small groups is always 0.

In order to form the layered structure of the In—Ga—Zn-based oxide, a large group can be formed using not only the medium group illustrated in FIG. 23A but also a medium group in which the arrangement of the In atom, the Ga atom, and the Zn atom is different from that in FIG. 23A.

In the CAAC-OS film, metal atoms and oxygen atoms are bonded in an orderly manner in comparison with an amorphous oxide semiconductor. That is to say, the number of oxygen atoms coordinating to each metal atom may vary when the oxide semiconductor film is amorphous, but in a CAAC-OS film, there are few variations in the number of oxygen atoms coordinating to each metal atom. Therefore, microscopic defects of oxygen can be reduced and instability and moving of charge that are due to attachment and detachment of hydrogen atoms (including hydrogen ions) or alkali metal atoms can be reduced.

Accordingly, a transistor is formed using an oxide semiconductor film including a CAAC-OS film, whereby the amount of shift of the threshold voltage of the transistor, which occurs after light irradiation and a bias-temperature (BT) stress test are performed on the transistor, can be reduced. Accordingly, a transistor having stable electric characteristics can be formed.

Figure 17A:
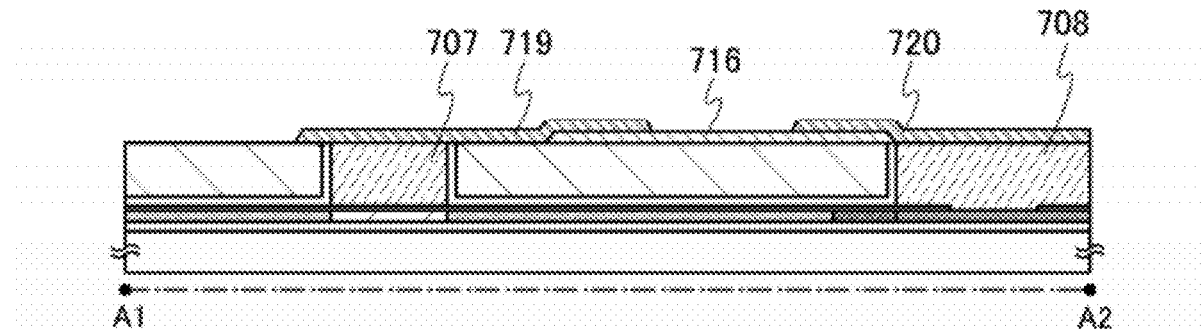
FIGS. 17A to 17C illustrate a method for manufacturing a memory device.

Then, as illustrated in FIG. 17A, the conductive film 719 which is in contact with the gate electrode 707 and the oxide semiconductor film 716, and the conductive film 720 which is in contact with the conductive film 708 and the oxide semiconductor film 716 are formed. The conductive films 719 and 720 function as a source and drain electrodes.

Specifically, the conductive films 719 and 720 can be formed in such a manner that a conductive film is formed so as to cover the gate electrode 707 and the conductive film 708 by a sputtering method or a vacuum vapor deposition method and then is processed (patterned) into a predetermined shape.

As the conductive film which serves as the conductive films 719 and 720, any of the following materials can be used: an element selected from aluminum, chromium, copper, tantalum, titanium, molybdenum, or tungsten; an alloy containing any of these elements; an alloy film containing the above elements in combination; and the like. Alternatively, a structure may be employed in which a film of a refractory metal such as chromium, tantalum, titanium, molybdenum, or tungsten is stacked over or below a metal film of aluminum or copper. Aluminum or copper is preferably used in combination with a refractory metal material in order to avoid problems with heat resistance and corrosion. As the refractory metal material, molybdenum, titanium, chromium, tantalum, tungsten, neodymium, scandium, yttrium, or the like can be used.

Further, the conductive film which serves as the conductive films 719 and 720 may have a single-layer structure or a layered structure of two or more layers. For example, a single-layer structure of an aluminum film containing silicon, a two-layer structure in which a titanium film is stacked over an aluminum film, a three-layer structure in which a titanium film, an aluminum film, and a titanium film are stacked in that order, and the like can be given. A Cu—Mg—Al alloy, a Cu—Mg—O alloy, a Cu—Ca—O alloy, a Cu—Mg—Al—O alloy, a Mo—Ti alloy, Ti, and Mo have high adhesiveness with an oxide film. Therefore, for the conductive films 719 and 720, a layered structure is employed in which a conductive film including a Cu—Mg—Al alloy, a Cu—Mg—O alloy, a Cu—Ca—O alloy, a Cu—Mg—Al—O alloy, a Mo—Ti alloy, Ti, or Mo is used for the lower layer and a conductive film including Cu, which has a low resistance value, is used for the upper layer; thus, the adhesiveness between an insulating film which is an oxide film and the conductive films 719 and 720 can be increased, and the resistance value of each of the conductive film 719 and the conductive film 720 can be reduced.

For the conductive film which serves as the conductive films 719 and 720, a conductive metal oxide may be used. As the conductive metal oxide, indium oxide, tin oxide, zinc oxide, a mixture of indium oxide and tin oxide, a mixture of indium oxide and zinc oxide, or the conductive metal oxide material containing silicon or silicon oxide can be used.

In the case where heat treatment is performed after formation of the conductive film, the conductive film preferably has heat resistance enough to withstand the heat treatment.

Note that each material and etching conditions are adjusted as appropriate so that the oxide semiconductor film 716 is not removed as much as possible at the time of etching the conductive film. Depending on the etching conditions, an exposed portion of the oxide semiconductor film 716 is partly etched, so that a groove (a depression portion) is formed in some cases.

In this embodiment, a titanium film is used for the conductive film. Therefore, wet etching can be selectively performed on the conductive film using a solution (an ammonia hydrogen peroxide mixture) containing ammonia and hydrogen peroxide water. As the ammonia hydrogen peroxide mixture, specifically, a solution in which hydrogen peroxide water of 31 wt %, ammonia water of 28 wt %, and water are mixed at a volume ratio of 5:2:2 is used. Alternatively, dry etching may be performed on the conductive film with the use of a gas containing chlorine ($Cl_2$), boron chloride ($BCl_3$), or the like.

In order to reduce the number of photomasks and steps in a photolithography step, etching may be performed with the use of a resist mask formed using a multi-tone mask which is a light-exposure mask through which light is transmitted so as to have a plurality of intensities. A resist mask formed using a multi-tone mask has a plurality of thicknesses and can be changed in shape by etching; thus, the resist mask can be used in a plurality of etching processes for processing films into different patterns. Therefore, a resist mask corresponding to at least two kinds or more of different patterns can be formed by one multi-tone mask. Thus, the number of light-exposure masks can be reduced and the number of corresponding photolithography steps can be also reduced, whereby simplification of a process can be realized.

Further, an oxide conductive film functioning as a source region and a drain region may be provided between the oxide semiconductor film 716 and the conductive films 719 and 720 functioning as source and drain electrodes. The material of the oxide conductive film preferably contains zinc oxide as a component and preferably does not contain indium oxide. For such an oxide conductive film, zinc oxide, zinc aluminum oxide, zinc aluminum oxynitride, gallium zinc oxide, or the like can be used.

For example, in the case where the oxide conductive film is formed, patterning for forming the oxide conductive film and patterning for forming the conductive films 719 and 720 may be performed concurrently.

With provision of the oxide conductive film functioning as a source region and a drain region, resistance between the oxide semiconductor film 716 and the conductive films 719 and 720 can be lowered, so that the transistor can operate at high speed. In addition, with provision of the oxide conductive film functioning as a source region and a drain region, the withstand voltage of the transistor can be increased.

Next, plasma treatment may be performed using a gas such as $N_2O$, $N_2$, or Ar. By this plasma treatment, water or the like adhering to an exposed surface of the oxide semiconductor film is removed. Plasma treatment may be performed using a mixture gas of oxygen and argon as well.

Figure 18B:
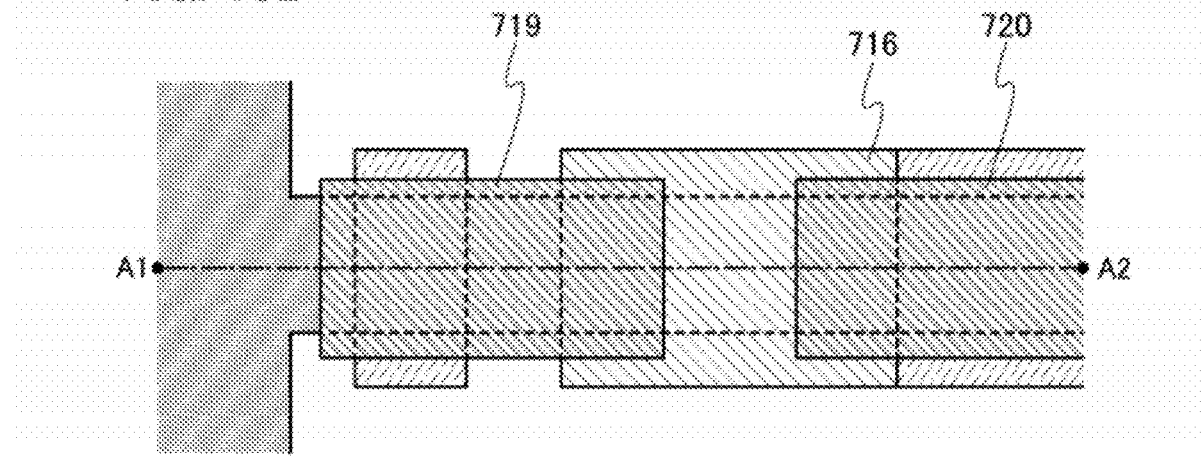

Note that FIG. 18B is a top view of the memory cell at the time when the above steps are finished. A cross-sectional view taken along dashed line A1-A2 in FIG. 18B corresponds to FIG. 17A.

Figure 17B:
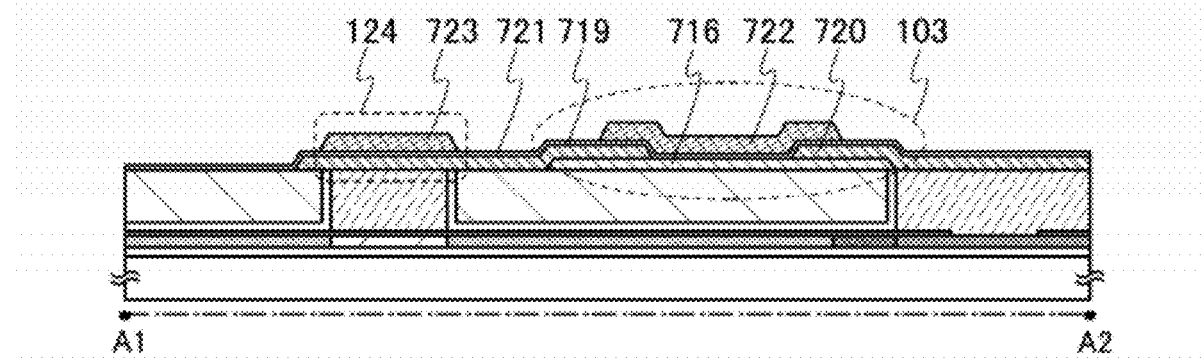

After the plasma treatment, as illustrated in FIG. 17B, the gate insulating film 721 is formed so as to cover the conductive films 719 and 720 and the oxide semiconductor film 716. Then, a gate electrode 722 is formed over the gate insulating film 721 so as to overlap with the oxide semiconductor film 716, and a conductive film 723 is formed over the conductive film 719 so as to overlap with the conductive film 719.

The gate insulating film 721 can be formed using a material and a layered structure which are similar to those of the gate insulating film 703. Note that the gate insulating film 721 preferably contains impurities such as moisture or hydrogen as little as possible, and the gate insulating film 721 may be formed using a single-layer insulating film or a plurality of stacked insulating films. When hydrogen is contained in the gate insulating film 721, hydrogen enters the oxide semiconductor film 716 or oxygen in the oxide semiconductor film 716 is extracted by hydrogen, whereby the oxide semiconductor film 716 has lower resistance (n-type conductivity); thus, a parasitic channel might be formed. Thus, it is important that a deposition method in which hydrogen is not used be employed in order to form the gate insulating film 721 containing hydrogen as little as possible. A material having a high barrier property is preferably used for the gate insulating film 721. As the insulating film having a high barrier property, a silicon nitride film, a silicon nitride oxide film, an aluminum nitride film, an aluminum nitride oxide film, or the like can be used, for example. When a plurality of insulating films stacked are used, an insulating film having low proportion of nitrogen such as a silicon oxide film or a silicon oxynitride film is formed on a side which is closer to the oxide semiconductor film 716 than the insulating film having a high barrier property. Then, the insulating film having a high barrier property is formed so as to overlap with the conductive films 719 and 720 and the oxide semiconductor film 716 with the insulating film having low proportion of nitrogen sandwiched therebetween. When the insulating film having a high barrier property is used, impurities such as moisture or hydrogen can be prevented from entering the oxide semiconductor film 716, the gate insulating film 721, and/or the interface between the oxide semiconductor film 716 and another insulating film and the vicinity thereof. In addition, the insulating film having low proportion of nitrogen, such as a silicon oxide film or a silicon oxynitride film, is formed so as to be in contact with the oxide semiconductor film 716, so that the insulating film having a high barrier property can be prevented from being in direct contact with the oxide semiconductor film 716.

In this embodiment, the gate insulating film 721 with a structure in which a silicon nitride film with a thickness of 100 nm formed by sputtering is stacked over a silicon oxide film with a thickness of 200 nm formed by a sputtering method is formed. The substrate temperature at deposition may be higher than or equal to room temperature and lower than or equal to 300° C. and in this embodiment, is 100° C.

After the gate insulating film 721 is formed, heat treatment may be performed. The heat treatment is performed in a nitrogen atmosphere, ultra-dry air, or a rare gas (e.g., argon or helium) atmosphere preferably at a temperature higher than or equal to 200° C. and lower than or equal to 400° C., for example, higher than or equal to 250° C. and lower than or equal to 350° C. It is preferable that the water content in the gas is 20 ppm or less, preferably 1 ppm or less, further preferably 10 ppb or less. In this embodiment, for example, heat treatment is performed at 250° C. in a nitrogen atmosphere for one hour. Alternatively, RTA treatment for a short time at a high temperature may be performed before the formation of the conductive films 719 and 720 in a manner similar to that of the heat treatment performed on the oxide semiconductor film for reduction of moisture or hydrogen. Even when oxygen defects are generated in the oxide semiconductor film 716 by the heat treatment performed on the oxide semiconductor film 716 by performing heat treatment after provision of the gate insulating film 721 containing oxygen, oxygen is supplied to the oxide semiconductor film 716 from the gate insulating film 721. By the supply of oxygen to the oxide semiconductor film 716, oxygen defects that serve as donors can be reduced in the oxide semiconductor film 716 and the stoichiometric composition can be satisfied. The oxide semiconductor film 716 preferably contains oxygen whose composition exceeds the stoichiometric composition. As a result, the oxide semiconductor film 716 can be made to be substantially i-type and variations in electrical characteristics of the transistor due to oxygen defects can be reduced; thus, electrical characteristics can be improved. The timing of this heat treatment is not particularly limited as long as it is after the formation of the gate insulating film 721. When this heat treatment serves as heat treatment in another step (e.g., heat treatment at the time of formation of a resin film or heat treatment for lowering the resistance of a transparent conductive film), the oxide semiconductor film 716 can be made to be substantially i-type without the increase in the number of steps.

Alternatively, the oxygen defects that serve as donors in the oxide semiconductor film 716 may be reduced by subjecting the oxide semiconductor film 716 to heat treatment in an oxygen atmosphere so that oxygen is added to the oxide semiconductor. The heat treatment is performed, for example, at a temperature higher than or equal to 100° C. and lower than 350° C., preferably higher than or equal to 150° C. and lower than 250° C. It is preferable that an oxygen gas used for the heat treatment under an oxygen atmosphere do not include water, hydrogen, or the like. Alternatively, the purity of the oxygen gas which is introduced into the heat treatment apparatus is preferably greater than or equal to 6N (99.9999%) or more, further preferably greater than or equal to 7N (99.99999%) (that is, the impurity concentration in the oxygen gas is less than or equal to 1 ppm, preferably less than or equal to 0.1 ppm).

Alternatively, oxygen may be added to the oxide semiconductor film 716 by an ion implantation method, an ion doping method, or the like so that oxygen defects that serve as donors are reduced. For example, oxygen made to be plasma with a microwave of 2.45 GHz may be added to the oxide semiconductor film 716.

The gate electrode 722 and the conductive film 723 can be formed in such a manner that a conductive film is formed over the gate insulating film 721 and then is patterned. The gate electrode 722 and the conductive film 723 can be formed using a material and a layered structure which are similar to those of the gate electrode 707 and the conductive films 719 and 720.

The thickness of each of the gate electrode 722 and the conductive film 723 is 10 nm to 400 nm, preferably 100 nm to 200 nm. In this embodiment, after a conductive film with a thickness of 150 nm for the gate electrode is formed by a sputtering method using a tungsten target, the conductive film is processed (patterned) into a desired shape by etching, whereby the gate electrode 722 and the conductive film 723 are formed. Note that a resist mask may be formed by an inkjet method. Formation of the resist mask by an inkjet method needs no photomask; thus, manufacturing cost can be reduced.

Through the above steps, the transistor 103 is formed.

Note that a portion where the conductive film 719 and the conductive film 723 overlap with each other with the gate insulating film 721 provided therebetween corresponds to the capacitor 124.

Figure 18C:
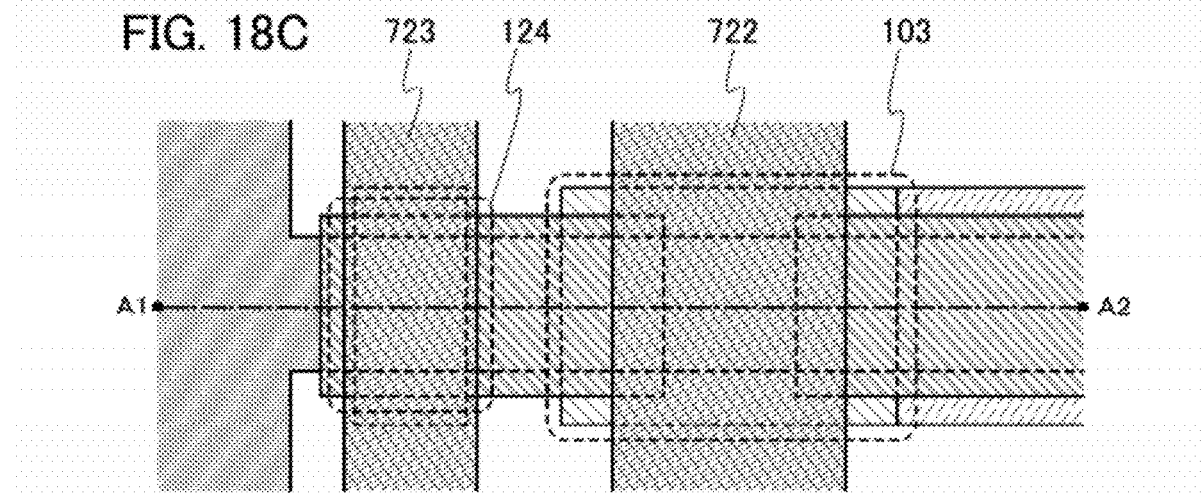

Note that FIG. 18C is a top view of the memory cell at the time when the above steps are finished. A cross-sectional view taken along dashed line A1-A2 in FIG. 18C corresponds to FIG. 17B.

Although the transistor 103 is described as a single-gate transistor, a multi-gate transistor including a plurality of channel formation regions can be formed when a plurality of gate electrodes which are connected is included when needed.

Note that an insulating film which is in contact with the oxide semiconductor film 716 (in this embodiment, corresponding to the gate insulating film 721) may be formed using an insulating material containing an element that belongs to Group 13 and oxygen. Many oxide semiconductor materials contain an element that belongs to Group 13, and an insulating material containing an element that belongs to Group 13 works well with an oxide semiconductor. By using such an insulating material containing an element that belongs to Group 13 for the insulating film in contact with the oxide semiconductor film, an interface with the oxide semiconductor film can keep a favorable state.

An insulating material containing an element that belongs to Group 13 refers to an insulating material containing one or more elements that belong to Group 13. As the insulating material containing an element that belongs to Group 13, a gallium oxide, an aluminum oxide, an aluminum gallium oxide, a gallium aluminum oxide, and the like are given. Here, aluminum gallium oxide refers to a material in which the amount of aluminum is larger than that of gallium in atomic percent, and gallium aluminum oxide refers to a material in which the amount of gallium is larger than or equal to that of aluminum in atomic percent.

For example, in the case of forming an insulating film in contact with an oxide semiconductor film containing gallium, a material containing gallium oxide may be used as an insulating film, so that favorable characteristics can be kept at the interface between the oxide semiconductor film and the insulating film. When the oxide semiconductor film and the insulating film containing gallium oxide are provided in contact with each other, pileup of hydrogen at the interface between the oxide semiconductor film and the insulating film can be reduced, for example. Note that a similar effect can be obtained in the case where an element in the same group as a constituent element of the oxide semiconductor is used in an insulating film. For example, it is effective to form an insulating film with the use of a material containing aluminum oxide. Note that aluminum oxide has a property of not easily transmitting water. Thus, it is preferable to use a material containing aluminum oxide in terms of preventing entry of water to the oxide semiconductor film.

The insulating film which is in contact with the oxide semiconductor film 716 preferably contains oxygen in a proportion higher than that in the stoichiometric composition, by heat treatment in an oxygen atmosphere or oxygen doping. "Oxygen doping" refers to addition of oxygen into a bulk. Note that the term "bulk" is used in order to clarify that oxygen is added not only to a surface of a thin film but also to the inside of the thin film. In addition, "oxygen doping" includes "oxygen plasma doping" in which oxygen which is made to be plasma is added to a bulk. The oxygen doping may be performed by ion implantation or ion doping.

For example, in the case where the insulating film which is in contact with the oxide semiconductor film 716 is formed using gallium oxide, the composition of gallium oxide can be set to be $Ga_2O_X$ ($X=3+\alpha$, $0<\alpha<1$) by heat treatment in an oxygen atmosphere or oxygen doping.

In the case where the insulating film which is in contact with the oxide semiconductor film 716 is formed using aluminum oxide, the composition of aluminum oxide can be set to be $Al_2O_X$ ($X=3+\alpha$, $0<\alpha<1$) by heat treatment in an oxygen atmosphere or oxygen doping.

In the case where the insulating film which is in contact with the oxide semiconductor film 716 is formed using gallium aluminum oxide (aluminum gallium oxide), the composition of gallium aluminum oxide (aluminum gallium oxide) can be set to be $Ga_XAl_{2-X}O_{3+\alpha}$ ($0<X<2$, $0<\alpha<1$) by heat treatment in an oxygen atmosphere or oxygen doping.

By oxygen doping, an insulating film which includes a region where the proportion of oxygen is higher than that in the stoichiometric composition can be formed. When the insulating film including such a region is in contact with the oxide semiconductor film, oxygen that exists excessively in the insulating film is supplied to the oxide semiconductor film, and oxygen deficiency in the oxide semiconductor film or at the interface between the oxide semiconductor film and the insulating film is reduced. Thus, the oxide semiconductor film can be made to be i-type or substantially i-type.

The insulating film including a region where the proportion of oxygen is higher than that in the stoichiometric composition may be applied to either the insulating film placed on an upper side of the oxide semiconductor film or the insulating film placed on a lower side of the oxide semiconductor film of the insulating films which are in contact with the oxide semiconductor film 716; however, it is preferable to apply such an insulating film to both the insulating films which are in contact with the oxide semiconductor film 716. The above effect can be enhanced with a structure where the oxide semiconductor film 716 is provided between the insulating films each including a region where the proportion of oxygen is higher than that in the stoichiometric composition, which are used as the insulating films in contact with the oxide semiconductor film 716 and positioned on the upper side and the lower side of the oxide semiconductor film 716.

The insulating films on the upper side and the lower side of the oxide semiconductor film 716 may contain the same constituent element or different constituent elements. For example, the insulating films on the upper side and the lower side may be both formed of gallium oxide whose composition is $Ga_2O_X$ ($X=3+\alpha$, $0<\alpha<1$). Alternatively, one of the insulating films on the upper side and the lower side may be formed of $Ga_2O_X$ ($X=3+\alpha$, $0<\alpha<1$) and the other may be formed of aluminum oxide whose composition is $Al_2O_X$ ($X=3+\alpha$, $0<\alpha<1$).

The insulating film which is in contact with the oxide semiconductor film 716 may be formed by a stack of insulating films each including a region where the proportion of oxygen is higher than that in the stoichiometric composition. For example, the insulating film on the upper side of the oxide semiconductor film 716 may be formed as follows: gallium oxide whose composition is $Ga_2O_X$ ($X=3+\alpha$, $0<\alpha<1$) is formed and gallium aluminum oxide (aluminum gallium oxide) whose composition is $Ga_XAl_{2-X}O_{3+\alpha}$ ($0<X<2$, $0<\alpha<1$) may be formed thereover. Note that the insulating film on the lower side of the oxide semiconductor film 716 may be formed by a stack of insulating films each including a region where the proportion of oxygen is higher than that in the stoichiometric composition. Alternatively, both the insulating films on the upper side and the lower side of the oxide semiconductor film 716 may be formed by a stack of insulating films each including a region where the proportion of oxygen is higher than that in the stoichiometric composition.

Figure 17C:
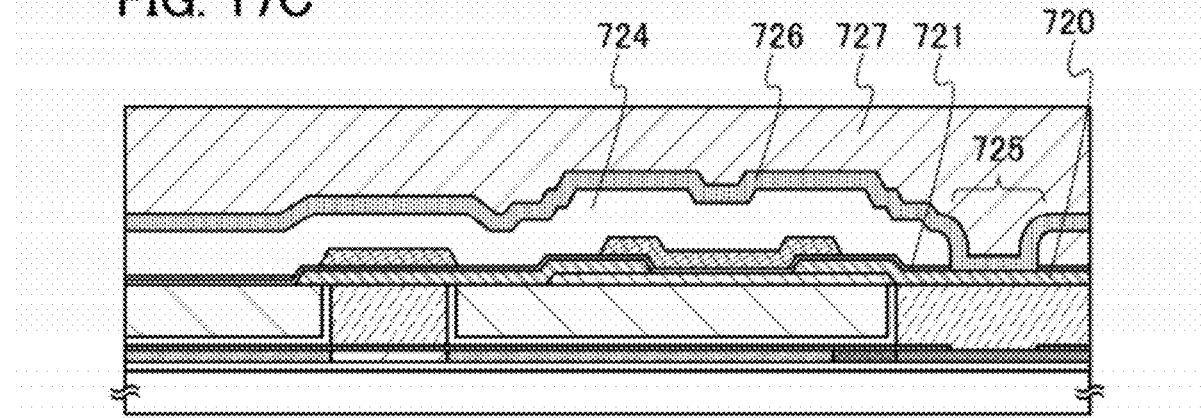

Next, as illustrated in FIG. 17C, an insulating film 724 is formed so as to cover the gate insulating film 721, the conductive film 723, and the gate electrode 722. The insulating film 724 can be formed by PVD, CVD, or the like. The insulating film 724 can be formed using a material including an inorganic insulating material such as silicon oxide, silicon oxynitride, silicon nitride, hafnium oxide, gallium oxide, or aluminum oxide. Note that for the insulating film 724, a material with a low dielectric constant or a structure with a low dielectric constant (e.g., a porous structure) is preferably used. When the dielectric constant of the insulating film 724 is lowered, parasitic capacitance generated between wirings or electrodes can be reduced, which results in higher speed operation. Note that although the insulating film 724 has a single-layer structure in this embodiment, one embodiment of the present invention is not limited to this structure. The insulating film 724 may have a layered structure of two or more layers.

Next, an opening 725 is formed in the gate insulating film 721 and the insulating film 724, so that part of the conductive film 720 is exposed. After that, a wiring 726 which is in contact with the conductive film 720 through the opening 725 is formed over the insulating film 724.

A conductive film is formed by PVD or CVD and then is patterned, so that the wiring 726 is formed. As the material of the conductive film, an element selected from aluminum, chromium, copper, tantalum, titanium, molybdenum, or tungsten; an alloy containing any of these elements as a component; or the like can be used. A material containing one of manganese, magnesium, zirconium, beryllium, neodymium, and scandium or a combination of any of these elements may be used.

Specifically, for example, it is possible to employ a method in which a thin titanium film (with a thickness of about 5 nm) is formed in a region including the opening of the insulating film 724 by a PVD method and then, an aluminum film is formed so as to be embedded in the opening 725. Here, the titanium film formed by a PVD method has a function of reducing an oxide film (e.g., a native oxide film) formed on a surface over which the titanium film is formed, to decrease the contact resistance with the lower electrode or the like (here, the conductive film 720). In addition, hillock of aluminum film can be prevented. A copper film may be formed by a plating method after the formation of the barrier film of titanium, titanium nitride, or the like.

The opening 725 formed in the insulating film 724 is preferably formed in a region overlapping with the conductive film 708. With provision of the opening 725 in such a region, the increase in element area due to a contact region can be prevented.

Here, the case where a connection position of the impurity region 704 and the conductive film 720 and a connection position of the conductive film 720 and the wiring 726 overlap with each other without the use of the conductive film 708 is described. In that case, an opening (also referred to as an opening in a lower portion) is formed in the insulating films 712 and 713 which are formed over the impurity region 704, and the conductive film 720 is formed so as to cover the opening in the lower portion. After that, an opening (also referred to as an opening in an upper portion) is formed in the gate insulating film 721 and the insulating film 724 in a region overlapping with the opening in the lower portion, and the wiring 726 is formed. When the opening in the upper portion is formed in the region overlapping with the opening in the lower portion, the conductive film 720 formed in the opening in the lower portion might be disconnected by etching. In order to avoid the disconnection, the openings in the lower portion and in the upper portion are formed so as not to overlap with each other, so that a problem of the increase in element area occurs.

As described in this embodiment, with the use of the conductive film 708, the opening in the upper portion can be formed without disconnection of the conductive film 720. Thus, the openings in the lower portion and in the upper portion can be formed so as to overlap with each other, so that the increase in element area due to the openings can be suppressed. In short, the integration degree of a semiconductor device can be increased.

Next, an insulating film 727 is formed so as to cover the wiring 726. Through the series of steps, the memory device can be manufactured.

Note that in the manufacturing method, the conductive films 719 and 720 functioning as source and drain electrodes are formed after the formation of the oxide semiconductor film 716. Thus, as illustrated in FIG. 17B, in the transistor 103 obtained by the manufacturing method, the conductive films 719 and 720 are formed over the oxide semiconductor film 716. However, in the transistor 103, the conductive films functioning as source and drain electrodes may be formed below the oxide semiconductor film 716, that is, between the oxide semiconductor film 716 and the insulating films 712 and 713.

Figure 19:
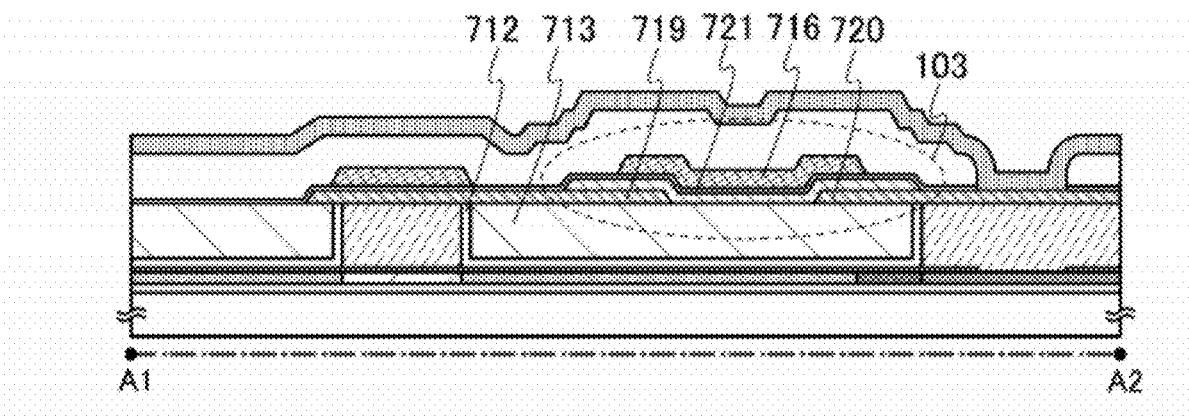
FIG. 19 is a cross-sectional view of a memory cell.

FIG. 19 illustrates a cross-sectional view of a memory cell at the time when the conductive films 719 and 720 functioning as source and drain electrodes are provided between the oxide semiconductor film 716 and the insulating films 712 and 713. The transistor 103 illustrated in FIG. 19 can be obtained in such a manner that the conductive films 719 and 720 are formed after the formation of the insulating film 713, and then, the oxide semiconductor film 716 is formed.

This embodiment can be implemented in appropriate combination with any of the above embodiments.

Embodiment 5

The actually measured field-effect mobility of an insulated gate transistor can be lower than its original mobility because of a variety of reasons; this phenomenon occurs not only in the case of using an oxide semiconductor. One of the reasons that reduce the mobility is a defect inside a semiconductor or a defect at an interface between the semiconductor and an insulating film. When a Levinson model is used, the field-effect mobility on the assumption that no defect exists inside the semiconductor can be calculated theoretically.

Assuming that the original mobility and the measured field-effect mobility of a semiconductor are $\mu_0$ and $\mu$, respectively, and a potential barrier (such as a grain boundary) exists in the semiconductor, $\mu$ can be expressed as Formula 2 shown below.

[Formula 2]

$$\mu = \mu_0 \exp\left(-\frac{E}{kT}\right) \quad \text{(Formula 2)}$$

Here, E represents the height of the potential barrier, k represents the Boltzmann constant, and T represents the absolute temperature. When the potential barrier is assumed to be attributed to a defect, E can be expressed as Formula 3 shown below according to the Levinson model.

[Formula 3]

$$E = \frac{e^2 N^2}{8\varepsilon n} = \frac{e^3 N^2 t}{8\varepsilon C_{ox} V_g} \quad \text{(Formula 3)}$$

Here, e represents the elementary charge, N represents the average defect density per unit area in a channel formation region, $\in$ represents the permittivity of the semiconductor, n represents the number of carriers per unit area in the channel formation region, $C_{ox}$ represents the capacitance per unit area, $V_g$ represents the gate voltage, and t represents the thickness of the channel formation region. In the case where the thickness of the semiconductor film is less than or equal to 30 nm, the thickness of the channel formation region may be regarded as being the same as the thickness of the semiconductor film. The drain current $I_d$ in a linear region can be expressed as Formula 3 shown below.

[Formula 4]

$$I_d = \frac{W \mu V_g V_d C_{ox}}{L} \exp\left(-\frac{E}{kT}\right) \quad \text{(Formula 4)}$$

L represents the channel length and W represents the channel width, and L and W are each 10 µm. In addition, $V_d$ represents the drain voltage. When dividing both sides of the above formula by $V_g$ and then taking logarithms of both sides, Formula 5 shown below can be obtained.

[Formula 5]

$$\ln\left(\frac{I_d}{V_g}\right) = \ln\left(\frac{W\mu V_d C_{ox}}{L}\right) - \frac{E}{kT} = \ln\left(\frac{W\mu V_d C_{ox}}{L}\right) - \frac{e^3 N^2 t}{8kT\varepsilon C_{ox}V_g} \quad \text{(Formula 5)}$$

The right side of Formula 5 is a function of $V_g$. From Formula 5, it is found that the defect density N can be obtained from the slope of a line in a graph that is obtained by plotting actual measured values with $\ln(I_d/V_g)$ as the ordinate and $1/V_g$ as the abscissa. That is, the defect density can be evaluated from the $I_d$-$V_g$ characteristics of the transistor. The defect density N of an oxide semiconductor in which the ratio of indium (In), tin (Sn), and zinc (Zn) is 1:1:1 is approximately $1\times10^{12}/\text{cm}^2$.

On the basis of the defect density obtained in this manner, or the like, $\mu_0$ can be calculated to be 120 cm²/Vs from Formula 2 and Formula 3. The measured mobility of an In—Sn—Zn-based oxide including a defect is approximately 35 cm²/Vs. However, assuming that no defect exists inside the semiconductor and at the interface between the semiconductor and an insulating film, the mobility $\mu_0$ of the oxide semiconductor is expected to be 120 cm²/Vs.

Note that even when no defect exists inside a semiconductor, scattering at an interface between a channel formation region and a gate insulating film affects the transport property of the transistor. In other words, the mobility $\mu_1$ at a position that is distance x away from the interface between the channel formation region and the gate insulating film can be expressed as Formula 6 shown below.

[Formula 6]

$$\frac{1}{\mu_1} = \frac{1}{\mu_0} + \frac{D}{B}\exp\left(-\frac{x}{G}\right) \quad \text{(Formula 6)}$$

Here, D represents the electric field in the gate direction, and B and G are constants. B and G can be obtained from actual measurement results; according to the above measurement results, B is $4.75\times10^7$ cm/s and G is 10 nm (the depth to which the influence of interface scattering reaches). When D is increased (i.e., when the gate voltage is increased), the second term of Formula 6 is increased and accordingly the mobility $\mu_1$ is decreased.

Figure 24:
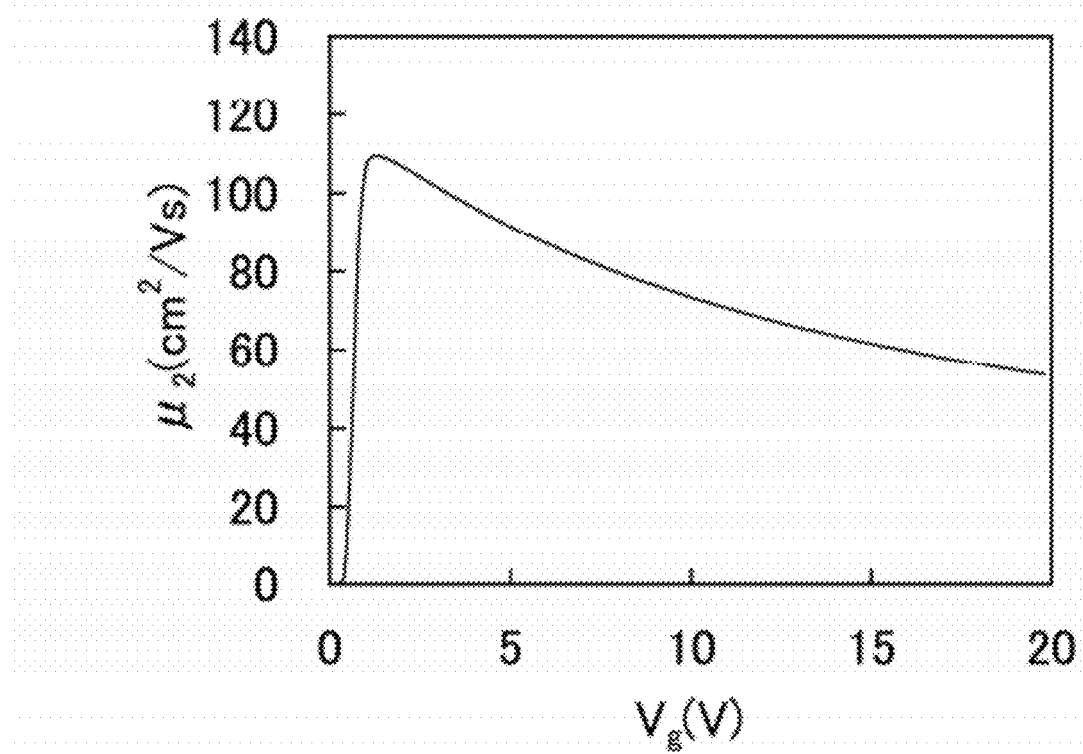
FIG. 24 is a graph showing the gate voltage dependence of mobility obtained by calculation.

Calculation results of the mobility $\mu_2$ of a transistor whose channel formation region includes an ideal oxide semiconductor without a defect inside the semiconductor are shown in FIG. 24. For the calculation, device simulation software Sentaurus Device manufactured by Synopsys, Inc. was used, and the bandgap, the electron affinity, the relative permittivity, and the thickness t of the oxide semiconductor were assumed to be 2.8 eV, 4.7 eV, 15, and 15 nm, respectively. These values were obtained by measurement of a thin film that was formed by a sputtering method.

Further, the work functions of a gate electrode, a source electrode, and a drain electrode were assumed to be 5.5 eV, 4.6 eV, and 4.6 eV, respectively. The thickness of a gate insulating film was assumed to be 100 nm, and the relative permittivity thereof was assumed to be 4.1. The channel length L and the channel width W were each assumed to be 10 μm, and the drain voltage $V_d$ was assumed to be 0.1 V.

As shown in FIG. 24, the mobility $\mu_2$ has a peak of more than 100 cm²/Vs at a gate voltage $V_g$ that is a little over 1 V and is decreased as the gate voltage $V_g$ becomes higher because the influence of interface scattering is increased.

Note that in order to reduce interface scattering, it is desirable that a surface of the semiconductor film is flat at the atomic level (atomic layer flatness).

Calculation results of characteristics of minute transistors which are manufactured using an oxide semiconductor having such a mobility are shown in FIGS. 25A to 25C, FIGS. 26A to 26C, and FIGS. 27A to 27C. FIGS. 28A and 28B illustrate cross-sectional structures of the transistors used for the calculation. The transistors illustrated in FIGS. 28A and 28B each include a semiconductor region 953a and a semiconductor region 953c which have n⁺-type conductivity in an oxide semiconductor film. The resistivities of the semiconductor region 953a and the semiconductor region 953c are $2\times10^{-3}$ Ωcm.

The transistor illustrated in FIG. 28A is formed over a base insulating film 951 and an embedded insulator 952 which is embedded in the base insulating film 951 and formed of aluminum oxide. The transistor includes the semiconductor region 953a, the semiconductor region 953c, an intrinsic semiconductor region 953b serving as a channel formation region therebetween, and a gate electrode 955. The width of the gate electrode 955 is 33 nm.

A gate insulating film 954 is formed between the gate electrode 955 and the semiconductor region 953b. In addition, a sidewall insulator 956a and a sidewall insulator 956b are formed on both side surfaces of the gate electrode 955, and an insulator 957 is formed over the gate electrode 955 so as to prevent a short circuit between the gate electrode 955 and another wiring. The sidewall insulator has a width of 5 nm. A source electrode 958a and a drain electrode 958b are provided in contact with the semiconductor region 953a and the semiconductor region 953c, respectively. Note that the channel width of this transistor is 40 nm.

The transistor of FIG. 28B is the same as the transistor of FIG. 28A in that it is formed over the base insulating film 951 and the embedded insulator 952 formed of aluminum oxide and that it includes the semiconductor region 953a, the semiconductor region 953c, the intrinsic semiconductor region 953b provided therebetween, the gate electrode 955 having a width of 33 nm, the gate insulating film 954, the sidewall insulator 956a, the sidewall insulator 956b, the insulator 957, the source electrode 958a, and the drain electrode 958b.

The transistor illustrated in FIG. 28A is different from the transistor illustrated in FIG. 28B in the conductivity type of semiconductor regions under the sidewall insulator 956a and the sidewall insulator 956b. In the transistor illustrated in FIG. 28A, the semiconductor regions under the sidewall insulator 956a and the sidewall insulator 956b are part of the semiconductor region 953a having n⁺-type conductivity and part of the semiconductor region 953c having n'-type conductivity, whereas in the transistor illustrated in FIG. 28B, the semiconductor regions under the sidewall insulator 956a and the sidewall insulator 956b are part of the intrinsic semiconductor region 953b. In other words, in the semiconductor layer of FIG. 28B, a region having a width of Loff which overlaps with neither the semiconductor region 953a (the semiconductor region 953c) nor the gate electrode 955 is provided. This region is called an offset region, and the width Loff is called an offset length. As is seen from the drawing, the offset length is equal to the width of the sidewall insulator 956a (the sidewall insulator 956b).

Figure 25A:
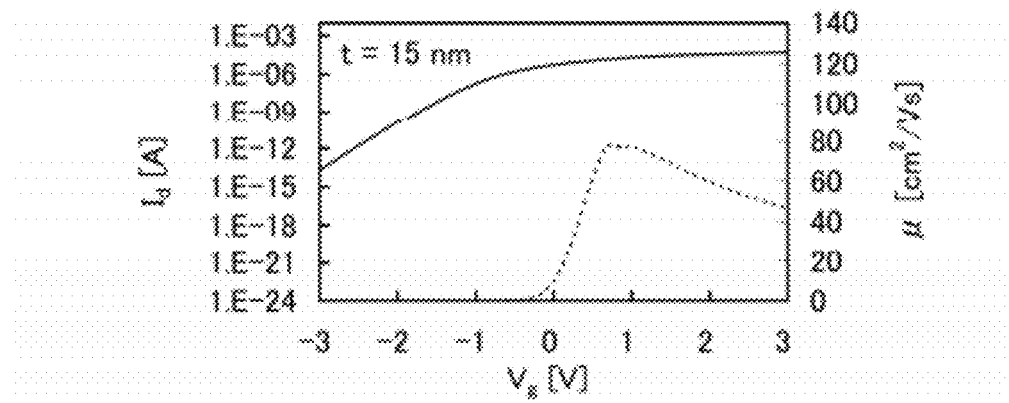
FIGS. 25A to 25C are graphs each showing the gate voltage dependence of drain current and mobility obtained by calculation.
Figure 25B:
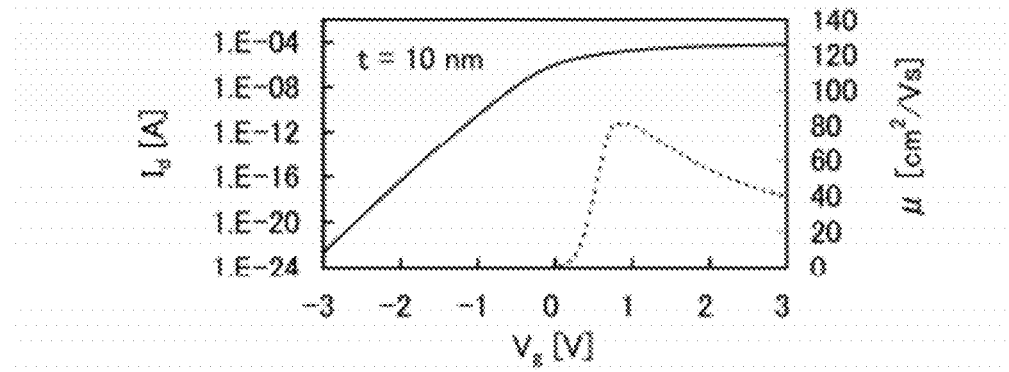
Figure 25C:
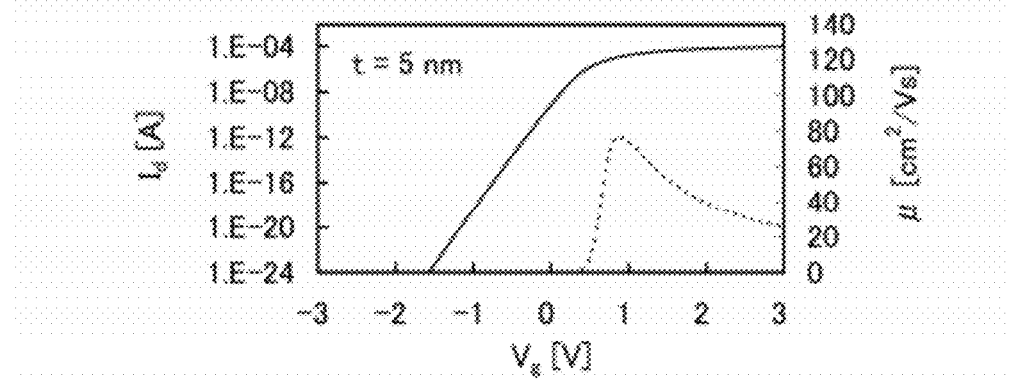

The other parameters used in calculation are as described above. For the calculation, device simulation software Sentaurus Device manufactured by Synopsys, Inc. was used. FIGS. 25A to 25C show the gate voltage ($V_g$: a potential difference between the gate electrode and the source electrode) dependence of the drain current ($I_d$, a solid line) and the mobility (μ, a dotted line) of the transistor having the structure illustrated in FIG. 28A. The drain current $I_d$ is obtained by calculation under the assumption that the drain voltage (a potential difference between the drain electrode and the source electrode) is +1 V and the mobility μ is obtained by calculation under the assumption that the drain voltage is +0.1 V.

FIG. 25A shows the gate voltage dependence of the transistor in the case where the thickness of the gate insulating film is 15 nm, FIG. 25B shows that of the transistor in the case where the thickness of the gate insulating film is 10 nm, and FIG. 25C shows that of the transistor in the case where the thickness of the gate insulating film is 5 nm As the gate insulating film is thinner, the drain current $I_d$ (off-state current) particularly in an off state is significantly decreased. In contrast, there is no noticeable change in the peak value of the mobility u and the drain current $I_d$ in an on state (on-state current). The graphs show that the drain current exceeds 10 μA, which is required in a memory element and the like, at a gate voltage of around 1 V.

Figure 26A:
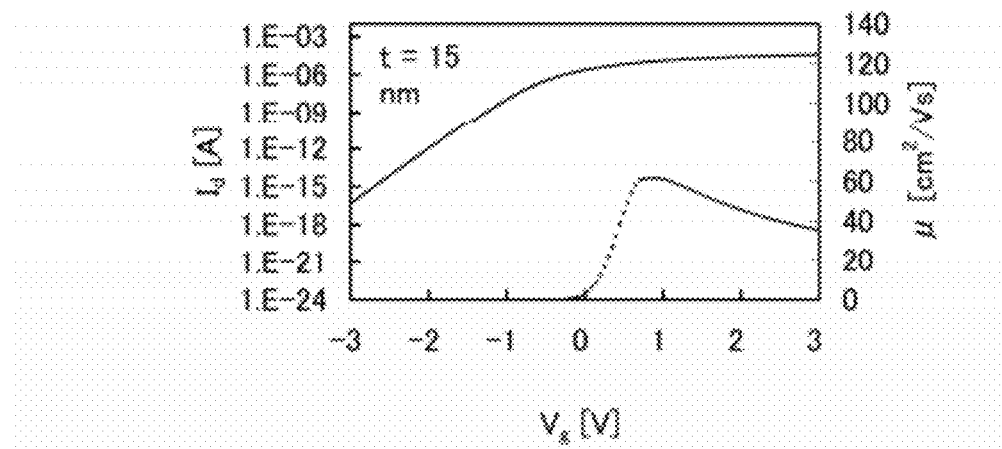
FIGS. 26A to 26C are graphs each showing the gate voltage dependence of drain current and mobility obtained by calculation.
Figure 26B:
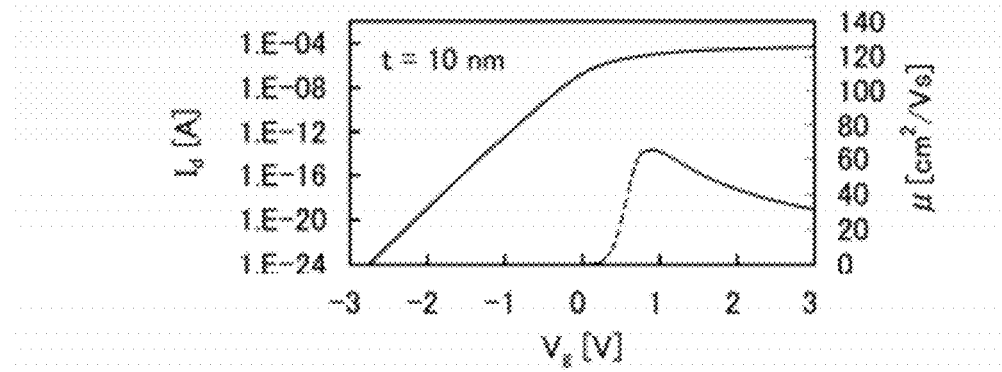
Figure 26C:
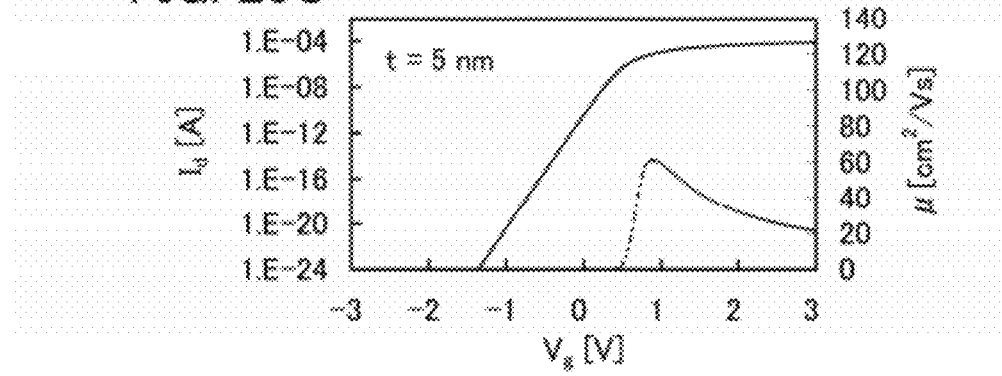

FIGS. 26A to 26C show the gate voltage $V_g$ dependence of the drain current $I_d$ (a solid line) and the mobility μ (a dotted line) of the transistor having the structure illustrated in FIG. 28B where the offset length Loff is 5 nm. The drain current $I_d$ is obtained by calculation under the assumption that the drain voltage is +1 V and the mobility μ is obtained by calculation under the assumption that the drain voltage is +0.1 V. FIG. 26A shows the gate voltage dependence of the transistor in the case where the thickness of the gate insulating film is 15 nm, FIG. 26B shows that of the transistor in the case where the thickness of the gate insulating film is 10 nm, and FIG. 26C shows that of the transistor in the case where the thickness of the gate insulating film is 5 nm.

Figure 27A:
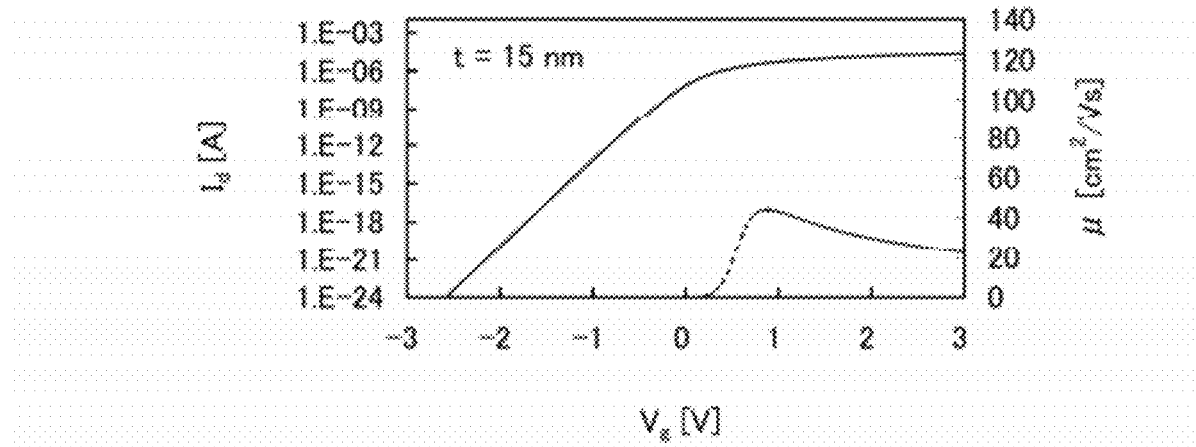
FIGS. 27A to 27C are graphs each showing the gate voltage dependence of drain current and mobility obtained by calculation.
Figure 27B:
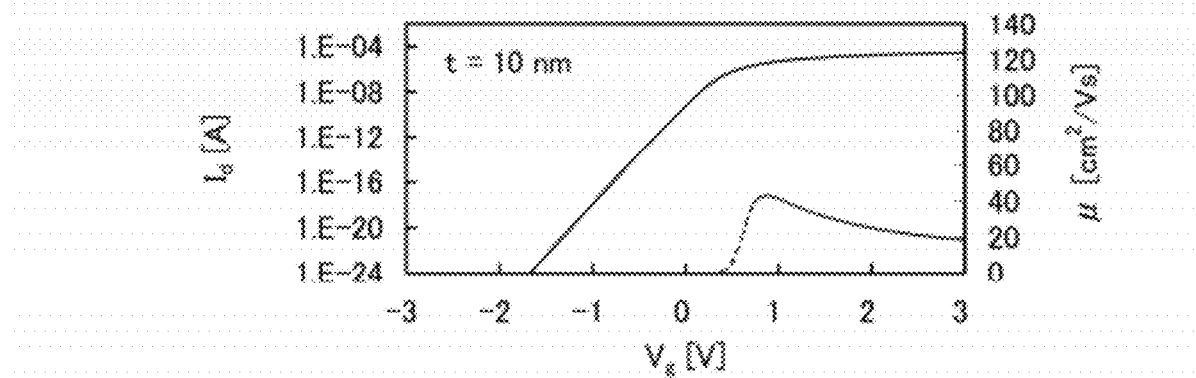
Figure 27C:
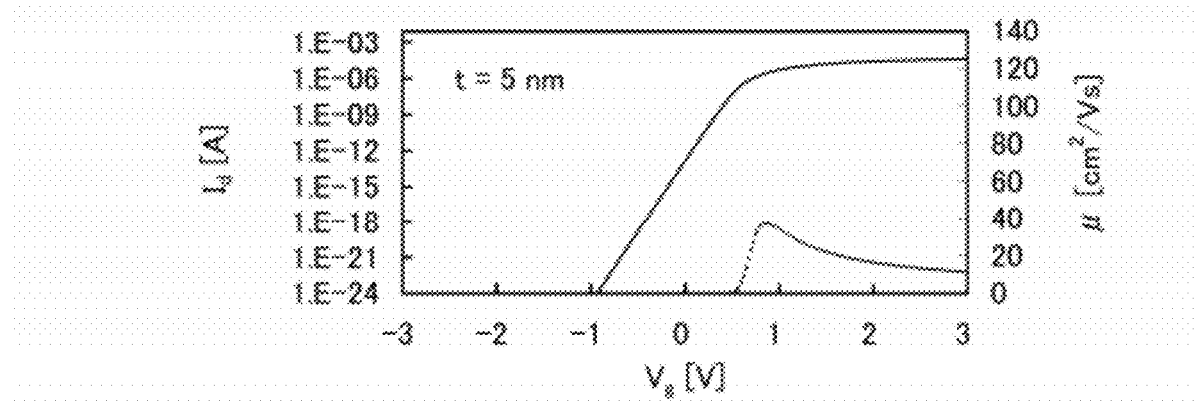

Further, FIGS. 27A to 27C show the gate voltage dependence of the drain current $I_d$ (a solid line) and the mobility μ (a dotted line) of the transistor having the structure illustrated in FIG. 28B where the offset length Loff is 15 nm. The drain current $I_d$ is obtained by calculation under the assumption that the drain voltage is +1 V and the mobility μ is obtained by calculation under the assumption that the drain voltage is +0.1 V. FIG. 27A shows the gate voltage dependence of the transistor in the case where the thickness of the gate insulating film is 15 nm, FIG. 27B shows that of the transistor in the case where the thickness of the gate insulating film is 10 nm, and FIG. 27C shows that of the transistor in the case where the thickness of the gate insulating film is 5 nm.

In either of the structures, as the gate insulating film is thinner, the off-state current is significantly decreased, whereas no noticeable change arises in the peak value of the mobility μ and the on-state current.

Note that the peak of the mobility μ is approximately 80 $cm^2/Vs$ in FIGS. 25A to 25C, approximately 60 $cm^2/Vs$ in FIGS. 26A to 26C, and approximately 40 $cm^2/Vs$ in FIGS. 27A to 27C; thus, the peak of the mobility μ is decreased as the offset length Loff is increased. Further, the same applies to the off-state current. The on-state current is also decreased as the offset length Loff is increased; however, the decrease in the on-state current is much more gradual than the decrease in the off-state current. Further, the graphs show that in either of the structures, the drain current exceeds 10 μA, which is required in a memory element and the like, at a gate voltage of around 1 V.

This embodiment can be implemented in appropriate combination with any of the above embodiments.

Embodiment 6

A transistor in which an oxide semiconductor containing In, Sn, and Zn as main components is used as a channel formation region can have favorable characteristics by depositing the oxide semiconductor while a substrate is heated or by performing heat treatment after an oxide semiconductor film is formed. Note that a main component refers to an element contained in composition at 5 atomic % or more.

By intentionally heating the substrate after formation of the oxide semiconductor film containing In, Sn, and Zn as main components, the field-effect mobility of the transistor can be improved. Further, the threshold voltage of the transistor can be positively shifted to make the transistor normally off.

Figure 29A:
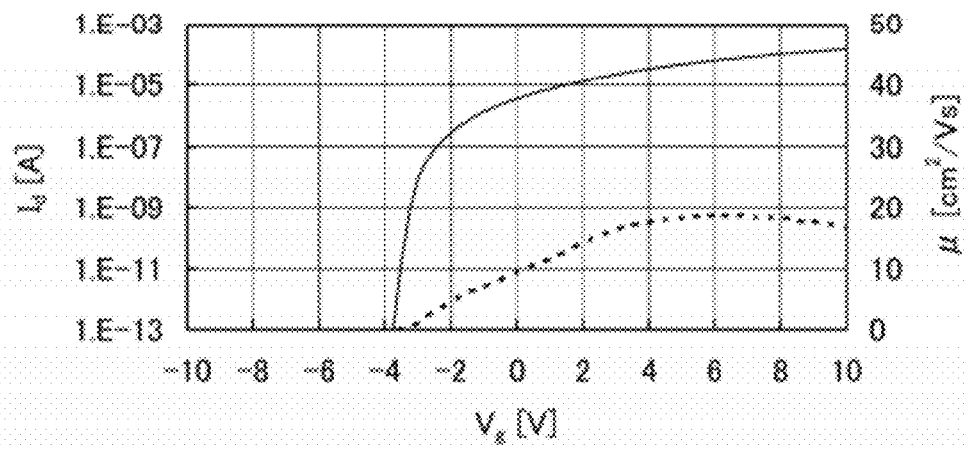
FIGS. 29A to 29C are graphs each showing characteristics of a transistor including an oxide semiconductor film.
Figure 29B:
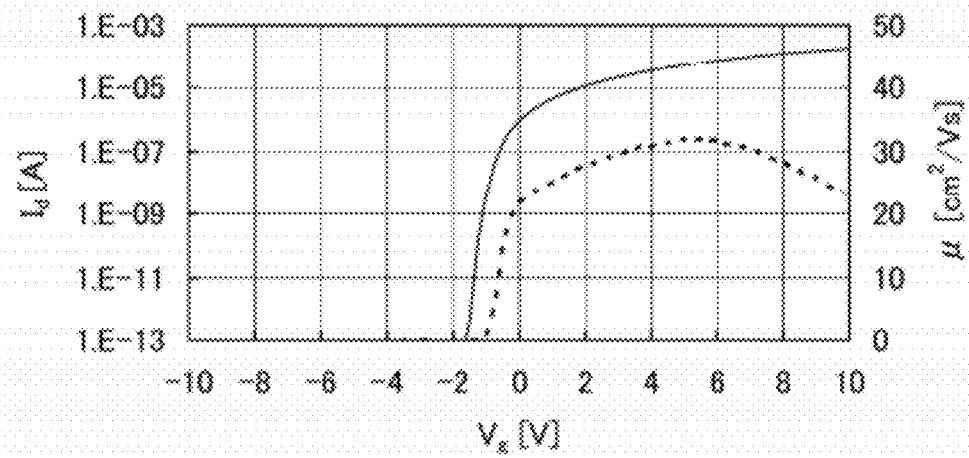
Figure 29C:
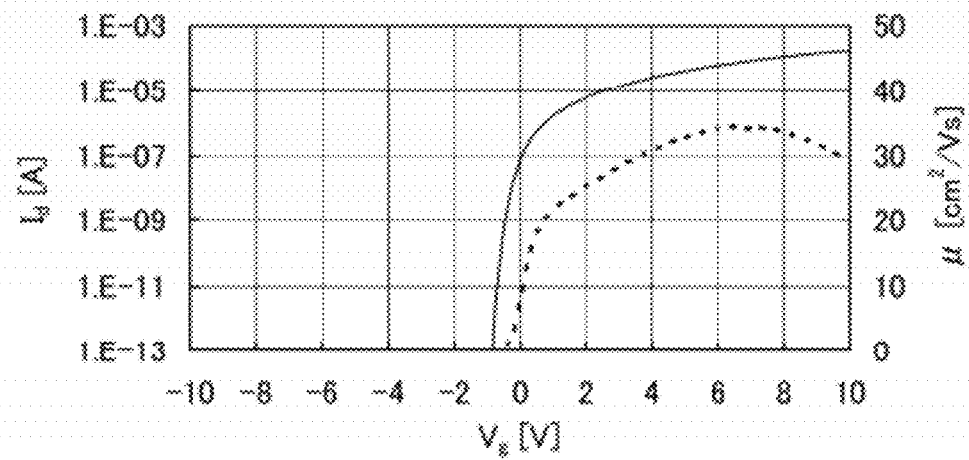

As an example, FIGS. 29A to 29C each show characteristics of a transistor that includes an oxide semiconductor film containing In, Sn, and Zn as main components and having a channel length L of 3 μm and a channel width W of 10 μm, and a gate insulating film with a thickness of 100 nm. Note that $V_d$ was set to 10 V.

FIG. 29A shows characteristics of a transistor whose oxide semiconductor film containing In, Sn, and Zn as main components was formed by a sputtering method without heating a substrate intentionally. The field-effect mobility of the transistor is 18.8 $cm^2/Vs$. On the other hand, when the oxide semiconductor film containing In, Sn, and Zn as main components is formed while heating the substrate intentionally, the field-effect mobility can be improved. FIG. 29B shows characteristics of a transistor whose oxide semiconductor film containing In, Sn, and Zn as main components was formed while a substrate is heated at 200° C. The field-effect mobility of the transistor is 32.2 $cm^2/Vs$.

The field-effect mobility can be further improved by performing heat treatment after formation of the oxide semiconductor film containing In, Sn, and Zn as main components. FIG. 29C shows characteristics of a transistor whose oxide semiconductor film containing In, Sn, and Zn as main components was formed by a sputtering method at 200° C. and then subjected to heat treatment at 650° C. The field-effect mobility of the transistor is 34.5 $cm^2/Vs$.

The intentional heating of the substrate is expected to have an effect of reducing moisture taken into the oxide semiconductor film during the deposition by sputtering. Further, the heat treatment after deposition enables hydrogen, a hydroxyl group, or moisture to be released and removed from the oxide semiconductor film. In this manner, the field-effect mobility can be improved. Such an improvement in field-effect mobility is presumed to be achieved not only by removal of impurities by dehydration or dehydrogenation but also by a reduction in interatomic distance due to an increase in density. The oxide semiconductor can be crystallized by being highly purified by removal of impurities from the oxide semiconductor. In the case of using such a purified non-single-crystal oxide semiconductor, ideally, a field-effect mobility exceeding 100 $cm^2/Vs$ is expected to be achieved.

The oxide semiconductor containing In, Sn, and Zn as main components may be crystallized in the following manner: oxygen ions are implanted into the oxide semiconductor, hydrogen, a hydroxyl group, or moisture contained in the oxide semiconductor is released by heat treatment, and the oxide semiconductor is crystallized through the heat treatment or by heat treatment performed later. By such crystallization treatment or recrystallization treatment, a non-single crystal oxide semiconductor having favorable crystallinity can be obtained.

The intentional heating of the substrate during deposition and/or the heat treatment after the deposition contributes not only to improving field-effect mobility but also to making the transistor normally off. In a transistor in which an oxide semiconductor film that contains In, Sn, and Zn as main components and is formed without heating a substrate intentionally is used as a channel formation region, the threshold voltage tends to be shifted negatively. However, when the oxide semiconductor film formed while heating the substrate intentionally is used, the problem of the negative shift of the threshold voltage can be solved. That is, the threshold voltage is shifted so that the transistor becomes normally off; this tendency can be confirmed by comparison between FIGS. 29A and 29B.

Note that the threshold voltage can also be controlled by changing the ratio of In, Sn, and Zn; when the composition ratio of In, Sn, and Zn is 2:1:3, a normally-off transistor is expected to be formed. In addition, an oxide semiconductor film having high crystallinity can be obtained by setting the composition ratio of a target as follows: In:Sn:Zn=2:1:3.

The temperature of the intentional heating of the substrate or the temperature of the heat treatment is 150° C. or higher, preferably 200° C. or higher, further preferably 400° C. or higher. When deposition or heat treatment is performed at a high temperature, the transistor can be normally off.

By intentionally heating the substrate during deposition and/or by performing heat treatment after the deposition, the stability against a gate-bias stress can be increased. For example, when a gate bias is applied with an intensity of 2 MV/cm at 150° C. for one hour, drift of the threshold voltage can be less than ±1.5 V, preferably less than ±1.0 V.

A BT test was performed on the following two transistors: Sample 1 on which heat treatment was not performed after formation of an oxide semiconductor film, and Sample 2 on which heat treatment at 650° C. was performed after formation of an oxide semiconductor film.

First, $V_g$-$I_d$ characteristics of the transistors were measured at a substrate temperature of 25° C. and $V_d$ of 10 V. Then, the substrate temperature was set to 150° C. and $V_d$ was set to 0.1 V. After that, 20 V of $V_g$ was applied so that the intensity of an electric field applied to gate insulating films was 2 MV/cm, and the condition was kept for one hour. Next, $V_g$ was set to 0 V. Then, $V_g$-$I_d$ characteristics of the transistors were measured at a substrate temperature of 25° C. and $V_d$ of 10 V. This process is called a positive BT test.

In a similar manner, first, $V_g$-$I_d$ characteristics of the transistors were measured at a substrate temperature of 25° C. and $V_d$ of 10 V. Then, the substrate temperature was set to 150° C. and $V_d$ was set to 0.1 V. After that, −20 V of $V_g$ was applied so that the intensity of an electric field applied to the gate insulating films was −2 MV/cm, and the condition was kept for one hour. Next, $V_g$ was set to 0 V. Then, $V_g$-$I_d$ characteristics of the transistors were measured at a substrate temperature of 25° C. and $V_d$ of 10 V. This process is called a negative BT test.

Figure 30A:
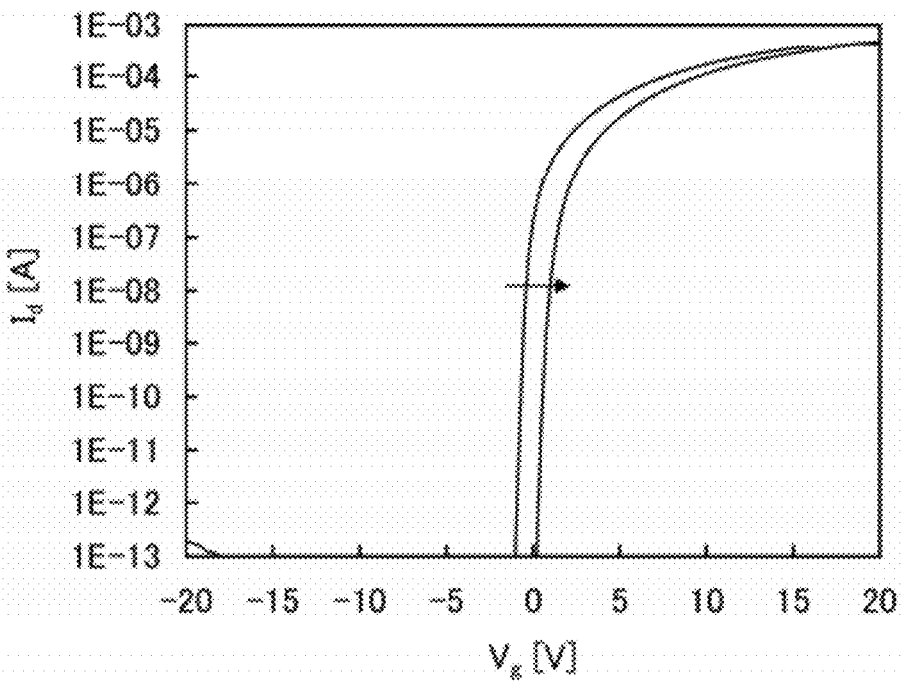
FIGS. 30A and 30B are graphs each showing $V_g$–$I_d$ characteristics of a transistor which is Sample 1 after a BT test.
Figure 30B:
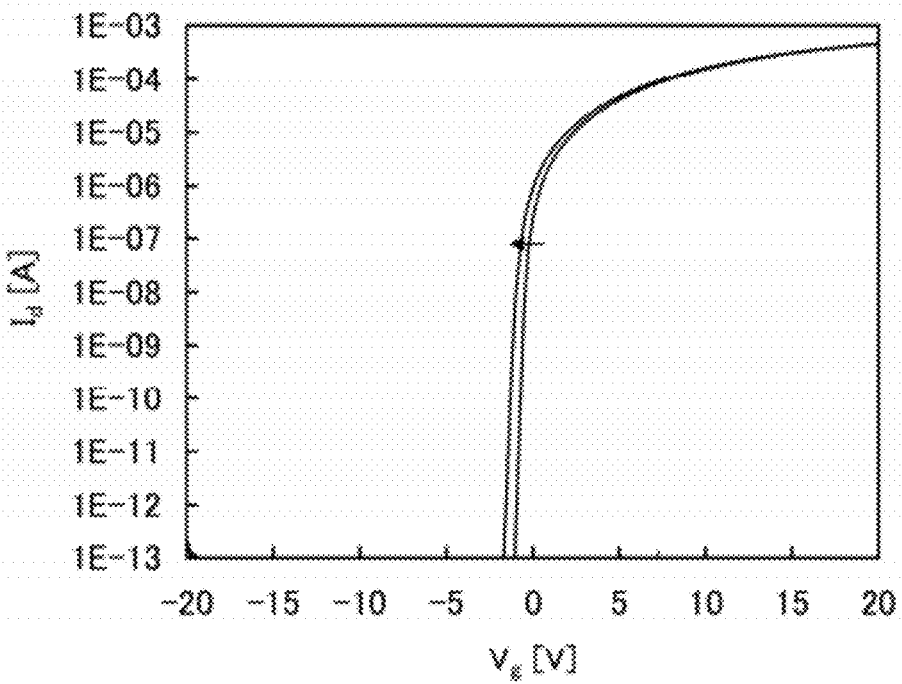
Figure 31A:
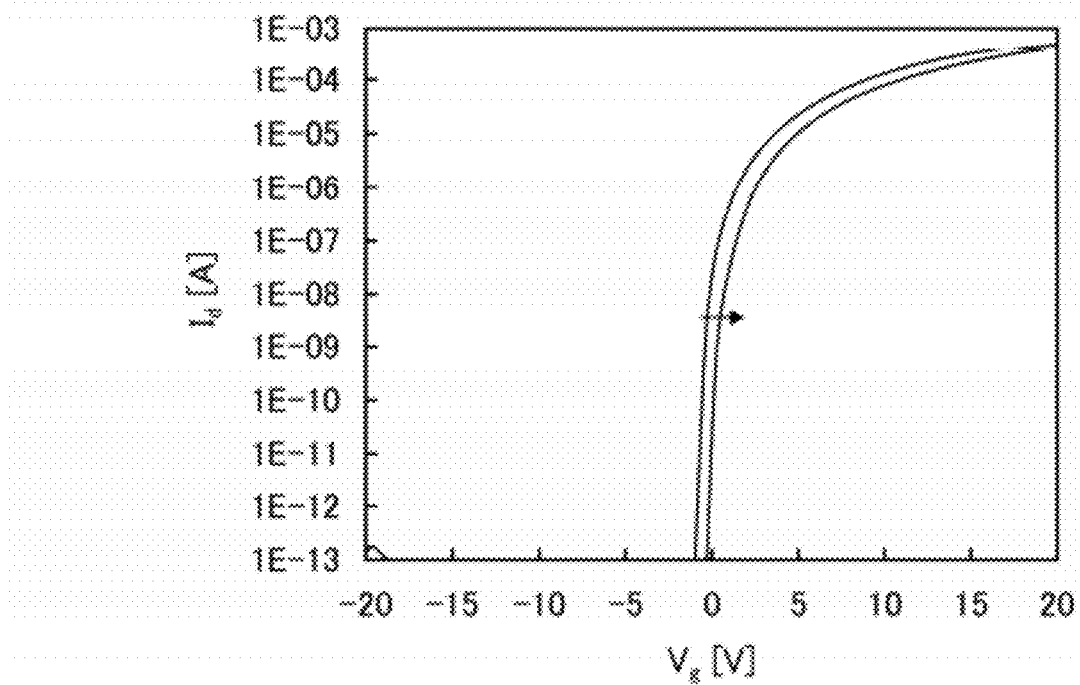
FIGS. 31A and 31B are graphs each showing Vg–Id characteristics of a transistor which is Sample 2 after a BT test.
Figure 31B:
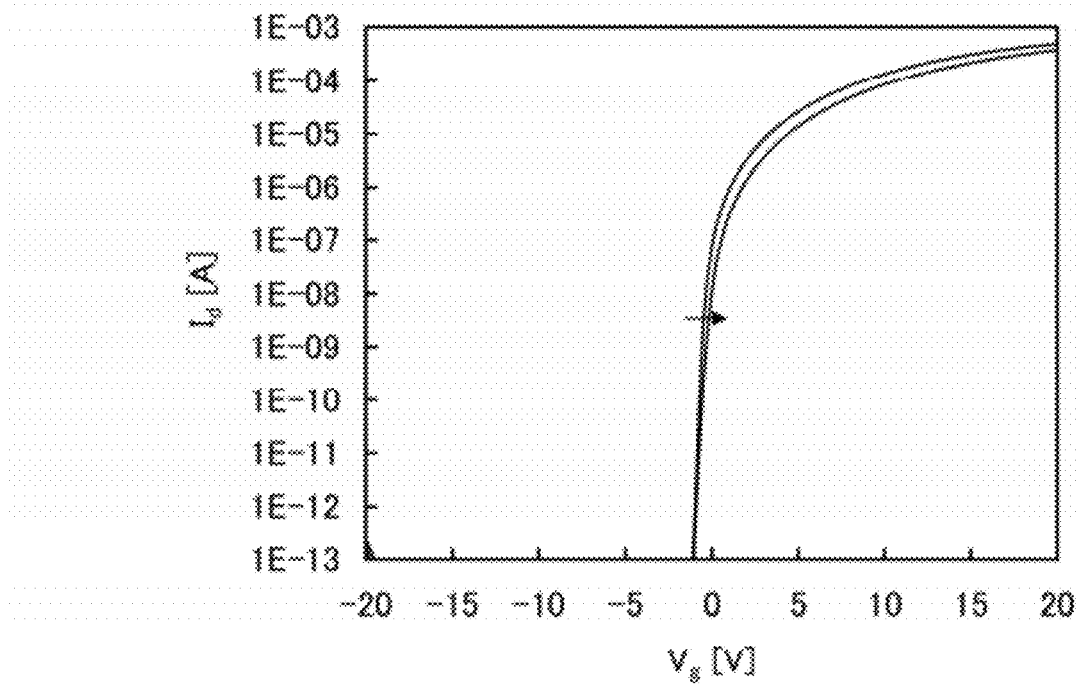

FIGS. 30A and 30B show results of the positive BT test and the negative BT test, respectively, of Sample 1. FIGS. 31A and 31B show results of the positive BT test and the negative BT test, respectively, of Sample 2.

The amount of shift in the threshold voltage of Sample 1 due to the positive BT test and that due to the negative BT test were 1.80 V and −0.42 V, respectively. The amount of shift in the threshold voltage of Sample 2 due to the positive BT test and that due to the negative BT test were 0.79 V and 0.76 V, respectively. It is found that, in each of Sample 1 and Sample 2, the amount of shift in the threshold voltage between before and after the BT tests is small and the reliability thereof is high.

The heat treatment can be performed in an oxygen atmosphere; alternatively, the heat treatment may be performed first in an atmosphere of nitrogen or an inert gas or under reduced pressure, and then in an atmosphere containing oxygen. Oxygen is supplied to the oxide semiconductor after dehydration or dehydrogenation, whereby an effect of the heat treatment can be further increased. As a method for supplying oxygen after dehydration or dehydrogenation, a method in which oxygen ions are accelerated by an electric field and implanted into the oxide semiconductor film may be employed.

A defect due to oxygen deficiency is easily caused in the oxide semiconductor or at an interface between the oxide semiconductor and a stacked film; however, when excess oxygen is contained in the oxide semiconductor by the heat treatment, oxygen deficiency caused constantly can be compensated for with excess oxygen. The excess oxygen is mainly oxygen existing between lattices. When the concentration of oxygen is set to higher than or equal to $1 \times 10^{16}/cm^3$ and lower than or equal to $2 \times 10^{20}/cm^3$, excess oxygen can be contained in the oxide semiconductor without causing crystal distortion or the like.

When heat treatment is performed so that at least part of the oxide semiconductor includes crystal, a more stable oxide semiconductor film can be obtained. For example, when an oxide semiconductor film which is formed by sputtering using a target having a composition ratio of In:Sn:Zn=1:1:1 without heating a substrate intentionally is analyzed by X-ray diffraction (XRD), a halo pattern is observed. The formed oxide semiconductor film can be crystallized by being subjected to heat treatment. The temperature of the heat treatment can be set as appropriate; when the heat treatment is performed at 650° C., for example, a clear diffraction peak can be observed in an X-ray diffraction analysis.

An XRD analysis of an In—Sn—Zn-based oxide semiconductor film was conducted. The XRD analysis was conducted using an X-ray diffractometer D8 ADVANCE manufactured by Bruker AXS, and measurement was performed by an out-of-plane method.

Sample A and Sample B were prepared and the XRD analysis was performed thereon. A method for manufacturing Sample A and Sample B will be described below.

An In—Sn—Zn-based oxide semiconductor film with a thickness of 100 nm was formed over a quartz substrate that had been subjected to dehydrogenation treatment.

The In—Sn—Zn-based oxide semiconductor film was formed with a sputtering apparatus with a power of 100 W (DC) in an oxygen atmosphere. An In—Sn—Zn—O target having an atomic ratio of In:Sn:Zn=1:1:1 was used as a target. Note that the substrate heating temperature in film formation was set at 200° C. A sample manufactured in this manner was used as Sample A.

Next, a sample manufactured by a method similar to that of Sample A was subjected to heat treatment at 650° C. As the heat treatment, heat treatment in a nitrogen atmosphere was first performed for one hour and heat treatment in an oxygen atmosphere was further performed for one hour without lowering the temperature. A sample manufactured in this manner was used as Sample B.

Figure 32:
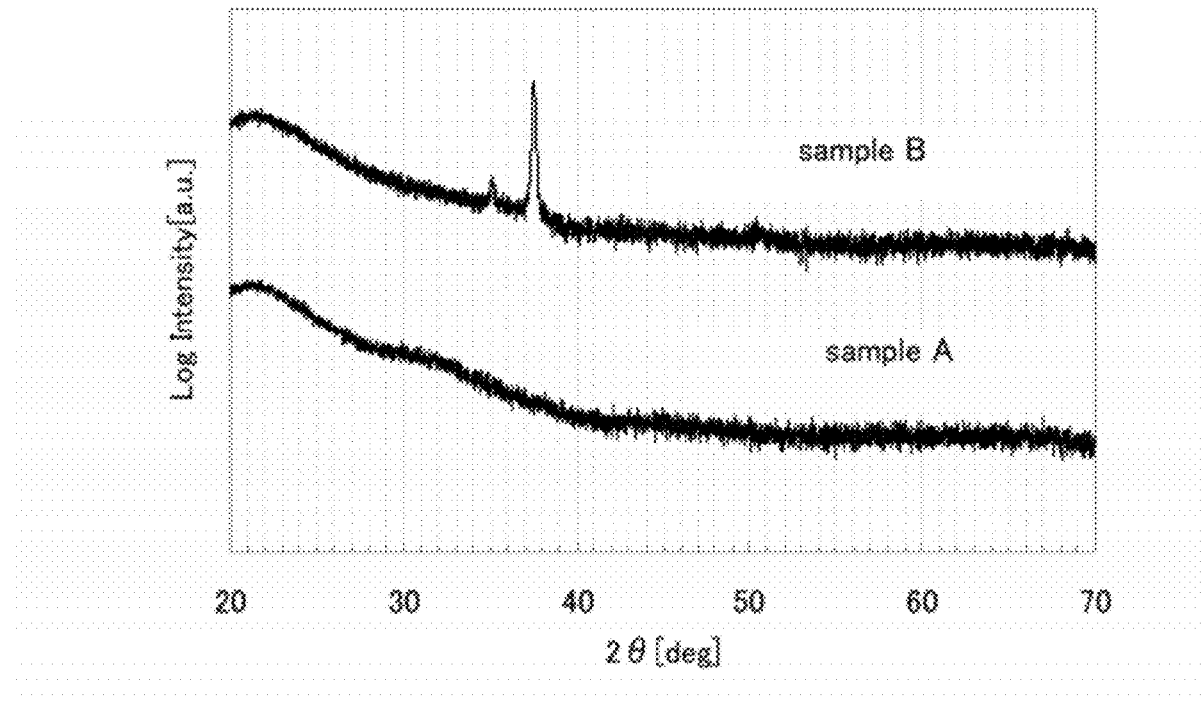
FIG. 32 is a graphs showing XRD spectra of Sample A and Sample B.

FIG. 32 shows XRD spectra of Sample A and Sample B. No peak derived from crystal was observed in Sample A, whereas peaks derived from crystal were observed when 2θ was around 35 deg. and at 37 deg. to 38 deg. in Sample B.

As described above, by intentionally heating a substrate during deposition of an oxide semiconductor containing In, Sn, and Zn as main components and/or by performing heat treatment after the deposition, characteristics of a transistor can be improved.

These substrate heating and heat treatment have an effect of preventing hydrogen and a hydroxyl group, which are unfavorable impurities for an oxide semiconductor, from being contained in the film or an effect of removing hydrogen and a hydroxyl group from the film. That is, an oxide semiconductor can be highly purified by removing hydrogen serving as a donor impurity from the oxide semiconductor, whereby a normally-off transistor can be obtained. The high purification of an oxide semiconductor enables the off-state current density of the transistor to be 1 aA/µm or lower. Here, the unit of the off-state current density represents current per micrometer of a channel width.

Figure 33:
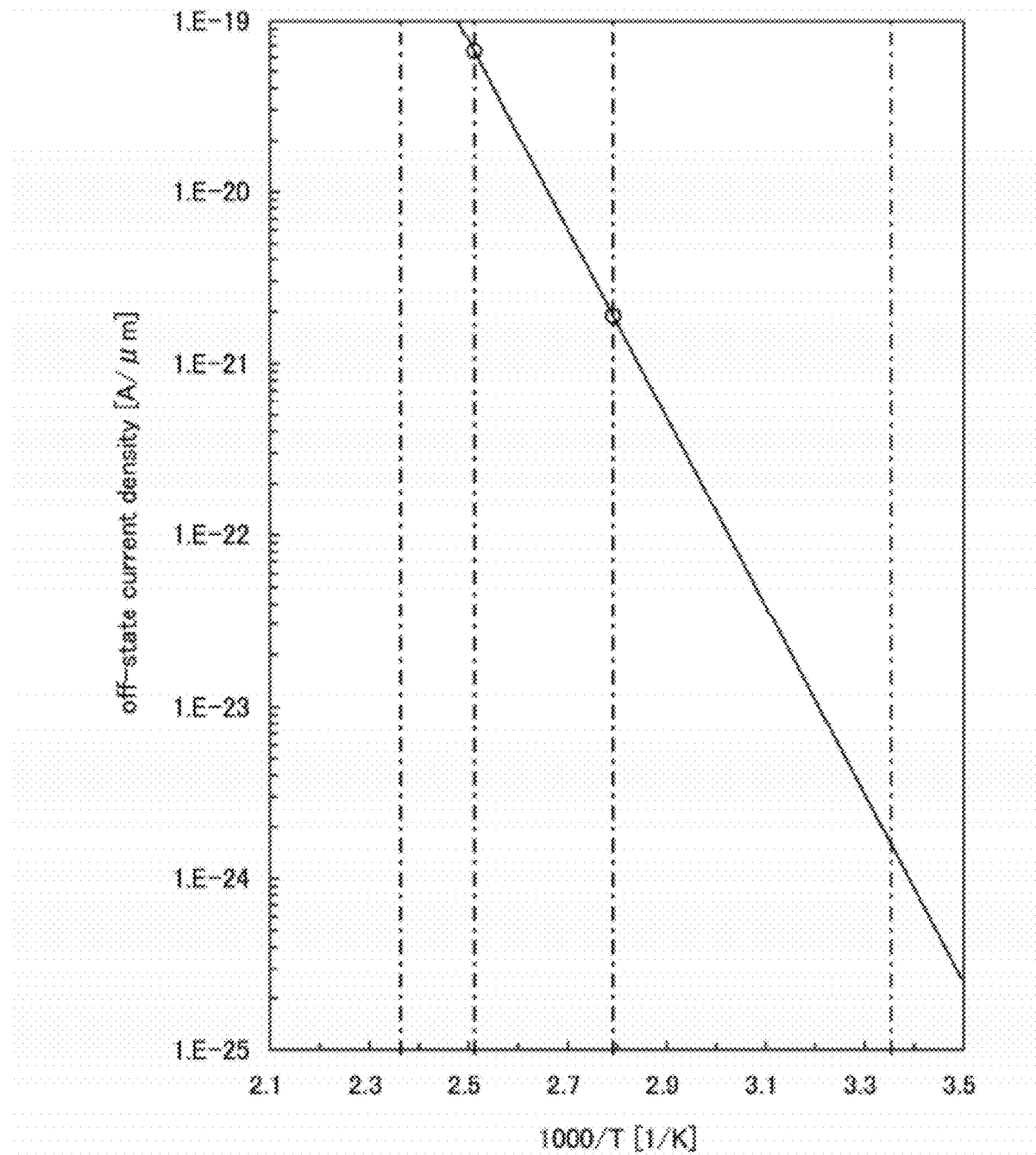
FIG. 33 is a graph showing a relation between the off-state current of a transistor and a substrate temperature in measurement.

FIG. 33 shows a relation between the off-state current density of a transistor and the inverse of substrate temperature (absolute temperature) at measurement. Here, for simplicity, the horizontal axis represents a value (1000/T) obtained by multiplying an inverse of substrate temperature at measurement by 1000.

Specifically, as shown in FIG. 33, the off-state current density can be 1 aA/µm ($1\times10^{-18}$ A/µm) or lower, 100 zA/µm ($1\times10^{-19}$ A/µm) or lower, and 1 zA/µm ($1\times10^{-21}$ A/µm) or lower when the substrate temperature is 125° C., 85° C., and room temperature (27° C.), respectively. Preferably, the off-state current density can be 0.1 aA/µm ($1\times10^{-19}$ A/µm) or lower, 10 zA/µm ($1\times10^{-20}$ A/µm) or lower, and 0.1 zA/µm ($1\times10^{-22}$ A/µm) or lower at 125° C., 85° C., and room temperature, respectively. The above values of off-state current densities are clearly much lower than that of the transistor using Si as a semiconductor film.

Note that in order to prevent hydrogen and moisture from being contained in the oxide semiconductor film during formation thereof, it is preferable to increase the purity of a sputtering gas by sufficiently suppressing leakage from the outside of a deposition chamber and degasification through an inner wall of the deposition chamber. For example, a gas with a dew point of –70° C. or lower is preferably used as the sputtering gas in order to prevent moisture from being contained in the film. In addition, it is preferable to use a target which is highly purified so as not to contain impurities such as hydrogen and moisture. Although it is possible to remove moisture from a film of an oxide semiconductor including In, Sn, and Zn as main components by heat treatment, a film which does not contain moisture originally is preferably formed because moisture is released from the oxide semiconductor containing In, Sn, and Zn as main components at a higher temperature than from an oxide semiconductor containing In, Ga, and Zn as main components.

The relation between the substrate temperature and electric characteristics of a transistor of Sample B, on which heat treatment at 650° C. was performed after formation of the oxide semiconductor film, was evaluated.

The transistor used for the measurement has a channel length L of 3 µm, a channel width W of 10 µm, Lov of 0 µm, and dW of 0 µm. Note that $V_d$ was set to 10 V. Note that the substrate temperature was –40° C., –25° C., 25° C., 75° C., 125° C., and 150° C. Here, in a transistor, the width of a portion where a gate electrode overlaps with one of a pair of electrodes is referred to as Lov, and the width of a portion of the pair of electrodes, which does not overlap with an oxide semiconductor film, is referred to as dW.

Figure 34:
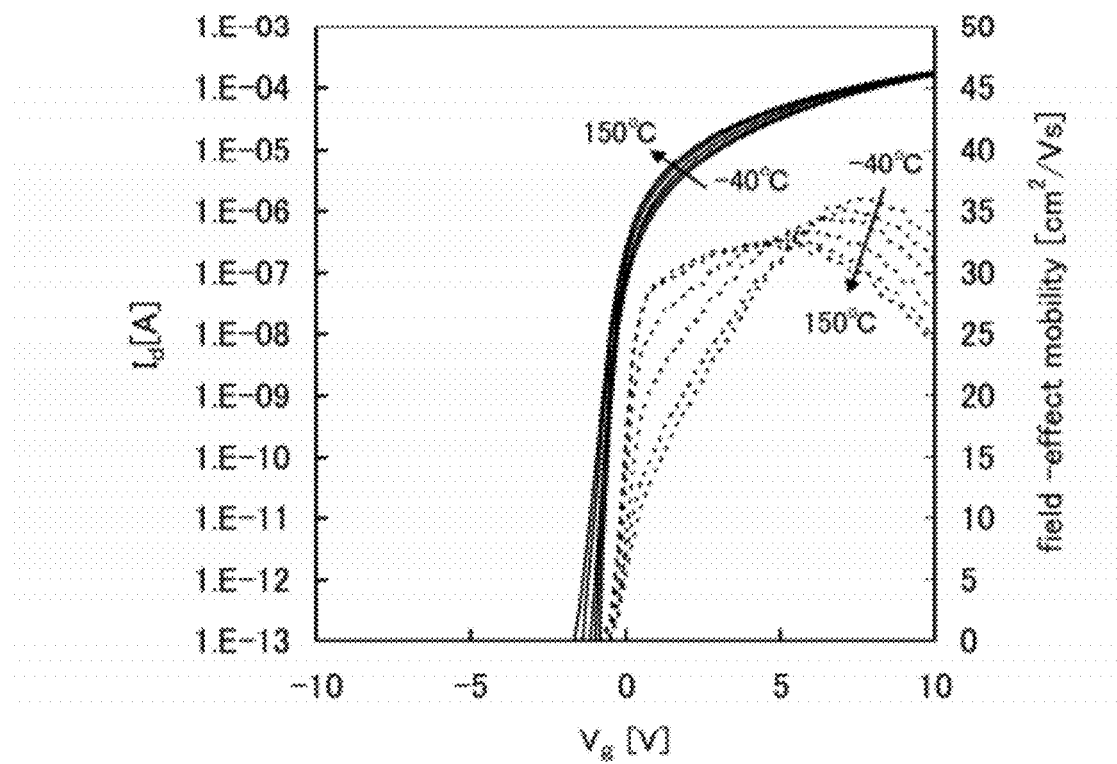
FIG. 34 is a graph showing the gate voltage dependence of drain current and a field-effect mobility.
Figure 35A:
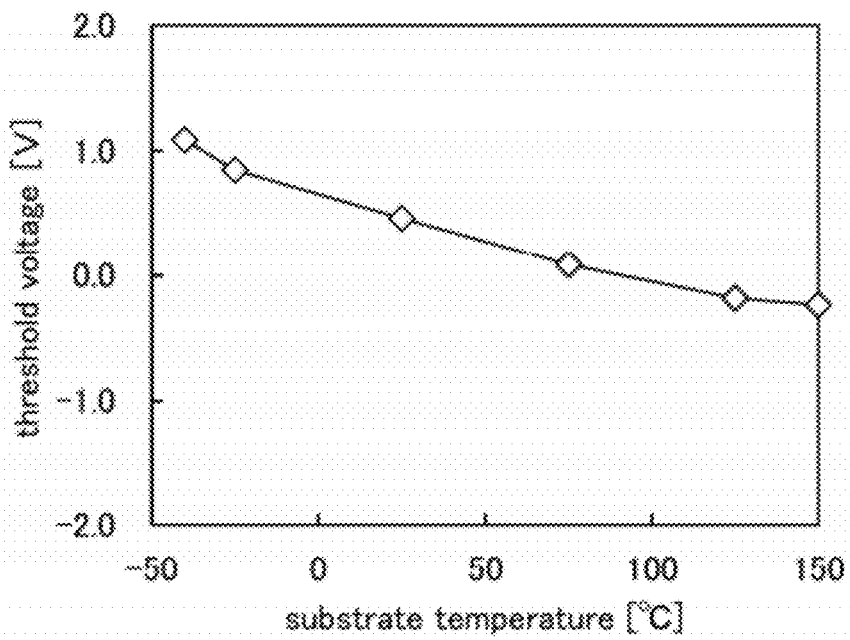
FIGS. 35A and 35B are graphs showing a relation between the substrate temperature and a threshold voltage and a relation between a substrate temperature and a field-effect mobility.

FIG. 34 shows the $V_g$ dependence of $I_d$ (a solid line) and field-effect mobility (a dotted line). FIG. 35A shows a relation between the substrate temperature and the threshold voltage, and FIG. 35B shows a relation between the substrate temperature and the field-effect mobility.

From FIG. 35A, it is found that the threshold voltage gets lower as the substrate temperature increases. Note that the threshold voltage is decreased from 1.09 V to –0.23 V in the range from –40° C. to 150° C.

Figure 35B:
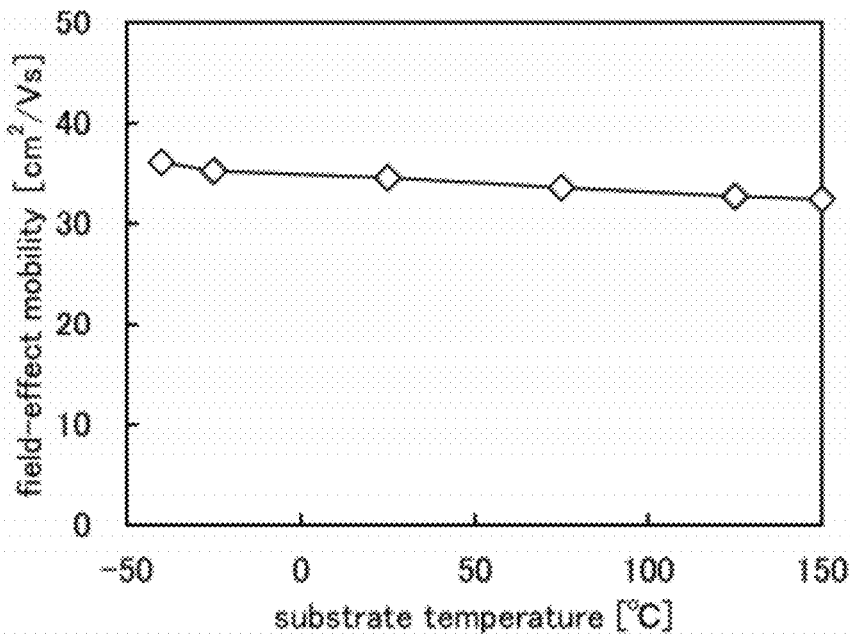

From FIG. 35B, it is found that the field-effect mobility gets lower as the substrate temperature increases. Note that the field-effect mobility is decreased from 36 $cm^2$/Vs to 32 $cm^2$/Vs in the range from –40° C. to 150° C. Thus, it is found that variation in electric characteristics is small in the above temperature range.

In a transistor in which such an oxide semiconductor containing In, Sn, and Zn as main components is used as a channel formation region, a field-effect mobility of 30 $cm^2$/Vsec or higher, preferably 40 $cm^2$/Vsec or higher, further preferably 60 $cm^2$/Vsec or higher can be obtained with the off-state current density maintained at 1 aA/mm or lower, which can achieve on-state current needed for an LSI. For example, in an FET where L/W is 33 nm/40 nm, an on-state current of 12 mA or higher can flow when the gate voltage is 2.7 V and the drain voltage is 1.0 V. In addition, sufficient electric characteristics can be ensured in a temperature range needed for operation of a transistor. With such characteristics, an integrated circuit having a novel function can be realized without decreasing the operation speed even when a transistor including an oxide semiconductor is also provided in an integrated circuit formed using a Si semiconductor.

This embodiment can be implemented in appropriate combination with any of the above embodiments.

Example 1

In this example, an example of a transistor in which an In—Sn—Zn-based oxide semiconductor film is used as an oxide semiconductor film will be described with reference to FIGS. 36A and 36B and the like.

Figure 36A:
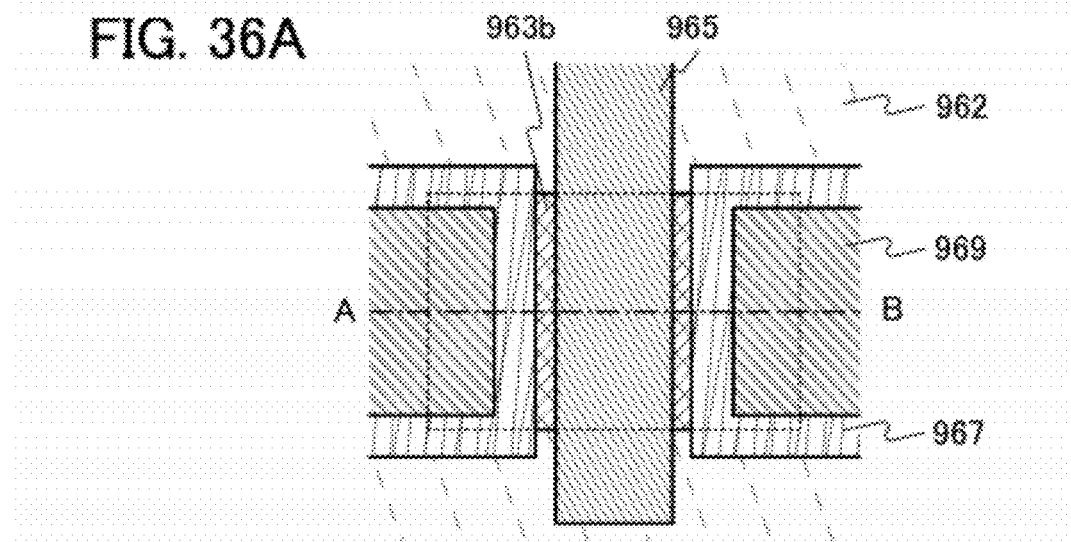
FIGS. 36A and 36B are a top view and a cross-sectional view of a semiconductor device.
Figure 36B:
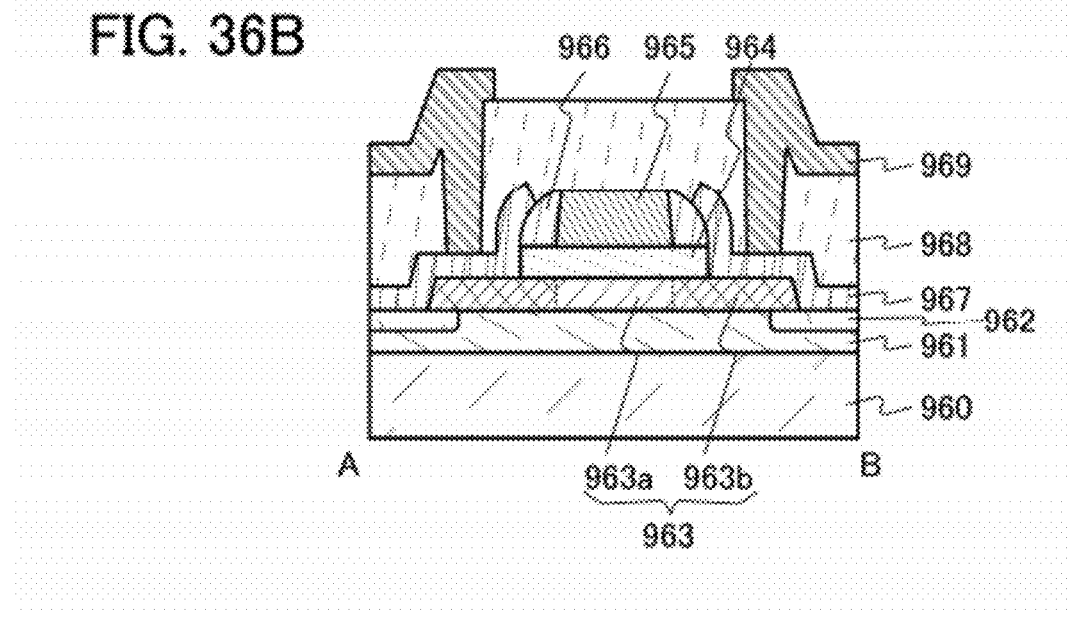

FIGS. 36A and 36B are a top view and a cross-sectional view of a coplanar transistor having a top-gate top-contact structure. FIG. 36A is the top view of the transistor. FIG. 36B shows cross section along dashed-dotted line A-B in FIG. 36A.

The transistor illustrated in FIG. 36B includes a substrate 960; a base insulating film 961 provided over the substrate 960; a protective insulating film 962 provided in the periphery of the base insulating film 961; an oxide semiconductor film 963 provided over the base insulating film 961 and the protective insulating film 962 and including a high-resistance region 963a and low-resistance regions 963b; a gate insulating film 964 provided over the oxide semiconductor film 963; a gate electrode 965 provided to overlap with the oxide semiconductor film 963 with the gate insulating film 964 provided therebetween; a sidewall insulating film 966 provided in contact with a side surface of the gate electrode 965; a pair of electrodes 967 provided in contact with at least the low-resistance regions 963b; an interlayer insulating film 968 provided to cover at least the oxide semiconductor film 963, the gate electrode 965, and the pair of electrodes 967; and a wiring 969 provided to connect to at least one of the pair of electrodes 967 through an opening formed in the interlayer insulating film 968.

Although not illustrated, a protective film may be provided to cover the interlayer insulating film 968 and the wiring 969. With the protective film, a minute amount of leakage current generated due to surface conduction of the interlayer insulating film 968 can be reduced and thus the off-state current of the transistor can be reduced.

Example 2

In this example, another example of a transistor in which an In—Sn—Zn-based oxide semiconductor film is used as an oxide semiconductor film will be described.

Figure 37A:
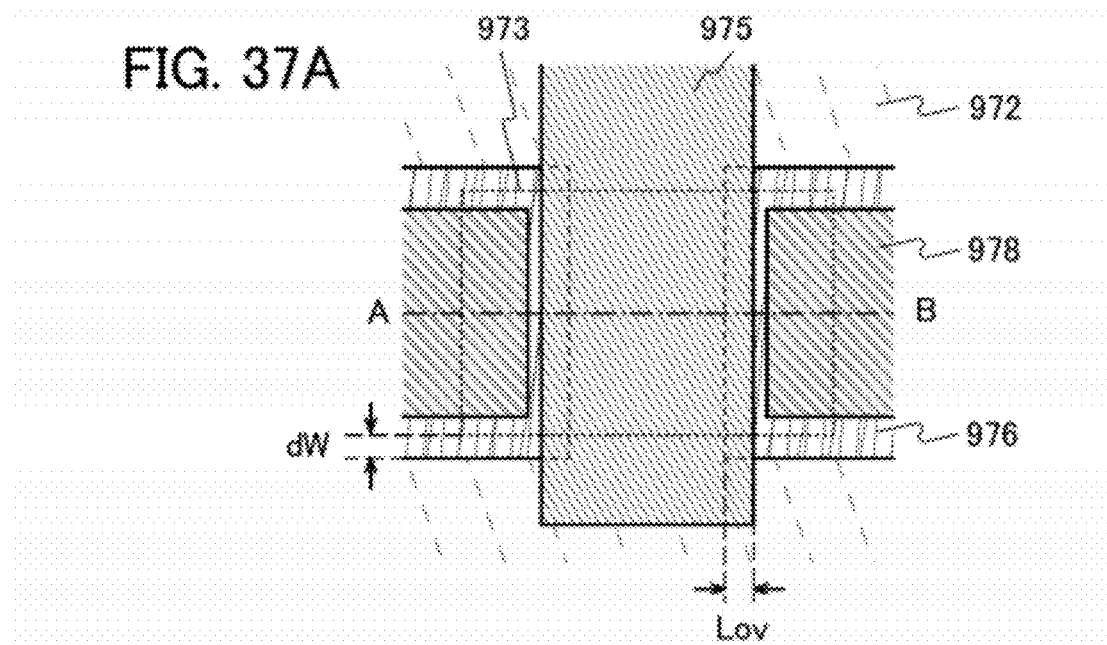
FIGS. 37A and 37B are a top view and a cross-sectional view of a semiconductor device.
Figure 37B:
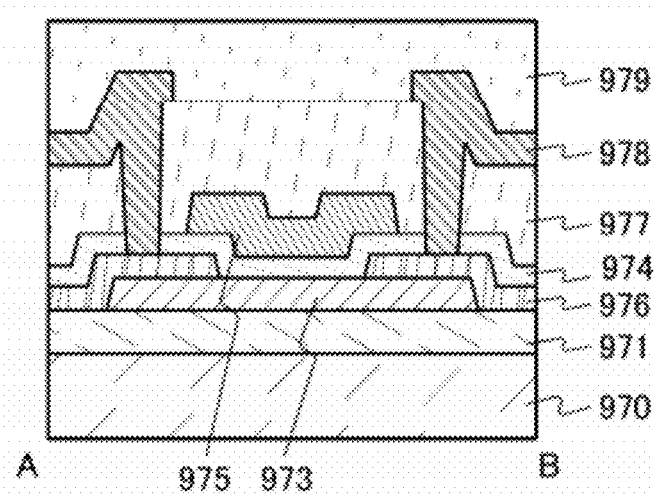

FIGS. 37A and 37B are a top view and a cross-sectional view illustrating the structure of a transistor manufactured in this example. FIG. 37A is the top view of the transistor. FIG. 37B is a cross-sectional view along dashed-dotted line A-B in FIG. 37A.

The transistor illustrated in FIG. 37B includes a substrate 970; a base insulating film 971 provided over the substrate 970; an oxide semiconductor film 973 provided over the base insulating film 971; a pair of electrodes 976 provided in contact with the oxide semiconductor film 973; a gate insulating film 974 provided over the oxide semiconductor film 973 and the pair of electrodes 976; a gate electrode 975 provided to overlap with the oxide semiconductor film 973 with the gate insulating film 974 provided therebetween; an interlayer insulating film 977 provided to cover the gate insulating film 974 and the gate electrode 975; wirings 978 connected to the pair of electrodes 976 through openings formed in the interlayer insulating film 977; and a protective film 979 provided to cover the interlayer insulating film 977 and the wirings 978.

As the substrate 970, a glass substrate was used. As the base insulating film 971, a silicon oxide film was used. As the oxide semiconductor film 973, an In—Sn—Zn-based oxide semiconductor film was used. As the pair of electrodes 976, a tungsten film was used. As the gate insulating film 974, a silicon oxide film was used. The gate electrode 975 had a stacked-layer structure of a tantalum nitride film and a tungsten film. The interlayer insulating film 977 had a stacked-layer structure of a silicon oxynitride film and a polyimide film. The wirings 978 each had a stacked-layer structure in which a titanium film, an aluminum film, and a titanium film were formed in this order. As the protective film 979, a polyimide film was used.

Note that in the transistor having the structure illustrated in FIG. 37A, the width of a portion where the gate electrode 975 overlaps with one of the pair of electrodes 976 is referred to as Lov. Similarly, the width of a portion where the pair of electrodes 976, which does not overlap with the oxide semiconductor film 973, is referred to as dW.

Example 3

The use of a semiconductor device according to one embodiment of the present invention makes it possible to provide a highly reliable electronic device. In addition, the use of a semiconductor device according to one embodiment of the present invention makes it possible to provide an electronic device with low power consumption. In particular, in the case where a portable electronic device which has difficulty in continuously receiving power, an advantage of an increase in continuous operating time can be obtained when a semiconductor device with low power consumption according to one embodiment of the present invention is added as a component of the device.

In portable electronic devices such as a mobile phone, a smartphone, and an e-book reader, an SRAM or a DRAM is used to store image data temporarily. An SRAM or a DRAM is used in a portable electronic device because it can perform an operation such as writing or reading of data faster than a flash memory or the like and thus is suitable to be used in processing of image data. However, although an SRAM has an advantage of operating at high speed, one memory cell in an SRAM includes six transistors, resulting in a disadvantage of a large area of the memory cell. Provided that the minimum feature size of a design rule is F, the area of a memory cell in an SRAM is generally $100F^2$ to $150F^2$. Therefore, a price per bit of an SRAM is the most expensive among semiconductor memory devices. On the other hand, in a DRAM, one memory cell includes one transistor and one capacitor. Thus, the area of a memory cell in a DRAM is small, e.g., less than or equal to $10F^2$. However, in the case of a DRAM, refresh is necessary and power is consumed even when rewriting is not performed. In the semiconductor device according to one embodiment of the present invention, the area of a memory cell is around $10F^2$ and frequent refresh is not necessary. Therefore, the semiconductor device is different from a general SRAM or DRAM because it has two advantages: a smaller area of a memory cell and lower power consumption which are important for portable electronic devices.

The semiconductor device according to one embodiment of the present invention can be used for display devices, personal computers, or image reproducing devices provided with recording media (typically, devices which reproduce the content of recording media such as digital versatile discs (DVDs) and have displays for displaying the reproduced images). Besides the above, as electronic devices which can employ the semiconductor device according to one embodiment of the present invention, mobile phones, portable game machines, portable information terminals, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), vending machines, and the like can be given. Specific examples of these electronic devices are illustrated in FIGS. 20A to 20F.

Figure 20A:
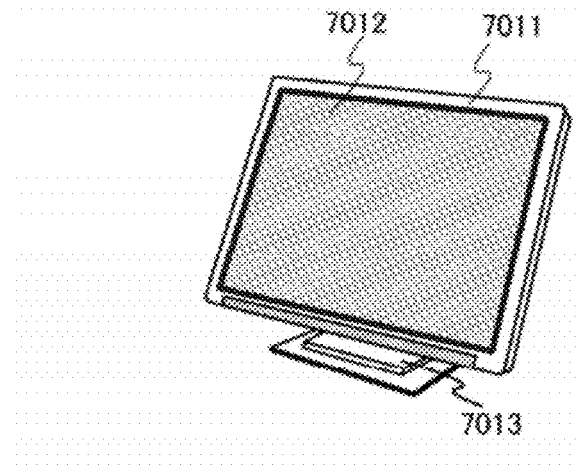
FIGS. 20A to 20D each illustrate an electronic device.

FIG. 20A illustrates a display device including a housing 7011, a display portion 7012, a supporting base 7013, and the like. The semiconductor device according to one embodiment of the present invention can be used for an integrated circuit used for controlling driving of the display device. With the use of the semiconductor device according to one embodiment of the present invention for the integrated circuit for controlling the driving of the display device, the display device with high reliability and/or low power consumption can be provided. Note that the display device includes all display devices for displaying information, such as display devices for personal computers, for receiving TV broadcast, and for displaying advertisements, in its category.

Figure 20B:
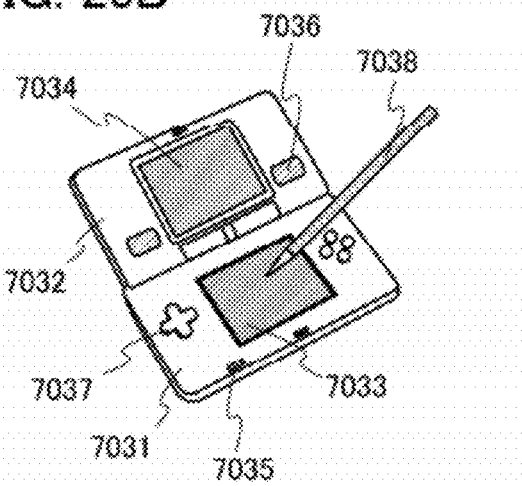

FIG. 20B illustrates a portable game machine including a housing 7031, a housing 7032, a display portion 7033, a display portion 7034, a microphone 7035, speakers 7036, an operation key 7037, a stylus 7038, and the like. The semiconductor device according to one embodiment of the present invention can be used for an integrated circuit used for controlling driving of the portable game machine. With use of the semiconductor device according to one embodiment of the present invention for the integrated circuit for controlling the driving of the portable game machine, the portable game machine with high reliability and/or low power consumption can be provided. Note that although the portable game machine illustrated in FIG. 20B includes two display portions 7033 and 7034, the number of display portions included in the portable game machine is not limited thereto.

Figure 20C:
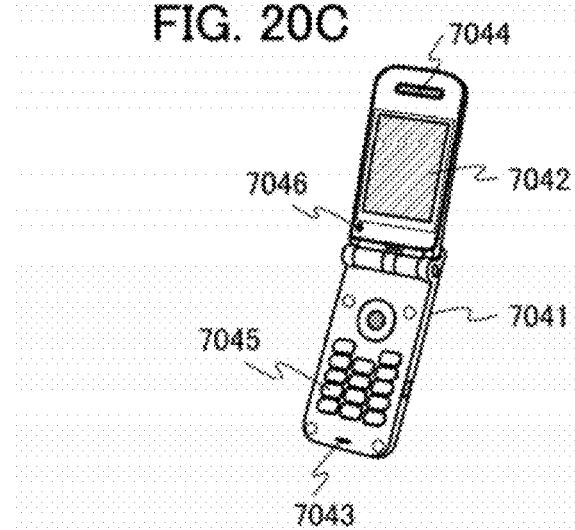

FIG. 20C illustrates a mobile phone including a housing 7041, a display portion 7042, an audio-input portion 7043, an audio-output portion 7044, operation keys 7045, a light-receiving portion 7046, and the like. Light received in the light-receiving portion 7046 is converted into electrical signals, whereby external images can be loaded. The semiconductor device according to one embodiment of the present invention can be used for an integrated circuit used for controlling driving of the mobile phone. With use of the semiconductor device according to one embodiment of the present invention for the integrated circuit for controlling the driving of the mobile phone, the mobile phone with high reliability and/or low power consumption can be provided.

Figure 20D:
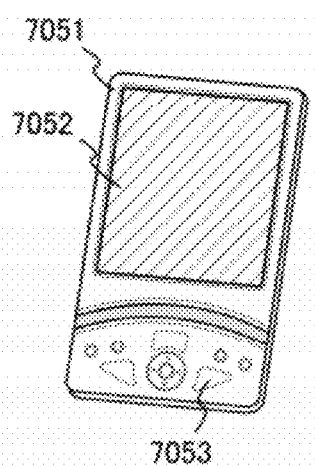

FIG. 20D illustrates a portable information terminal including a housing 7051, a display portion 7052, operation keys 7053, and the like. A modem may be incorporated in the housing 7051 of the portable information terminal illustrated in FIG. 20D. The semiconductor device according to one embodiment of the present invention can be used for an integrated circuit used for controlling driving of the portable information terminal. With use of the semiconductor device according to one embodiment of the present invention for the integrated circuit for controlling the driving of the portable information terminal, a portable information terminal with high reliability and/or low power consumption can be provided.

This embodiment can be implemented by being combined as appropriate with any of the above embodiments.

This application is based on Japanese Patent Application serial No. 2011-085965 filed with Japan Patent Office on Apr. 8, 2011 and Japanese Patent Application serial No. 2011-108884 filed with Japan Patent Office on May 14, 2011, the entire contents of which are hereby incorporated by reference.

What is claimed is:

1. A memory device comprising:
a first memory cell and a second memory cell each comprising:
 a first transistor; and
 a memory element to which charge with an amount in accordance with data is supplied through the first transistor,
wherein the first memory cell corresponds to a valid bit,
wherein the second memory cell corresponds to a data field, and
wherein a retention time of the first memory cell is shorter than a retention time of the second memory cell.

2. A memory device according to claim 1,
wherein the first transistor comprises an oxide semiconductor.

3. A memory device according to claim 1,
wherein a capacitance value of the first memory cell is smaller than a capacitance value of the second memory cell.

4. A memory device according to claim 1, further comprising:
a first logic circuit and a second logic circuit connected to the first memory cell and the second memory cell through respective data lines, the first logic circuit and the second logic circuit each including a logic element,
wherein the charge with the amount in accordance with the data is supplied from the data line through the first transistor to the memory element, and
wherein a threshold potential of the first logic circuit is higher than a threshold potential of the second logic circuit.

5. A memory device according to claim 1,
a first logic circuit and a second logic circuit connected to the first memory cell and the second memory cell through respective data lines, the first logic circuit and the second logic circuit each including a logic element; and
a first capacitor and a second capacitor connected to the first memory cell and the second memory cell through the respective data lines,
wherein a capacitance value of the first capacitor is smaller than a capacitance value of the second capacitor.

6. A memory device according to claim 1, further comprising:
a first logic circuit and a second logic circuit connected to the first memory cell and the second memory cell through respective data lines, the first logic circuit and the second logic circuit each including a logic element,
wherein the first memory cell and the second memory cell each comprises a capacitor to which the charge with the amount in accordance with the data supplied from the data line through the first transistor, and
wherein a channel width of the first transistor of the first memory cell is larger than a channel width of the first transistor of the second memory cell.

7. A memory device according to claim 1, further comprising:
a first logic circuit and a second logic circuit connected to the first memory cell and the second memory cell through respective data lines, the first logic circuit and the second logic circuit each including a logic element,
wherein the memory element comprises:
 a capacitor to which the charge with the amount in accordance with the data is supplied from the data line through the first transistor; and
 a second transistor whose drain current is determined in accordance with the amount of the charge, and
wherein a channel width of the second transistor of the first memory cell is larger than a channel width of the second transistor of the second memory cell.

8. A semiconductor device comprising the memory device according to claim 1, further comprising:
a control unit;
an arithmetic unit; and
a buffer memory device comprising the first memory cell and the second memory cell,
wherein the buffer memory device is configured to store the data sent from at least one of a main memory device and the arithmetic unit, in accordance with an instruction from the control unit.

9. A semiconductor device comprising the memory device according to claim 1, further comprising:
a control unit;
an arithmetic unit; and
a buffer memory device comprising the first memory cell and the second memory cell,
wherein the buffer memory device is configured to store the data including an instruction sent from a main memory device, and
wherein the control unit is configured to read out the data from the buffer memory device and control operation of the arithmetic unit and operation of the buffer memory device in accordance with the instruction.

10. A memory device comprising:
a first memory cell and a second memory cell each comprising:
a transistor; and
a memory element to which charge with an amount in accordance with data is supplied from a data line through the transistor,
wherein the first memory cell corresponds to a valid bit,
wherein the second memory cell corresponds to a data field,
wherein the charge with the amount in accordance with the data is supplied from a data line through the first transistor to the memory element, and wherein, in a period in which the first transistors are off, a potential of the data line of the first memory cell is lower than a potential of the data line of the second memory cell.

11. A memory device according to claim 10, wherein the transistor comprises an oxide semiconductor.

12. A semiconductor device comprising the memory device according to claim 10, further comprising:
a control unit;
an arithmetic unit; and
a buffer memory device comprising the first memory cell and the second memory cell,
wherein the buffer memory device is configured to store the data sent from at least one of a main memory device and the arithmetic unit, in accordance with an instruction from the control unit.

13. A semiconductor device comprising the memory device according to claim 10, further comprising:
a control unit;
an arithmetic unit; and
a buffer memory device comprising the first memory cell and the second memory cell,
wherein the buffer memory device is configured to store the data including an instruction sent from a main memory device, and
wherein the control unit is configured to read out the data from the buffer memory device and control operation of the arithmetic unit and operation of the buffer memory device in accordance with the instruction.

14. A memory device comprising:
a first memory cell and a second memory cell each comprising:
a transistor; and
a memory element to which charge with an amount in accordance with data is supplied from a data line through the transistor,
wherein the first memory cell corresponds to a valid bit,
wherein the second memory cell corresponds to a data field,
wherein a precharge potential applied to the data line of the first memory cell before the data is read is higher than a precharge potential applied to the data line of the second memory cell before the data is read, and
wherein a digital value of the data is determined by comparing the precharge potential with a potential of the data line at the time of reading the data.

15. A memory device according to claim 14, wherein the transistor comprises an oxide semiconductor.

16. A semiconductor device comprising the memory device according to claim 14, further comprising:
a control unit;
an arithmetic unit; and
a buffer memory device comprising the first memory cell and the second memory cell,
wherein the buffer memory device is configured to store the data sent from at least one of a main memory device and the arithmetic unit, in accordance with an instruction from the control unit.

17. A semiconductor device comprising the memory device according to claim 14, further comprising:
a control unit;
an arithmetic unit; and
a buffer memory device comprising the first memory cell and the second memory cell,
wherein the buffer memory device is configured to store the data including an instruction sent from a main memory device, and
wherein the control unit is configured to read out the data from the buffer memory device and control operation of the arithmetic unit and operation of the buffer memory device in accordance with the instruction.

18. A memory device comprising:
a first memory cell and a second memory cell each comprising:
a transistor; and
a memory element to which charge with an amount in accordance with data is supplied from a data line through the transistor; and
a first logic circuit and a second logic circuit connected to the first memory cell and the second memory cell through the respective data lines, the first logic circuit and the second logic circuit each including a logic element,
wherein the first memory cell corresponds to a valid bit,
wherein the second memory cell corresponds to a data field, and
wherein a precharge potential applied to the data line of the first memory cell before the data is read is lower than a precharge potential applied to the data line of the second memory cell before the data is read.

19. A memory device according to claim 18, wherein the transistor comprises an oxide semiconductor.

20. A semiconductor device comprising the memory device according to claim 18, further comprising:
a control unit;
an arithmetic unit; and
a buffer memory device comprising the first memory cell and the second memory cell,
wherein the buffer memory device is configured to store the data sent from at least one of a main memory device and the arithmetic unit, in accordance with an instruction from the control unit.

21. A semiconductor device comprising the memory device according to claim 18, further comprising:
a control unit;
an arithmetic unit; and
a buffer memory device comprising the first memory cell and the second memory cell,
wherein the buffer memory device is configured to store the data including an instruction sent from a main memory device, and
wherein the control unit is configured to read out the data from the buffer memory device and control operation of the arithmetic unit and operation of the buffer memory device in accordance with the instruction.

22. The semiconductor device according to claim 4, wherein the logic element is configured to invert a polarity of an input potential and output an inverted potential.

23. The semiconductor device according to claim 5, wherein the logic element is configured to invert a polarity of an input potential and output an inverted potential.

24. The semiconductor device according to claim 6, wherein the logic element is configured to invert a polarity of an input potential and output an inverted potential.

25. The semiconductor device according to claim 7, wherein the logic element is configured to invert a polarity of an input potential and output an inverted potential.

26. The semiconductor device according to claim 18, wherein the logic element is configured to invert a polarity of an input potential and output an inverted potential.

* * * * *

UNITED STATES PATENT AND TRADEMARK OFFICE
CERTIFICATE OF CORRECTION

PATENT NO. : 8,743,590 B2  
APPLICATION NO. : 13/440093  
DATED : June 3, 2014  
INVENTOR(S) : Yoshiyuki Kurokawa Page 1 of 1

It is certified that error appears in the above-identified patent and that said Letters Patent is hereby corrected as shown below:

In the Specification

Column 19, line 39, replace "101y" with --101v--;

Column 19, line 63, replace "101y" with --101v--;

Column 23, line 57, replace "WLb 1" with --WLb1--;

Column 47, line 48, replace "$Ga_X Al_{2-X} O_{3+a}$ ($0 < X < 2, 0 < a < 1$)" with --$Ga_X Al_{2-X} O_{3+\alpha}$ ($0 < X < 2, 0 < \alpha < 1$)--;

Column 52, line 50, after "953c having" replace "n'-type" with --$n^+$-type--;

Column 53, line 13, after "5 nm" insert --.--; and

Column 53, line 17, after "mobility" replace "u" with --µ--.

Signed and Sealed this  
Twenty-seventh Day of January, 2015

Michelle K. Lee  
*Deputy Director of the United States Patent and Trademark Office*